US010670479B2

United States Patent
Reed et al.

(10) Patent No.: US 10,670,479 B2
(45) Date of Patent: Jun. 2, 2020

(54) TOWING SYSTEMS AND METHODS USING MAGNETIC FIELD SENSING

(71) Applicant: Methode Electronics Inc.

(72) Inventors: Chad Reed, Southfield, MI (US); Julius Beck, Haar (DE); Florian Burghardt, Haar (DE); Johannes Gießibl, Haar (DE)

(73) Assignee: Methode Electronics, Inc., Chicago, IL (US)

( * ) Notice: Subject to any disclaimer, the term of this patent is extended or adjusted under 35 U.S.C. 154(b) by 0 days.

(21) Appl. No.: 16/136,837

(22) Filed: Sep. 20, 2018

(65) Prior Publication Data

US 2019/0265112 A1 Aug. 29, 2019

Related U.S. Application Data

(60) Provisional application No. 62/635,848, filed on Feb. 27, 2018, provisional application No. 62/635,869, (Continued)

(51) Int. Cl.
*G01L 1/00* (2006.01)
*G01L 1/12* (2006.01)
(Continued)

(52) U.S. Cl.
CPC .............. *G01L 1/125* (2013.01); *G01L 3/102* (2013.01); *H01L 41/12* (2013.01)

(58) Field of Classification Search
CPC .......... G01L 1/125; G01L 3/102; H01L 41/12
(Continued)

(56) References Cited

U.S. PATENT DOCUMENTS 2,317,718 A 4/1943 Barnes et al.
3,514,997 A 6/1970 Gwathmey et al.
(Continued)

FOREIGN PATENT DOCUMENTS

DE 102014217801 A1 3/2016
EP 192871 B1 2/1990
(Continued)

OTHER PUBLICATIONS

Office Action, U.S. Appl. No. 15/815,640, dated Jul. 11, 2019, 14 pages.
(Continued)

*Primary Examiner* — Max H Noori
(74) *Attorney, Agent, or Firm* — Blank Rome LLP

(57) ABSTRACT

A magneto-elastically-based active force sensor, used with a tow coupling between a towed and a towing vehicle, which outputs a signal useful for determining forces acting on the coupling. The outputted force information may be provided by processor-enabled embedded software algorithms that take inputs from the force sensor and other sensors, may be used by one or more vehicle systems during operating of the vehicle, such as engine, braking, stability, safety, and informational systems. The force sensor includes directionally-sensitive magnetic field sensing elements inside the sensor, and shielding may be used around the sensors to reduce the influence of external magnetic fields on the sensing elements. The force sensor may be used with different tow coupling devices installed on different types of automobile cars and trucks.

23 Claims, 37 Drawing Sheets

Related U.S. Application Data filed on Feb. 27, 2018, provisional application No. 62/635,890, filed on Feb. 27, 2018, provisional application No. 62/677,378, filed on May 29, 2018.

(51) Int. Cl.
  *H01L 41/12* (2006.01)
  *G01L 3/10* (2006.01)
(58) Field of Classification Search
  USPC .................................................. 73/862.333
  See application file for complete search history.

(56) References Cited

U.S. PATENT DOCUMENTS

| | | |
|---|---|---|
| 3,520,184 A | 7/1970 | Tanner et al. |
| 3,593,263 A | 7/1971 | Olsen |
| 3,737,233 A | 6/1973 | Blau et al. |
| 3,972,231 A | 8/1976 | Richardson |
| 4,105,972 A | 8/1978 | Smith |
| 4,384,270 A | 5/1983 | Morita et al. |
| 4,814,743 A | 3/1989 | Hanaki |
| 4,836,019 A | 6/1989 | Hagen et al. |
| 5,052,232 A | 10/1991 | Garshelis |
| 5,205,169 A | 4/1993 | Hagen |
| 5,223,072 A * | 6/1993 | Brockman .......... B29C 53/8016 156/425 |
| 5,351,564 A | 10/1994 | Watson et al. |
| 5,616,861 A | 4/1997 | Hagen |
| 5,617,025 A | 4/1997 | Taylor et al. |
| 5,618,999 A | 4/1997 | Schweitzer et al. |
| 5,684,254 A | 11/1997 | Nakazaki et al. |
| 5,716,071 A | 2/1998 | Stanley et al. |
| 5,716,302 A | 2/1998 | Andersson |
| 5,727,637 A | 3/1998 | Kono et al. |
| 5,729,194 A | 3/1998 | Spears et al. |
| 5,731,525 A | 3/1998 | Boe |
| 5,738,176 A | 4/1998 | Gingerich |
| 5,739,442 A | 4/1998 | Schweitzer et al. |
| 5,741,048 A | 4/1998 | Eccleston |
| 5,741,981 A | 4/1998 | Ling et al. |
| 5,747,683 A | 5/1998 | Gerum et al. |
| 5,773,722 A | 6/1998 | Helderman |
| 5,777,240 A | 7/1998 | Lefebvre et al. |
| 5,780,782 A | 7/1998 | O'Dea |
| 5,780,783 A | 7/1998 | Heider et al. |
| 5,782,542 A | 7/1998 | McGrath et al. |
| 5,783,751 A | 7/1998 | Maw et al. |
| 5,785,393 A | 7/1998 | McGrath et al. |
| 5,791,676 A | 8/1998 | Jones |
| 5,800,025 A | 9/1998 | McGrath et al. |
| 5,806,937 A | 9/1998 | Brunson |
| 5,811,738 A | 9/1998 | Boyovich et al. |
| 5,821,852 A | 10/1998 | Fairchild |
| 5,822,876 A | 10/1998 | Haas et al. |
| 5,823,637 A | 10/1998 | Blue |
| 5,824,771 A | 10/1998 | Rivier |
| 5,831,173 A | 11/1998 | Hanano |
| 5,844,146 A | 12/1998 | Murray et al. |
| 5,848,826 A | 12/1998 | Muller |
| 5,851,021 A | 12/1998 | Van Kley |
| 5,853,186 A | 12/1998 | Gentner et al. |
| 5,861,802 A | 1/1999 | Hungerink et al. |
| 5,861,814 A | 1/1999 | Clayton |
| 5,863,057 A | 1/1999 | Wessels |
| 5,865,593 A | 2/1999 | Cohn |
| 5,876,055 A | 3/1999 | Fontaine |
| 5,876,100 A | 3/1999 | Breckner et al. |
| 5,877,455 A | 3/1999 | Kyrtsos |
| 5,880,409 A | 3/1999 | Hartman |
| 5,883,312 A | 3/1999 | Hayashida |
| 5,884,238 A | 3/1999 | Noll et al. |
| 5,910,217 A | 6/1999 | Sargent |
| 5,912,616 A | 6/1999 | Valentino |
| 5,915,281 A | 6/1999 | Sparks |
| 5,921,641 A | 7/1999 | Lupges et al. |
| 5,941,560 A | 8/1999 | Wolfram |
| 5,947,225 A | 9/1999 | Kawakami et al. |
| 5,947,637 A | 9/1999 | Neuling |
| 5,951,035 A | 9/1999 | Phillips, Jr. et al. |
| 5,957,476 A | 9/1999 | Simpson |
| 5,964,476 A | 10/1999 | Maines |
| 5,969,270 A | 10/1999 | Doemes et al. |
| 5,971,432 A | 10/1999 | Gagnon et al. |
| 5,980,048 A | 11/1999 | Rannells, Jr. et al. |
| 5,983,729 A | 11/1999 | Taylor |
| 5,985,666 A | 11/1999 | Loiselle et al. |
| 5,988,000 A | 11/1999 | Adams |
| 5,988,666 A | 11/1999 | Flater |
| 6,000,709 A | 12/1999 | Gentner et al. |
| 6,003,614 A | 12/1999 | Crabb |
| 6,012,780 A | 1/2000 | Duvernay |
| 6,012,781 A | 1/2000 | Gerum |
| 6,013,880 A | 1/2000 | McFarlane et al. |
| 6,014,901 A | 1/2000 | Boe |
| 6,025,563 A | 2/2000 | Lesesky et al. |
| 6,035,943 A | 3/2000 | Gerein et al. |
| 6,037,550 A | 3/2000 | Bradley |
| 6,039,139 A | 3/2000 | Breed et al. |
| 6,039,410 A | 3/2000 | Robertson et al. |
| 6,042,196 A | 3/2000 | Nakamura et al. |
| 6,044,915 A | 4/2000 | Schlegel et al. |
| 6,044,916 A | 4/2000 | Hundeby |
| 6,050,649 A | 4/2000 | Hensley |
| 6,053,521 A | 4/2000 | Schertler |
| 6,065,353 A | 5/2000 | Hirabayashi et al. |
| 6,068,352 A | 5/2000 | Kulkarni et al. |
| 6,079,791 A | 6/2000 | Stumpe et al. |
| 6,082,203 A | 7/2000 | Koivisto et al. |
| 6,082,467 A | 7/2000 | Friesen |
| 6,084,183 A | 7/2000 | Nakazaki |
| 6,095,348 A | 8/2000 | Karashima |
| 6,100,794 A | 8/2000 | Hillier |
| 6,100,795 A | 8/2000 | Otterbacher et al. |
| 6,105,230 A | 8/2000 | Balestracci |
| 6,112,589 A | 9/2000 | Tressler et al. |
| 6,116,638 A | 9/2000 | Hosoda |
| 6,118,083 A | 9/2000 | Boyovich et al. |
| 6,120,052 A | 9/2000 | Capik et al. |
| 6,126,246 A | 10/2000 | Decker, Sr. et al. |
| 6,127,939 A | 10/2000 | Lesesky et al. |
| 6,139,118 A | 10/2000 | Hurst et al. |
| 6,142,959 A | 11/2000 | Sarvazyan et al. |
| 6,144,928 A | 11/2000 | Leimbach et al. |
| 6,150,617 A | 11/2000 | Hart et al. |
| 6,152,252 A | 11/2000 | Pettersson |
| 6,152,475 A | 11/2000 | Poole |
| 6,157,889 A | 12/2000 | Baker |
| 6,161,962 A | 12/2000 | French et al. |
| 6,168,181 B1 | 1/2001 | Gadd |
| 6,176,505 B1 | 1/2001 | Capik et al. |
| 6,178,650 B1 | 1/2001 | Thibodeaux |
| 6,179,319 B1 | 1/2001 | Malisch et al. |
| 6,189,644 B1 | 2/2001 | Taylor |
| 6,196,328 B1 | 3/2001 | McDaniel et al. |
| 6,203,045 B1 | 3/2001 | Kyrtsos et al. |
| 6,203,049 B1 | 3/2001 | Gibson |
| 6,216,072 B1 | 4/2001 | Boe et al. |
| 6,218,737 B1 | 4/2001 | Adamek et al. |
| 6,222,443 B1 | 4/2001 | Beeson et al. |
| 6,222,457 B1 | 4/2001 | Mills et al. |
| 6,230,817 B1 | 5/2001 | Haugen |
| 6,234,508 B1 | 5/2001 | Tuttle et al. |
| 6,234,511 B1 | 5/2001 | Gentner et al. |
| 6,240,339 B1 | 5/2001 | von Mayenburg et al. |
| 6,240,788 B1 | 6/2001 | Balestracci |
| 6,242,701 B1 | 6/2001 | Breed et al. |
| 6,246,316 B1 * | 6/2001 | Andsager .............. B60C 23/061 340/442 |
| 6,250,650 B1 | 6/2001 | Douglas |
| 6,250,863 B1 | 6/2001 | Kamentser et al. |
| 6,252,497 B1 | 6/2001 | Dupay et al. |
| 6,259,357 B1 | 7/2001 | Heider |
| 6,262,573 B1 | 7/2001 | Wojnarowski et al. |

(56) References Cited

U.S. PATENT DOCUMENTS

| | | |
|---|---|---|
| 6,264,337 B1 | 7/2001 | Rannells, Jr. et al. |
| 6,268,800 B1 | 7/2001 | Howard |
| 6,273,522 B1 | 8/2001 | Feetenby et al. |
| 6,285,278 B1 | 9/2001 | Schutt et al. |
| 6,289,749 B1 | 9/2001 | Sanders |
| 6,299,191 B1 | 10/2001 | Sargent |
| 6,302,424 B1 | 10/2001 | Gisinger et al. |
| 6,308,578 B1 | 10/2001 | DeRose |
| 6,327,903 B1 | 12/2001 | Hecker et al. |
| 6,334,746 B1 | 1/2002 | Nguyen et al. |
| 6,349,959 B2 | 2/2002 | Schlegel et al. |
| 6,351,697 B1 | 2/2002 | Baker |
| 6,352,277 B1 | 3/2002 | Timmings |
| 6,354,448 B1 | 3/2002 | Ramne |
| 6,364,432 B1 | 4/2002 | Mixon |
| 6,371,217 B1 | 4/2002 | Boden |
| 6,375,211 B1 | 4/2002 | MacKarvich |
| 6,378,620 B1 | 4/2002 | Luca et al. |
| 6,378,957 B1 | 4/2002 | Vågstedt |
| 6,384,716 B1 | 5/2002 | Eckelberry |
| 6,394,490 B2 | 5/2002 | Osmer et al. |
| 6,401,855 B1 | 6/2002 | Wolfe |
| 6,407,353 B1 | 6/2002 | Fritzinger et al. |
| 6,408,685 B2 | 6/2002 | Shin |
| 6,416,138 B1 | 7/2002 | Barnett |
| 6,419,037 B1 | 7/2002 | Kramer et al. |
| 6,420,798 B2 | 7/2002 | Adamek et al. |
| 6,439,545 B1 | 8/2002 | Hansen |
| 6,445,993 B1 | 9/2002 | Eccleston et al. |
| 6,446,998 B1 | 9/2002 | Koenig et al. |
| 6,450,523 B1 | 9/2002 | Masters et al. |
| 6,452,485 B1 | 9/2002 | Schutt et al. |
| 6,456,066 B1 | 9/2002 | Burd et al. |
| 6,480,104 B1 | 11/2002 | Wall et al. |
| 6,490,935 B1 | 12/2002 | Joki et al. |
| 6,494,476 B2 | 12/2002 | Masters et al. |
| 6,494,478 B1 | 12/2002 | MacKarvich |
| 6,499,814 B1 | 12/2002 | Mixon |
| 6,516,925 B1 | 2/2003 | Napier et al. |
| 6,523,911 B1 | 2/2003 | Rupp et al. |
| 6,524,221 B2 | 2/2003 | Nishimura |
| 6,525,276 B1 | 2/2003 | Vellidus et al. |
| 6,531,951 B2 | 3/2003 | Serban et al. |
| 6,534,728 B1 | 3/2003 | Spikings |
| 6,547,271 B2 | 4/2003 | Kleb et al. |
| 6,581,695 B2 | 6/2003 | Bernhardt et al. |
| 6,587,041 B1 | 7/2003 | Brown, Jr. |
| 6,592,230 B2 | 7/2003 | Dupay |
| 6,595,062 B1 | 7/2003 | Luke et al. |
| 6,598,895 B1 | 7/2003 | Hult et al. |
| 6,606,913 B1 | 8/2003 | Gianchandani |
| 6,609,055 B2 | 8/2003 | Stanley |
| 6,615,125 B2 | 9/2003 | Eccleston et al. |
| 6,619,136 B2 | 9/2003 | Basile et al. |
| 6,619,759 B2 | 9/2003 | Bradsen et al. |
| 6,624,363 B2 | 9/2003 | Orlando et al. |
| 6,626,504 B2 | 9/2003 | Harner et al. |
| 6,629,701 B1 | 10/2003 | Colibert |
| 6,631,916 B1 | 10/2003 | Miller |
| 6,636,047 B2 | 10/2003 | Arlt et al. |
| 6,640,646 B2 | 11/2003 | Davis et al. |
| 6,644,761 B2 | 11/2003 | Schuck |
| 6,647,162 B2 | 11/2003 | Kim et al. |
| 6,652,038 B1 | 11/2003 | Frye |
| 6,652,544 B2 | 11/2003 | Houser et al. |
| 6,655,710 B2 | 12/2003 | Lindell et al. |
| 6,662,138 B1 | 12/2003 | Takafuji et al. |
| 6,663,132 B1 | 12/2003 | Kizy |
| 6,666,097 B2 | 12/2003 | Smith |
| 6,666,527 B2 | 12/2003 | Gill et al. |
| 6,668,225 B2 | 12/2003 | Oh et al. |
| 6,685,281 B2 | 2/2004 | MacGregor et al. |
| 6,688,631 B1 | 2/2004 | Andre |
| 6,691,635 B2 | 2/2004 | Murakami et al. |
| 6,705,684 B1 | 3/2004 | Garvey |
| 6,722,684 B1 | 4/2004 | McAllister |
| 6,739,611 B2 | 5/2004 | Gisinger et al. |
| 6,753,780 B2 | 6/2004 | Li |
| 6,765,607 B2 | 7/2004 | Mizusawa et al. |
| 6,769,315 B2 | 8/2004 | Stevenson et al. |
| 6,769,709 B1 | 8/2004 | Piper et al. |
| 6,777,968 B1 | 8/2004 | Kobayashi et al. |
| 6,779,616 B1 | 8/2004 | Brown |
| 6,793,233 B2 | 9/2004 | Eckelberry et al. |
| 6,799,653 B2 | 10/2004 | Recknagel |
| 6,799,814 B2 | 10/2004 | Lesesky et al. |
| 6,803,530 B2 | 10/2004 | Carlstrom et al. |
| 6,807,869 B2 | 10/2004 | Farringdon et al. |
| 6,808,098 B1 | 10/2004 | Bickett, III et al. |
| 6,813,959 B2 | 11/2004 | Kim et al. |
| 6,829,943 B2 | 12/2004 | Weyand et al. |
| 6,845,851 B1 | 1/2005 | Donaldson et al. |
| 6,851,504 B2 | 2/2005 | Campbell et al. |
| 6,851,697 B2 | 2/2005 | Kinnard |
| 6,854,557 B1 | 2/2005 | Deng et al. |
| 6,859,753 B1 | 2/2005 | Thakur et al. |
| 6,860,030 B1 | 3/2005 | Graf et al. |
| 6,860,161 B2 | 3/2005 | Yamakawa et al. |
| 6,863,286 B2 | 3/2005 | Eros et al. |
| 6,863,295 B2 | 3/2005 | Reutlinger et al. |
| 6,866,283 B2 | 3/2005 | Alguera et al. |
| 6,871,547 B2 | 3/2005 | Davis et al. |
| 6,873,909 B2 | 3/2005 | Borugian |
| 6,886,847 B2 | 5/2005 | Piper et al. |
| 6,920,940 B2 | 7/2005 | Casali et al. |
| 6,921,100 B2 | 7/2005 | Mantini et al. |
| 6,921,139 B2 | 7/2005 | Tobler |
| 6,931,947 B2 | 8/2005 | Schulze et al. |
| 6,932,374 B1 | 8/2005 | Timms et al. |
| 6,938,910 B2 | 9/2005 | Liljeberg et al. |
| 6,940,186 B2 | 9/2005 | Weitkamp |
| 6,945,348 B2 | 9/2005 | Henderson et al. |
| 6,948,387 B2 | 9/2005 | Chen et al. |
| 6,966,613 B2 | 11/2005 | Davis |
| 6,969,809 B2 | 11/2005 | Rainey |
| 6,971,452 B2 | 12/2005 | Ocsenknecht et al. |
| 6,983,883 B2 | 1/2006 | Ridling |
| 6,990,745 B1 | 1/2006 | Schoenenberger |
| 6,997,060 B2 | 2/2006 | Morikawa |
| 6,997,279 B2 | 2/2006 | Kolpasky et al. |
| 7,000,352 B2 | 2/2006 | Ishihara et al. |
| 7,005,587 B2 | 2/2006 | Axakov et al. |
| 7,006,127 B2 | 2/2006 | Mizusawa et al. |
| 7,009,118 B2 | 3/2006 | Pottebaum et al. |
| 7,021,157 B2 | 4/2006 | Nastasi, Jr. |
| 7,024,940 B2 | 4/2006 | Davis et al. |
| 7,032,918 B2 | 4/2006 | Saarinen et al. |
| 7,055,639 B2 | 6/2006 | Kiribayashi |
| 7,057,498 B1 | 6/2006 | Cook et al. |
| 7,072,763 B2 | 7/2006 | Saxon et al. |
| 7,073,603 B2 | 7/2006 | Nordhoff |
| 7,077,015 B2 | 7/2006 | Hayward et al. |
| 7,096,991 B2 | 8/2006 | Keutz |
| 7,117,755 B2 | 10/2006 | Yang |
| 7,125,033 B2 | 10/2006 | Forrister |
| 7,131,512 B2 | 11/2006 | Aoki |
| 7,135,645 B2 | 11/2006 | Hiraki et al. |
| 7,137,302 B2 | 11/2006 | Silverbrook et al. |
| 7,137,472 B2 | 11/2006 | Aoki |
| 7,140,632 B2 | 11/2006 | Alguera et al. |
| 7,141,746 B1 | 11/2006 | Scott |
| 7,142,968 B2 | 11/2006 | Alexander et al. |
| 7,151,443 B2 | 12/2006 | Dialinakis |
| 7,156,410 B1 | 1/2007 | Maskaleris |
| 7,158,017 B2 | 1/2007 | Baur et al. |
| 7,159,890 B2 | 1/2007 | Craig et al. |
| 7,168,661 B1 | 1/2007 | Fox |
| 7,171,289 B1 | 1/2007 | Tamez et al. |
| 7,171,330 B2 | 1/2007 | Kruse et al. |
| 7,171,769 B2 | 2/2007 | Schultz et al. |
| 7,178,818 B2 | 2/2007 | Katagiri et al. |
| 7,182,362 B2 | 2/2007 | Yeakel |
| 7,188,549 B2 | 3/2007 | Ohtake et al. |
| 7,190,258 B2 | 3/2007 | Lee |

(56) References Cited

U.S. PATENT DOCUMENTS

| | | |
|---|---|---|
| 7,195,267 B1 | 3/2007 | Thompson |
| 7,204,504 B2 | 4/2007 | Gehring et al. |
| 7,207,588 B2 | 4/2007 | Bergum et al. |
| 7,210,209 B2 | 5/2007 | Dvoskin et al. |
| 7,221,265 B2 | 5/2007 | Bjorkgard |
| 7,224,264 B2 | 5/2007 | Honan, III |
| 7,225,068 B2 | 5/2007 | Schick et al. |
| 7,225,891 B2 | 6/2007 | Gehring et al. |
| 7,226,068 B2 | 6/2007 | Ahner et al. |
| 7,226,134 B2 | 6/2007 | Horn et al. |
| 7,236,866 B2 | 6/2007 | Takafuji et al. |
| 7,237,790 B2 | 7/2007 | Gehring et al. |
| 7,261,487 B2 | 8/2007 | Urbach |
| 7,267,020 B2 | 9/2007 | Wilcox et al. |
| 7,270,486 B2 | 9/2007 | Meyer |
| 7,273,260 B2 | 9/2007 | Gray |
| 7,275,619 B2 | 10/2007 | Tokumoto |
| 7,285,735 B1 | 10/2007 | Elliott et al. |
| 7,287,947 B2 | 10/2007 | Smith |
| 7,290,783 B2 | 11/2007 | Dornbos |
| 7,293,809 B2 | 11/2007 | Suzuki et al. |
| 7,294,793 B2 | 11/2007 | Axakov et al. |
| 7,302,332 B2 | 11/2007 | Nenninger |
| 7,305,864 B2 | 12/2007 | Graber et al. |
| 7,309,075 B2 | 12/2007 | Ramsey et al. |
| 7,311,364 B2 | 12/2007 | Robertson |
| 7,331,238 B2 | 2/2008 | Wanami et al. |
| 7,336,159 B2 | 2/2008 | Fackrell et al. |
| 7,338,062 B1 | 3/2008 | Violette et al. |
| 7,341,264 B2 | 3/2008 | Swannie |
| 7,344,204 B2 | 3/2008 | Cayer |
| 7,344,311 B2 | 3/2008 | Lu et al. |
| 7,347,464 B2 | 3/2008 | Tanabe |
| 7,357,036 B2 | 4/2008 | Steprath |
| 7,361,303 B2 | 4/2008 | Kantor et al. |
| 7,380,810 B1 | 6/2008 | Wilkens et al. |
| 7,387,183 B2 | 6/2008 | Breed et al. |
| 7,388,370 B2 | 6/2008 | Cech et al. |
| 7,390,008 B1 | 6/2008 | Hall |
| 7,401,527 B2 | 7/2008 | Flaharty et al. |
| 7,401,871 B2 | 7/2008 | Lu et al. |
| 7,404,448 B2 | 7/2008 | Tuttle et al. |
| 7,404,466 B2 | 7/2008 | Diehl |
| 7,408,123 B2 | 8/2008 | Hawes et al. |
| 7,410,183 B2 | 8/2008 | Stowell et al. |
| 7,415,869 B2 | 8/2008 | Beverly et al. |
| 7,419,027 B2 | 9/2008 | Bihya |
| 7,429,051 B2 | 9/2008 | Bauer et al. |
| 7,429,073 B2 | 9/2008 | Watanabe et al. |
| 7,430,491 B2 | 9/2008 | Gutierrez et al. |
| 7,431,319 B2 | 10/2008 | Staggs |
| 7,438,368 B2 | 10/2008 | Kohler et al. |
| 7,452,038 B2 | 11/2008 | Crawford |
| 7,454,304 B2 | 11/2008 | Johansen et al. |
| 7,455,139 B2 | 11/2008 | Lee |
| 7,458,597 B2 | 12/2008 | MacDougall |
| 7,463,137 B2 | 12/2008 | Wishart et al. |
| 7,463,139 B2 | 12/2008 | Burlak et al. |
| 7,472,599 B2 | 1/2009 | Vik et al. |
| 7,484,750 B2 | 2/2009 | Van Vooren et al. |
| 7,497,458 B2 | 3/2009 | Daniel |
| 7,506,885 B2 | 3/2009 | Colibert et al. |
| 7,507,917 B2 | 3/2009 | Kaltenheuser |
| 7,520,183 B2 | 4/2009 | Kouduki et al. |
| 7,522,986 B2 | 4/2009 | Kitapini et al. |
| 7,530,590 B2 | 5/2009 | Staggs |
| 7,540,524 B2 | 6/2009 | Viaud |
| 7,546,764 B2 | 6/2009 | Morinaga et al. |
| 7,548,155 B2 | 6/2009 | Schutt et al. |
| 7,549,667 B2 | 6/2009 | Busuttil et al. |
| 7,556,278 B2 | 7/2009 | Roberts et al. |
| 7,559,270 B2 | 7/2009 | Langenfeld et al. |
| 7,559,569 B2 | 7/2009 | Nejsum |
| 7,562,893 B2 | 7/2009 | Donnard |
| 7,568,716 B2 | 8/2009 | Dietz |
| 7,572,988 B1 | 8/2009 | Morton et al. |
| 7,575,286 B2 | 8/2009 | Robertson |
| 7,581,503 B2 | 9/2009 | Martin et al. |
| 7,584,982 B2 | 9/2009 | Fisher |
| 7,588,089 B2 | 9/2009 | Guo et al. |
| 7,598,845 B2 | 10/2009 | Kanafani |
| 7,600,574 B2 | 10/2009 | Chauvel |
| 7,603,918 B2 | 10/2009 | Blackwood et al. |
| 7,607,677 B1 | 10/2009 | Bosak |
| 7,619,506 B2 | 11/2009 | Knoll et al. |
| 7,619,508 B2 | 11/2009 | Lynam et al. |
| 7,621,552 B2 | 11/2009 | Bergum et al. |
| 7,631,886 B2 | 12/2009 | Kapfer et al. |
| 7,633,020 B2 | 12/2009 | Santi et al. |
| 7,648,153 B2 | 1/2010 | Metternich et al. |
| 7,651,114 B2 | 1/2010 | Weber et al. |
| 7,686,516 B2 | 3/2010 | Shibasaki et al. |
| 7,690,664 B2 | 4/2010 | Saieg et al. |
| 7,690,670 B1 | 4/2010 | Lincul |
| 7,693,661 B2 | 4/2010 | Iwasaka |
| 7,703,790 B2 | 4/2010 | Cunefare et al. |
| 7,712,760 B2 | 5/2010 | Ohtomo |
| 7,715,970 B2 | 5/2010 | Snyder |
| 7,717,451 B2 | 5/2010 | Alguera |
| 7,719,409 B1 | 5/2010 | Jones |
| 7,731,215 B2 | 6/2010 | Alguera |
| 7,731,216 B2 | 6/2010 | Cornish |
| 7,731,302 B2 | 6/2010 | Tandy, Jr. et al. |
| 7,757,803 B2 | 7/2010 | Fiske et al. |
| 7,758,059 B2 | 7/2010 | Alguera Gallego et al. |
| 7,762,736 B2 | 7/2010 | Ersoy et al. |
| 7,770,909 B2 | 8/2010 | Anderson et al. |
| 7,772,839 B2 | 8/2010 | Watson et al. |
| 7,775,316 B2 | 8/2010 | Hosokawa et al. |
| 7,777,482 B2 | 8/2010 | Munz et al. |
| 7,777,615 B2 | 8/2010 | Okuda et al. |
| 7,786,849 B2 | 8/2010 | Buckley |
| 7,789,412 B2 | 9/2010 | Alguera |
| 7,793,965 B2 | 9/2010 | Padula |
| 7,797,093 B2 | 9/2010 | Tsukasaki et al. |
| 7,798,263 B2 | 9/2010 | Tandy, Jr. et al. |
| 7,806,423 B2 | 10/2010 | Vikstrom et al. |
| 7,815,212 B2 | 10/2010 | Groshong et al. |
| 7,818,140 B2 | 10/2010 | Dreier et al. |
| 7,825,783 B2 | 11/2010 | Gallego et al. |
| 7,826,953 B2 | 11/2010 | Traechtler |
| 7,839,142 B2 | 11/2010 | Cech et al. |
| 7,839,143 B2 | 11/2010 | Cech et al. |
| 7,857,331 B2 | 12/2010 | Walters, Jr. |
| 7,862,067 B2 | 1/2011 | Alguera |
| 7,864,033 B2 | 1/2011 | Imura et al. |
| 7,864,066 B2 | 1/2011 | Kriel et al. |
| 7,868,748 B2 | 1/2011 | Kiribayashi |
| 7,891,691 B2 | 2/2011 | Bearey |
| 7,896,383 B2 | 3/2011 | Cockram et al. |
| 7,900,736 B2 | 3/2011 | Breed |
| 7,904,222 B2 | 3/2011 | Lee et al. |
| 7,930,131 B2 | 4/2011 | Ridenour et al. |
| 7,932,816 B2 | 4/2011 | Schmidt et al. |
| 7,949,492 B2 | 5/2011 | Krueger et al. |
| 7,959,177 B2 | 6/2011 | Fiske et al. |
| 7,960,659 B2 | 6/2011 | Cleary |
| 7,963,547 B2 | 6/2011 | Anderson |
| 7,967,319 B2 | 6/2011 | Alguera |
| 7,971,942 B2 | 7/2011 | Parrott et al. |
| 7,984,920 B2 | 7/2011 | Alguera |
| 8,002,065 B2 | 8/2011 | Glavinic et al. |
| 8,013,759 B1 | 9/2011 | Aid et al. |
| 8,038,166 B1 | 10/2011 | Piesinger |
| 8,039,769 B2 | 10/2011 | Asp et al. |
| 8,051,941 B2 | 11/2011 | Takayasu et al. |
| 8,060,288 B2 | 11/2011 | Choby |
| 8,072,318 B2 | 12/2011 | Lynam et al. |
| 8,073,594 B2 | 12/2011 | Lee et al. |
| 8,087,304 B2 | 1/2012 | Lee |
| 8,098,145 B2 | 1/2012 | Ancuta et al. |
| 8,100,426 B2 | 1/2012 | Kronenberg |
| 8,120,475 B2 | 2/2012 | Iwamoto et al. |
| 8,138,899 B2 | 3/2012 | Ghneim |

(56) References Cited

U.S. PATENT DOCUMENTS

| | | | |
|---|---|---|---|
| 8,152,243 B2 | 4/2012 | Bensch et al. |
| 8,155,879 B2 | 4/2012 | Takagi et al. |
| 8,160,806 B2 | 4/2012 | Salaka |
| 8,165,768 B2 | 4/2012 | Leschuk et al. |
| 8,167,329 B2 | 5/2012 | Lee |
| 8,170,825 B2 | 5/2012 | Beaujot et al. |
| 8,180,543 B2 | 5/2012 | Futamura et al. |
| 8,180,546 B2 | 5/2012 | Culbert et al. |
| 8,188,385 B2 | 5/2012 | Wolfgang et al. |
| 8,191,915 B2 | 6/2012 | Freese, V et al. |
| RE43,537 E | 7/2012 | Davis |
| 8,234,993 B2 | 8/2012 | Naruishi et al. |
| 8,239,145 B2 | 8/2012 | Suzuki et al. |
| 8,240,270 B2 | 8/2012 | Naruishi |
| 8,256,526 B2 | 9/2012 | Schmidt et al. |
| 8,256,560 B2 | 9/2012 | Fiske et al. |
| 8,256,851 B2 | 9/2012 | Pelosse |
| 8,258,413 B2 | 9/2012 | Ito et al. |
| 8,258,981 B2 | 9/2012 | Turnbull |
| 8,260,518 B2 | 9/2012 | Englert |
| 8,262,120 B1 | 9/2012 | Pitts et al. |
| 8,262,173 B2 | 9/2012 | Crawford |
| 8,267,485 B2 | 9/2012 | Barlsen et al. |
| 8,276,461 B2 | 10/2012 | Zwygart |
| 8,282,173 B2 | 10/2012 | Forster et al. |
| 8,286,997 B2 | 10/2012 | Kimener et al. |
| 8,290,679 B2 | 10/2012 | Bensch et al. |
| 8,297,384 B2 | 10/2012 | Wanger et al. |
| 8,297,639 B2 | 10/2012 | Alguera Gallego |
| 8,297,713 B2 | 10/2012 | Soupal |
| 8,308,182 B2 | 11/2012 | Ortmann et al. |
| 8,317,216 B2 | 11/2012 | Treude et al. |
| 8,322,482 B2 | 12/2012 | Sprinkle et al. |
| 8,322,743 B1 | 12/2012 | Klein |
| 8,333,116 B2 | 12/2012 | Boone et al. |
| 8,335,607 B2 | 12/2012 | Gatten et al. |
| 8,342,560 B2 | 1/2013 | Albers et al. |
| 8,348,298 B2 | 1/2013 | Alguera et al. |
| 8,364,435 B2 | 1/2013 | Battenberg |
| 8,365,422 B1 | 2/2013 | Ott |
| 8,365,849 B2 | 2/2013 | Bartel |
| 8,366,135 B2 | 2/2013 | Asbach et al. |
| 8,368,523 B2 | 2/2013 | Takahashi et al. |
| 8,370,026 B2 | 2/2013 | Kondoh et al. |
| 8,374,757 B2 | 2/2013 | Choby |
| 8,380,390 B2 | 2/2013 | Sy et al. |
| 8,389,879 B2 | 3/2013 | Kolb et al. |
| 8,393,632 B2 | 3/2013 | Vortmeyer et al. |
| 8,414,010 B2 | 4/2013 | Smith |
| 8,421,611 B1 | 4/2013 | Coshow et al. |
| 8,424,393 B1 | 4/2013 | Lee |
| 8,424,892 B2 | 4/2013 | Hapyuk et al. |
| 8,430,458 B2 | 4/2013 | Kaminski et al. |
| 8,463,486 B2 | 6/2013 | Park |
| 8,463,519 B2 | 6/2013 | McCann |
| 8,469,125 B2 | 6/2013 | Yu et al. |
| 8,483,942 B2 | 7/2013 | Watanabe |
| 8,485,545 B2 | 7/2013 | Szczepanek |
| 8,505,954 B1 | 8/2013 | Haley |
| 8,509,997 B2 | 8/2013 | Sorimachi |
| 8,511,150 B2 | 8/2013 | Lucas et al. |
| 8,512,208 B2 | 8/2013 | Hilberer |
| 8,515,627 B2 | 8/2013 | Marathe et al. |
| 8,527,151 B2 | 9/2013 | Le et al. |
| 8,528,929 B2 | 9/2013 | Kimener |
| 8,532,870 B2 | 9/2013 | Hoetzer et al. |
| 8,539,843 B2 | 9/2013 | Inns et al. |
| 8,540,047 B2 | 9/2013 | Takayasu et al. |
| 8,548,683 B2 | 10/2013 | Cebon et al. |
| 8,561,472 B2 | 10/2013 | Sauder et al. |
| 8,565,983 B2 | 10/2013 | Alberius et al. |
| 8,567,820 B2 | 10/2013 | Kimener et al. |
| 8,571,777 B2 | 10/2013 | Greene |
| 8,573,627 B2 | 11/2013 | Appel |
| 8,578,794 B2 | 11/2013 | Lee |
| 8,579,067 B2 | 11/2013 | Kaiser et al. |
| 8,587,421 B2 | 11/2013 | Koie |
| 8,590,917 B2 | 11/2013 | Lee |
| 8,615,347 B2 | 12/2013 | Alguera Gallego et al. |
| 8,622,158 B2 | 1/2014 | Leonard |
| 8,630,753 B2 | 1/2014 | Cahill |
| 8,635,917 B2 | 1/2014 | Lee |
| 8,638,203 B2 | 1/2014 | Raines |
| 8,646,401 B2 | 2/2014 | Branch |
| 8,646,852 B2 | 2/2014 | Bitter et al. |
| 8,651,510 B2 | 2/2014 | Fankhauser et al. |
| 8,651,585 B2 | 2/2014 | Kaminski et al. |
| 8,653,959 B2 | 2/2014 | Lynam et al. |
| 8,665,080 B2 | 3/2014 | Nagamine et al. |
| 8,678,121 B2 | 3/2014 | Troy et al. |
| 8,678,420 B2 | 3/2014 | Gallego et al. |
| 8,694,211 B2 | 4/2014 | Alg era |
| 8,698,643 B2 | 4/2014 | Schmitt et al. |
| 8,700,270 B2 | 4/2014 | Foster et al. |
| 8,701,503 B2 | 4/2014 | Shimizu et al. |
| 8,706,344 B2 | 4/2014 | Park |
| 8,716,609 B2 | 5/2014 | Pangrazio et al. |
| 8,717,013 B2 | 5/2014 | Rohmann |
| 8,717,197 B2 | 5/2014 | Rathmacher et al. |
| 8,733,242 B2 | 5/2014 | Viaud |
| 8,738,196 B2 | 5/2014 | Kronenberg |
| 8,739,916 B2 | 6/2014 | Furuhi et al. |
| 8,744,694 B2 | 6/2014 | Ystueta |
| 8,746,084 B2 | 6/2014 | Ghannam et al. |
| 8,746,812 B2 | 6/2014 | Albright et al. |
| 8,749,628 B2 | 6/2014 | Wuestefeld et al. |
| 8,753,032 B2 | 6/2014 | Yu et al. |
| 8,768,535 B2 | 7/2014 | Kossira et al. |
| 8,779,305 B2 | 7/2014 | Takayasu et al. |
| 8,781,714 B2 | 7/2014 | Kim et al. |
| 8,788,151 B2 | 7/2014 | Hwang et al. |
| 8,789,850 B2 | 7/2014 | Kimener et al. |
| 8,789,896 B2 | 7/2014 | Albright et al. |
| 8,794,656 B2 | 8/2014 | West |
| 8,798,842 B2 | 8/2014 | Woolf et al. |
| 8,814,198 B2 | 8/2014 | Wolfe |
| 8,818,699 B2 | 8/2014 | Nichols et al. |
| 8,822,849 B2 | 9/2014 | Takayasu et al. |
| 8,827,297 B2 | 9/2014 | Keatley |
| 8,836,458 B2 | 9/2014 | Lee |
| 8,838,353 B2 | 9/2014 | Wu et al. |
| 8,841,566 B2 | 9/2014 | Reichow et al. |
| 8,841,994 B2 | 9/2014 | Li et al. |
| 8,850,900 B2 | 10/2014 | Isono et al. |
| 8,855,854 B2 | 10/2014 | Schmidt et al. |
| 8,857,825 B1 | 10/2014 | Johnson |
| 8,864,247 B2 | 10/2014 | Hilberer |
| 8,864,382 B2 | 10/2014 | Ono et al. |
| 8,868,356 B2 | 10/2014 | Liu |
| 8,886,400 B2 | 11/2014 | Kossira et al. |
| 8,888,120 B2 | 11/2014 | Trevino |
| 8,888,121 B2 | 11/2014 | Trevino et al. |
| 8,890,670 B2 * | 11/2014 | Brey ............... B60T 7/16 |
| | | 340/431 |
| 8,892,270 B2 | 11/2014 | Engstrand |
| 8,893,562 B2 | 11/2014 | Barraco et al. |
| 8,905,179 B2 | 12/2014 | Endo et al. |
| 8,905,424 B2 | 12/2014 | Williams, Jr. et al. |
| 8,917,170 B2 | 12/2014 | Padula |
| 8,930,114 B1 | 1/2015 | Reid |
| 8,939,462 B2 | 1/2015 | Adamczyk et al. |
| 8,954,240 B2 | 2/2015 | Scully |
| 8,955,865 B2 | 2/2015 | Fortin et al. |
| 8,965,635 B2 | 2/2015 | Alberius et al. |
| 8,966,998 B2 | 3/2015 | Gentner et al. |
| 8,976,246 B1 | 3/2015 | Rappuhn |
| 8,987,615 B2 | 3/2015 | Khatavkar et al. |
| 8,988,220 B2 | 3/2015 | Markyvech et al. |
| 8,997,587 B2 | 4/2015 | Usowicz et al. |
| 8,998,240 B2 | 4/2015 | Boittin et al. |
| 9,004,523 B2 | 4/2015 | Scharf |
| 9,016,142 B2 | 4/2015 | Takahashi et al. |
| 9,026,311 B1 | 5/2015 | Pieronek et al. |
| 9,027,949 B2 | 5/2015 | Reimer |

(56) References Cited

U.S. PATENT DOCUMENTS

| | | |
|---|---|---|
| 9,031,754 B2 | 5/2015 | Matoy et al. |
| 9,037,312 B2 | 5/2015 | Rhode et al. |
| 9,037,322 B2 | 5/2015 | Fortin et al. |
| 9,037,346 B2 | 5/2015 | Keys, II et al. |
| 9,043,094 B2 | 5/2015 | Wellhoefer et al. |
| 9,056,535 B2 | 6/2015 | Materna et al. |
| 9,061,629 B2 | 6/2015 | Miller et al. |
| 9,061,686 B2 | 6/2015 | Yu et al. |
| 9,078,391 B2 | 7/2015 | Pichlmaier |
| 9,080,931 B2 | 7/2015 | Carbo, Jr. et al. |
| 9,085,261 B2 | 7/2015 | Lu et al. |
| 9,102,272 B2 | 8/2015 | Trombley et al. |
| 9,108,598 B2 | 8/2015 | Headley |
| 9,108,691 B2 | 8/2015 | Fanourakis et al. |
| 9,109,964 B2 | 8/2015 | Bao et al. |
| 9,114,832 B2 | 8/2015 | Wang et al. |
| 9,120,358 B2 | 9/2015 | Motts et al. |
| 9,120,359 B2 | 9/2015 | Chiu et al. |
| 9,133,780 B2 | 9/2015 | Asami et al. |
| 9,134,149 B2 | 9/2015 | Endo et al. |
| 9,140,587 B2 | 9/2015 | Endo et al. |
| 9,150,061 B2 | 10/2015 | Riehle et al. |
| 9,150,062 B2 | 10/2015 | Hao |
| 9,150,201 B2 | 10/2015 | Smith et al. |
| 9,156,384 B2 | 10/2015 | Takayasu et al. |
| 9,157,785 B2 | 10/2015 | Brenninger |
| 9,168,901 B2 | 10/2015 | Funder et al. |
| 9,174,614 B2 | 11/2015 | Mercure |
| 9,180,814 B2 | 11/2015 | Mitani et al. |
| 9,180,846 B2 | 11/2015 | Mercure |
| 9,186,942 B1 | 11/2015 | Waggoner et al. |
| 9,193,385 B2 | 11/2015 | Svardby et al. |
| 9,207,135 B2 | 12/2015 | Staufer et al. |
| 9,211,772 B2 | 12/2015 | Brown et al. |
| 9,217,683 B2 | 12/2015 | Branch |
| 9,227,474 B2 | 1/2016 | Liu |
| 9,227,607 B1 | 1/2016 | Ripley et al. |
| 9,228,882 B2 | 1/2016 | Ruby |
| 9,234,815 B2 | 1/2016 | Brathe et al. |
| 9,238,483 B2 | 1/2016 | Hafner et al. |
| 9,254,828 B2 | 2/2016 | Simpson |
| 9,255,858 B2 | 2/2016 | Vallon et al. |
| 9,255,909 B2 | 2/2016 | Kollgaard et al. |
| 9,258,869 B2 | 2/2016 | Tarr |
| 9,260,078 B2 | 2/2016 | Mederer et al. |
| 9,266,401 B2 | 2/2016 | Klank et al. |
| 9,268,061 B2 | 2/2016 | Salmi |
| 9,278,673 B2 | 3/2016 | Squire et al. |
| 9,282,690 B2 | 3/2016 | Tilkes et al. |
| 9,283,932 B2 | 3/2016 | Bleckmann et al. |
| 9,290,166 B2 | 3/2016 | Harrison et al. |
| 9,290,203 B2 | 3/2016 | Lavoie et al. |
| 9,302,557 B2 | 4/2016 | Alldredge et al. |
| 9,303,627 B2 | 4/2016 | Romo et al. |
| 9,315,173 B1 | 4/2016 | Gray et al. |
| 9,315,179 B2 | 4/2016 | Herges et al. |
| 9,321,440 B2 | 4/2016 | Perlick et al. |
| 9,321,483 B2 | 4/2016 | Headley |
| 9,327,566 B2 | 5/2016 | McAllister |
| 9,329,094 B2 | 5/2016 | Noguchi |
| 9,335,163 B2 | 5/2016 | Lavoie et al. |
| 9,338,937 B2 | 5/2016 | Sauder et al. |
| 9,340,150 B2 | 5/2016 | Kendrick et al. |
| 9,340,197 B1 | 5/2016 | Miersch-Wiemers et al. |
| 9,346,439 B2 | 5/2016 | Diehl et al. |
| 9,347,844 B2 | 5/2016 | Tilkes et al. |
| 9,347,845 B2 | 5/2016 | Gießibl |
| 9,352,623 B2 | 5/2016 | Lynam et al. |
| 9,352,629 B2 | 5/2016 | Chabanon et al. |
| 9,366,591 B2 | 6/2016 | Bodenweber et al. |
| 9,370,977 B2 | 6/2016 | Sallis, Sr. |
| 9,372,125 B2 | 6/2016 | Geldman |
| 9,374,562 B2 | 6/2016 | Trombley et al. |
| 9,383,270 B1 | 7/2016 | Galambos et al. |
| 9,389,328 B2 | 7/2016 | Schneider et al. |
| 9,393,593 B2 | 7/2016 | Niemi et al. |
| 9,393,846 B2 | 7/2016 | Kadnikov et al. |
| 9,395,233 B2 | 7/2016 | Dourra et al. |
| 9,400,238 B2 | 7/2016 | Bin |
| 9,403,412 B2 | 8/2016 | Kim et al. |
| 9,403,413 B2 | 8/2016 | Talty et al. |
| 9,415,753 B2 | 8/2016 | Pieronek et al. |
| 9,421,884 B2 | 8/2016 | Boyer et al. |
| 9,432,492 B2 | 8/2016 | Peterson et al. |
| 9,434,224 B2 | 9/2016 | Schulte |
| 9,434,414 B2 | 9/2016 | Lavoie |
| 9,442,030 B2 | 9/2016 | Fujiwara et al. |
| 9,446,747 B2 | 9/2016 | Fosdike |
| 9,456,468 B2 | 9/2016 | Fry |
| 9,457,632 B1 | 10/2016 | Windeler et al. |
| 9,459,135 B2 | 10/2016 | Kirita et al. |
| 9,459,161 B1 | 10/2016 | Galambos et al. |
| 9,464,886 B2 | 10/2016 | Salter et al. |
| 9,464,887 B2 | 10/2016 | Salter et al. |
| 9,464,930 B2 | 10/2016 | Santi |
| 9,464,953 B2 | 10/2016 | Wirthlin |
| 9,481,346 B2 | 11/2016 | Morselli et al. |
| 9,493,156 B2 | 11/2016 | Haeussler et al. |
| 9,499,018 B2 | 11/2016 | Gehrke et al. |
| 9,499,109 B2 | 11/2016 | Armacost et al. |
| 9,499,200 B2 | 11/2016 | Hochrein et al. |
| 9,505,281 B1 | 11/2016 | Borkholder |
| 9,506,786 B2 | 11/2016 | Strnad et al. |
| 9,510,498 B2 | 12/2016 | Tuttle et al. |
| 9,513,103 B2 | 12/2016 | Crossman |
| 9,516,275 B2 | 12/2016 | Okano et al. |
| 9,517,668 B2 | 12/2016 | Lavoie |
| 9,517,739 B2 | 12/2016 | Kollmer et al. |
| 9,518,881 B2 | 12/2016 | Hammerschmidt |
| 9,522,582 B2 | 12/2016 | Cullen et al. |
| 9,533,721 B2 | 1/2017 | Booher et al. |
| 9,545,828 B2 | 1/2017 | Grannemann et al. |
| 9,550,399 B2 | 1/2017 | Jones et al. |
| 9,550,479 B2 | 1/2017 | Kim |
| 9,550,481 B2 | 1/2017 | Tu et al. |
| 9,551,788 B2 | 1/2017 | Epler |
| 9,554,499 B2 | 1/2017 | Muller et al. |
| 9,555,813 B2 | 1/2017 | Strano |
| 9,561,784 B2 | 2/2017 | Casali et al. |
| 9,562,801 B2 | 2/2017 | Santi |
| 9,574,955 B2 | 2/2017 | Iwase et al. |
| 9,581,487 B2 | 2/2017 | Warzecha et al. |
| 9,593,992 B2 | 3/2017 | Wu |
| 9,604,613 B2 | 3/2017 | Cooper et al. |
| 9,610,975 B1 | 4/2017 | Hu et al. |
| 9,616,753 B2 | 4/2017 | Oi et al. |
| 9,616,943 B2 | 4/2017 | Burchett et al. |
| 9,623,849 B2 | 4/2017 | Spath et al. |
| 9,623,904 B2 | 4/2017 | Lavoie et al. |
| 9,630,459 B2 | 4/2017 | Choi |
| 9,631,969 B1 | 4/2017 | Whalen |
| 9,638,595 B2 | 5/2017 | Shigeta |
| 9,643,462 B2 | 5/2017 | McAllister |
| 9,645,023 B2 | 5/2017 | Li |
| 9,649,879 B2 | 5/2017 | Randall et al. |
| 9,649,899 B1 | 5/2017 | Berry et al. |
| 9,650,030 B2 | 5/2017 | Nagura |
| 9,651,433 B2 | 5/2017 | Matsuzawa et al. |
| 9,651,438 B2 | 5/2017 | Tokito |
| 9,653,865 B2 | 5/2017 | Ayabakan et al. |
| 9,656,637 B2 | 5/2017 | Kimener |
| 9,656,699 B1 | 5/2017 | Polgrean |
| 9,663,079 B2 | 5/2017 | Yamamoto |
| 9,671,298 B2 | 6/2017 | Sawada et al. |
| 9,676,377 B2 | 6/2017 | Hafner et al. |
| 9,677,592 B2 | 6/2017 | Bernhardt |
| 9,688,111 B1 | 6/2017 | Ghannam et al. |
| 9,694,749 B2 | 7/2017 | Lynam et al. |
| 9,694,790 B2 | 7/2017 | Kimener |
| 9,694,816 B2 | 7/2017 | Morissette |
| 9,696,227 B2 | 7/2017 | Lavergne |
| 9,696,229 B2 | 7/2017 | Schulz et al. |
| 9,696,723 B2 | 7/2017 | Zeng et al. |
| 9,702,797 B2 | 7/2017 | Yang |

(56) References Cited

U.S. PATENT DOCUMENTS

| | | |
|---|---|---|
| 9,708,165 B2 | 7/2017 | Oberg |
| 9,718,503 B2 | 8/2017 | Ursich et al. |
| 9,723,692 B2 | 8/2017 | Sibley, Jr. et al. |
| 9,723,815 B2 | 8/2017 | Epema |
| 9,726,535 B2 | 8/2017 | Reichow et al. |
| 9,731,568 B2 | 8/2017 | Wuergler et al. |
| 9,738,125 B1 | 8/2017 | Brickley et al. |
| 9,738,216 B2 | 8/2017 | Kendrick et al. |
| 9,738,333 B2 | 8/2017 | Alldredge et al. |
| 9,744,972 B2 | 8/2017 | Trombley et al. |
| 9,745,013 B2 | 8/2017 | Wood |
| 9,758,138 B2 | 9/2017 | Albright et al. |
| 9,758,140 B2 | 9/2017 | Eberling et al. |
| 9,760,748 B2 | 9/2017 | Iannotti et al. |
| 9,796,226 B2 | 10/2017 | Turner et al. |
| 9,796,227 B2 | 10/2017 | McAllister |
| 9,799,132 B2 | 10/2017 | Okano et al. |
| 9,802,587 B2 | 10/2017 | Morselli |
| 9,802,771 B2 | 10/2017 | Kimener et al. |
| 9,804,022 B2 | 10/2017 | Kyrtsos et al. |
| 9,805,459 B2 | 10/2017 | Nakamura et al. |
| 9,805,623 B1 | 10/2017 | Kwon et al. |
| 9,809,206 B2 | 11/2017 | Hummel et al. |
| 9,809,249 B2 | 11/2017 | Boehm et al. |
| 9,812,037 B2 | 11/2017 | Kwon et al. |
| 9,821,779 B2 | 11/2017 | Grandstaff et al. |
| 9,823,142 B2 | 11/2017 | Lehmann |
| 9,823,148 B2 | 11/2017 | Von Waitz et al. |
| 9,827,818 B2 | 11/2017 | Hu et al. |
| 9,827,819 B2 | 11/2017 | Luker |
| 9,828,046 B2 | 11/2017 | Hellholm |
| 9,834,049 B2 | 12/2017 | Strand |
| 9,834,140 B2 | 12/2017 | Windeler |
| 9,834,184 B2 | 12/2017 | Braunberger |
| 9,834,187 B2 | 12/2017 | Englert et al. |
| 9,835,479 B2 | 12/2017 | Endo et al. |
| 9,840,119 B1 | 12/2017 | Melaragni |
| 9,840,240 B2 | 12/2017 | Trombley et al. |
| 9,840,277 B1 | 12/2017 | Beech |
| 9,841,312 B2 | 12/2017 | Vail et al. |
| 9,844,988 B2 | 12/2017 | Van de Wetering |
| 9,851,265 B2 | 12/2017 | Buttle |
| 9,852,346 B2 | 12/2017 | Min |
| 9,854,209 B2 | 12/2017 | Aich et al. |
| 9,855,876 B2 | 1/2018 | Affleck |
| 9,856,698 B2 | 1/2018 | Pollock et al. |
| 9,857,251 B2 | 1/2018 | Seo et al. |
| 9,857,255 B2 | 1/2018 | Hagan |
| 9,862,242 B2 | 1/2018 | Lurie |
| 9,868,327 B1 | 1/2018 | Borkholder |
| 9,868,328 B2 | 1/2018 | Kortesalmi |
| 9,870,653 B1 | 1/2018 | Fritz et al. |
| 9,873,300 B1 | 1/2018 | Gramlow |
| 9,880,560 B2 | 1/2018 | Han et al. |
| 9,883,622 B2 | 2/2018 | Gschwendtner et al. |
| 9,884,528 B2 | 2/2018 | Hara |
| 9,884,529 B2 | 2/2018 | Davis, Jr. et al. |
| 9,884,639 B2 | 2/2018 | Collins |
| 9,885,749 B2 | 2/2018 | Penjovic et al. |
| 2001/0003393 A1 | 6/2001 | Cooper |
| 2001/0007234 A1 | 7/2001 | Scheetz |
| 2001/0037164 A1 | 11/2001 | Hecker |
| 2001/0038239 A1 | 11/2001 | Ehrlich et al. |
| 2001/0040408 A1 | 11/2001 | Lesesky et al. |
| 2001/0051809 A1 | 12/2001 | Houser et al. |
| 2002/0004418 A1 | 1/2002 | Mesquita et al. |
| 2002/0030347 A1 | 3/2002 | Korneff |
| 2002/0030403 A1 | 3/2002 | Lesesky et al. |
| 2002/0032533 A1 | 3/2002 | Sangiacomo |
| 2002/0038193 A1 | 3/2002 | Grunberg et al. |
| 2002/0056579 A1 | 5/2002 | Cooper |
| 2002/0074139 A1 | 6/2002 | Ankenman |
| 2002/0092360 A1 | 7/2002 | McDearmon |
| 2002/0093245 A1 | 7/2002 | Claerhout |
| 2002/0107627 A1 | 8/2002 | Funke et al. |
| 2002/0125049 A1 | 9/2002 | Kajiyama |
| 2002/0149172 A1 | 10/2002 | Field et al. |
| 2002/0154004 A1 | 10/2002 | Meyer |
| 2002/0157841 A1 | 10/2002 | Bernhardt et al. |
| 2002/0189881 A1 | 12/2002 | Mathias et al. |
| 2002/0195870 A1 | 12/2002 | Brunson et al. |
| 2003/0010554 A1 | 1/2003 | Grong et al. |
| 2003/0037767 A1 | 2/2003 | Breitegger et al. |
| 2003/0037981 A1 | 2/2003 | Scholer et al. |
| 2003/0051477 A1 | 3/2003 | Franklin |
| 2003/0083828 A1 | 5/2003 | Stylios |
| 2003/0085562 A1 | 5/2003 | Sparling |
| 2003/0090083 A1 | 5/2003 | Williams |
| 2003/0117011 A1 | 6/2003 | Ackley |
| 2003/0127255 A1 | 7/2003 | Hammonds |
| 2003/0137126 A1 | 7/2003 | Reuter et al. |
| 2003/0178811 A1 | 9/2003 | Buckner |
| 2003/0184047 A1 | 10/2003 | Gallego et al. |
| 2003/0196495 A1 | 10/2003 | Saunders et al. |
| 2003/0209086 A1 | 11/2003 | Schurr et al. |
| 2003/0217606 A1 | 11/2003 | Moore et al. |
| 2003/0220766 A1 | 11/2003 | Saunders et al. |
| 2003/0226704 A1 | 12/2003 | Aoki et al. |
| 2004/0011579 A1 | 1/2004 | Heckmann et al. |
| 2004/0016304 A1 | 1/2004 | Kaijala et al. |
| 2004/0017285 A1 | 1/2004 | Zielinski et al. |
| 2004/0021291 A1 | 2/2004 | Haug et al. |
| 2004/0032323 A1 | 2/2004 | Nommensen |
| 2004/0035630 A1 | 2/2004 | Lich et al. |
| 2004/0035631 A1 | 2/2004 | Schlecht et al. |
| 2004/0042696 A1 | 3/2004 | Kajiyama |
| 2004/0045361 A1 | 3/2004 | Davis et al. |
| 2004/0045362 A1 | 3/2004 | Davis et al. |
| 2004/0069078 A1 | 4/2004 | Schwendemann |
| 2004/0079576 A1 | 4/2004 | Knight-Newbury et al. |
| 2004/0084876 A1 | 5/2004 | Losee |
| 2004/0104555 A1 | 6/2004 | Atley |
| 2004/0112246 A1 | 6/2004 | Gain et al. |
| 2004/0124026 A1 | 7/2004 | Walters et al. |
| 2004/0124605 A1 | 7/2004 | McClure et al. |
| 2004/0129479 A1 | 7/2004 | Ozaki |
| 2004/0139793 A1 | 7/2004 | Bac |
| 2004/0162658 A1 | 8/2004 | Newman |
| 2004/0169363 A1 | 9/2004 | Fukawatase et al. |
| 2004/0183372 A1 | 9/2004 | Heuer et al. |
| 2004/0195030 A1 | 10/2004 | Eberle et al. |
| 2004/0195031 A1 | 10/2004 | Nagasaka |
| 2004/0221663 A1 | 11/2004 | Umemura et al. |
| 2004/0251659 A1 | 12/2004 | Amerson |
| 2004/0252019 A1 | 12/2004 | Paull |
| 2004/0255680 A1 | 12/2004 | Ortega et al. |
| 2004/0256184 A1 | 12/2004 | Liljeberg et al. |
| 2004/0262883 A1 | 12/2004 | Kerins et al. |
| 2005/0000303 A1 | 1/2005 | Moore et al. |
| 2005/0006165 A1 | 1/2005 | Scherl et al. |
| 2005/0006946 A1 | 1/2005 | Traechtler et al. |
| 2005/0011694 A1 | 1/2005 | Rosenthal et al. |
| 2005/0012304 A1 | 1/2005 | Pfleging et al. |
| 2005/0017577 A1 | 1/2005 | Eckert et al. |
| 2005/0023050 A1 | 2/2005 | Chidlow et al. |
| 2005/0023064 A1 | 2/2005 | Lich et al. |
| 2005/0045403 A1 | 3/2005 | Inoue |
| 2005/0056477 A1 | 3/2005 | Saieg et al. |
| 2005/0061569 A1 | 3/2005 | Pascolo et al. |
| 2005/0087381 A1 | 4/2005 | Tobata |
| 2005/0087955 A1 | 4/2005 | Kellogg |
| 2005/0098371 A1 | 5/2005 | Zabtcioglu |
| 2005/0109548 A1 | 5/2005 | Cooper |
| 2005/0127628 A1 | 6/2005 | Ramsey |
| 2005/0128059 A1 | 6/2005 | Vause |
| 2005/0212256 A1 | 9/2005 | Cole |
| 2005/0248123 A1 | 11/2005 | Symington |
| 2005/0248125 A1 | 11/2005 | Flynn et al. |
| 2005/0269115 A1 | 12/2005 | Harnetiaux et al. |
| 2006/0032679 A1 | 2/2006 | Wilson et al. |
| 2006/0033308 A1 | 2/2006 | Waldbauer et al. |
| 2006/0042406 A1 | 3/2006 | Ono |
| 2006/0043767 A1 | 3/2006 | Lunson |
| 2006/0044121 A1 | 3/2006 | Jarnagin |

(56) References Cited

U.S. PATENT DOCUMENTS

| | | |
|---|---|---|
| 2006/0071549 A1 | 4/2006 | Chesnut et al. |
| 2006/0108771 A1 | 5/2006 | Elkins et al. |
| 2006/0125313 A1 | 6/2006 | Gunne et al. |
| 2006/0204347 A1 | 9/2006 | Waldbauer et al. |
| 2006/0207822 A1 | 9/2006 | Taylor |
| 2006/0210382 A1 | 9/2006 | Mountz et al. |
| 2006/0219417 A1 | 10/2006 | Thompson et al. |
| 2006/0220345 A1 | 10/2006 | Schmidt |
| 2006/0234842 A1 | 10/2006 | Minami et al. |
| 2006/0261572 A1 | 11/2006 | Biondi et al. |
| 2006/0273549 A1 | 12/2006 | Dietz |
| 2006/0289580 A1 | 12/2006 | Faver et al. |
| 2006/0290102 A1 | 12/2006 | VanBuskirk |
| 2007/0017715 A1 | 1/2007 | McCann |
| 2007/0034027 A1 | 2/2007 | Wolfer et al. |
| 2007/0040353 A1 | 2/2007 | Dallaire et al. |
| 2007/0040354 A1 | 2/2007 | Wacker et al. |
| 2007/0040355 A1 | 2/2007 | Spratte et al. |
| 2007/0058273 A1 | 3/2007 | Ito et al. |
| 2007/0065060 A1 | 3/2007 | Koike et al. |
| 2007/0068691 A1 | 3/2007 | Smart et al. |
| 2007/0114756 A1 | 5/2007 | Shagbazyan |
| 2007/0114759 A1 | 5/2007 | Biondi et al. |
| 2007/0131461 A1 | 6/2007 | Treadwell et al. |
| 2007/0132560 A1 | 6/2007 | Nystrom et al. |
| 2007/0140812 A1 | 6/2007 | Ohtake et al. |
| 2007/0152424 A1 | 7/2007 | Deng et al. |
| 2007/0164574 A1 | 7/2007 | Tanabe |
| 2007/0176394 A1 | 8/2007 | Gehring et al. |
| 2007/0181318 A1 | 8/2007 | Laudick et al. |
| 2007/0181350 A1 | 8/2007 | Kranz et al. |
| 2007/0194557 A1 | 8/2007 | Caporali et al. |
| 2007/0205580 A1 | 9/2007 | Hamilton et al. |
| 2007/0210538 A1 | 9/2007 | Steprath et al. |
| 2007/0216136 A1 | 9/2007 | Dietz |
| 2007/0216220 A1 | 9/2007 | Beijersbergen Van Henegouwen et al. |
| 2007/0222283 A1 | 9/2007 | Skinner et al. |
| 2007/0228814 A1 | 10/2007 | Miller |
| 2007/0245831 A1 | 10/2007 | Betancor Bethencourt |
| 2008/0029997 A1 | 2/2008 | Wickelmaier et al. |
| 2008/0058980 A1 | 3/2008 | Nakano |
| 2008/0073129 A1 | 3/2008 | Heuer |
| 2008/0073872 A1 | 3/2008 | Scott |
| 2008/0079237 A1 | 4/2008 | Rubin |
| 2008/0121401 A1 | 5/2008 | Posselius et al. |
| 2008/0143080 A1 | 6/2008 | Burr |
| 2008/0143179 A1 | 6/2008 | Rutherford |
| 2008/0157948 A1 | 7/2008 | Swannie |
| 2008/0159674 A1 | 7/2008 | Varonis |
| 2008/0164679 A1 | 7/2008 | MacDougall |
| 2008/0177435 A1 | 7/2008 | Caporali et al. |
| 2008/0191449 A1 | 8/2008 | Standen |
| 2008/0195250 A1 | 8/2008 | Post et al. |
| 2008/0217093 A1 | 9/2008 | Foxwell |
| 2008/0217883 A1 | 9/2008 | Gustafsson et al. |
| 2008/0238638 A1 | 10/2008 | Phillips |
| 2008/0257656 A1 | 10/2008 | Skinner et al. |
| 2008/0303647 A1 | 12/2008 | Pare |
| 2008/0309156 A1 | 12/2008 | Kissel |
| 2009/0001976 A1 | 1/2009 | Cech et al. |
| 2009/0008486 A1 | 1/2009 | Torres et al. |
| 2009/0028677 A1 | 1/2009 | Williams et al. |
| 2009/0069951 A1 | 3/2009 | Liljeblad et al. |
| 2009/0093928 A1 | 4/2009 | Getman et al. |
| 2009/0107734 A1 | 4/2009 | Lucas et al. |
| 2009/0115161 A1 | 5/2009 | Sato |
| 2009/0119030 A1 | 5/2009 | Fang et al. |
| 2009/0152831 A1 | 6/2009 | Verhagen |
| 2009/0189369 A1 | 7/2009 | Thomas |
| 2009/0205908 A1 | 8/2009 | Hammonds |
| 2009/0212770 A1 | 8/2009 | Koyama |
| 2009/0236578 A1 | 9/2009 | Nirenberg et al. |
| 2009/0309332 A1 | 12/2009 | Birkholz et al. |
| 2010/0030115 A1 | 2/2010 | Fujimoto et al. |
| 2010/0038213 A1 | 2/2010 | DeMong et al. |
| 2010/0038883 A1 | 2/2010 | Thedford et al. |
| 2010/0039515 A1 | 2/2010 | Dietz |
| 2010/0044998 A1 | 2/2010 | Franchineau |
| 2010/0063702 A1 | 3/2010 | Sabelstrom et al. |
| 2010/0066161 A1 | 3/2010 | Fry et al. |
| 2010/0071453 A1 | 3/2010 | Isono |
| 2010/0071968 A1 | 3/2010 | Gavarini et al. |
| 2010/0082179 A1 | 4/2010 | Kronenberg |
| 2010/0109286 A1 | 5/2010 | Visser |
| 2010/0161190 A1 | 6/2010 | McCann et al. |
| 2010/0180457 A1 | 7/2010 | Katoh et al. |
| 2010/0187489 A1 | 7/2010 | Hebert |
| 2010/0187794 A1 | 7/2010 | MacDougall |
| 2010/0206091 A1 | 8/2010 | Ariav et al. |
| 2010/0211279 A1 | 8/2010 | Lingman et al. |
| 2010/0230224 A1 | 9/2010 | Hindman |
| 2010/0262341 A1 | 10/2010 | Alguera |
| 2010/0262368 A1 | 10/2010 | Kaminski |
| 2010/0282522 A1 | 11/2010 | Endo et al. |
| 2010/0308291 A1 | 12/2010 | Krones |
| 2010/0308559 A1 | 12/2010 | Tarasinski et al. |
| 2010/0308809 A1 | 12/2010 | Houldley et al. |
| 2010/0324770 A1 | 12/2010 | Ramsey et al. |
| 2011/0018231 A1 | 1/2011 | Collenberg |
| 2011/0025482 A1 | 2/2011 | Alguera et al. |
| 2011/0049836 A1 | 3/2011 | Weber et al. |
| 2011/0050903 A1 | 3/2011 | Vorobiev |
| 2011/0071736 A1 | 3/2011 | Brown et al. |
| 2011/0073381 A1 | 3/2011 | Endo et al. |
| 2011/0087413 A1 | 4/2011 | McCrickard et al. |
| 2011/0094803 A1 | 4/2011 | Takayasu et al. |
| 2011/0101646 A1 | 5/2011 | Sakita |
| 2011/0155888 A1 | 6/2011 | Jordahl |
| 2011/0167929 A1 | 7/2011 | Ling et al. |
| 2011/0174553 A1 | 7/2011 | Chaudron et al. |
| 2011/0187143 A1 | 8/2011 | Foster |
| 2011/0189640 A1 | 8/2011 | Hurd |
| 2011/0202232 A1 | 8/2011 | Busch et al. |
| 2011/0209924 A1 | 9/2011 | Endo et al. |
| 2011/0210529 A1 | 9/2011 | Markstaller |
| 2011/0234388 A1 | 9/2011 | Lesesky et al. |
| 2011/0250038 A1 | 10/2011 | Affleck |
| 2011/0259651 A1 | 10/2011 | Cleary |
| 2011/0290576 A1 | 12/2011 | Koestler et al. |
| 2011/0303469 A1 | 12/2011 | Saito et al. |
| 2011/0303787 A1 | 12/2011 | Bennett |
| 2012/0000715 A1 | 1/2012 | Saigh |
| 2012/0007615 A1 | 1/2012 | Todd |
| 2012/0024081 A1 | 2/2012 | Baker |
| 2012/0027504 A1 | 2/2012 | Moisy et al. |
| 2012/0043735 A1 | 2/2012 | Grauer et al. |
| 2012/0059797 A1 | 3/2012 | Prahlad et al. |
| 2012/0187659 A1 | 7/2012 | Nordberg |
| 2012/0209425 A1 | 8/2012 | Beaujot et al. |
| 2012/0245711 A1 | 9/2012 | Park |
| 2012/0255646 A1 | 10/2012 | Hasenay |
| 2012/0283909 A1 | 11/2012 | Dix |
| 2012/0283925 A1 | 11/2012 | Barlsen et al. |
| 2012/0298387 A1 | 11/2012 | Sauermann |
| 2013/0056959 A1 | 3/2013 | Mathes et al. |
| 2013/0076007 A1 | 3/2013 | Goode et al. |
| 2013/0079979 A1 | 3/2013 | Sheidler et al. |
| 2013/0079980 A1 | 3/2013 | Vuk et al. |
| 2013/0080078 A1 | 3/2013 | Wirthlin |
| 2013/0081830 A1 | 4/2013 | Tuttle et al. |
| 2013/0154235 A1 | 6/2013 | Boittin et al. |
| 2013/0158826 A1 | 6/2013 | Cusi |
| 2013/0173116 A1 | 7/2013 | Gustafson et al. |
| 2013/0192854 A1 | 8/2013 | Kosmicki et al. |
| 2013/0192904 A1 | 8/2013 | Sprecher |
| 2013/0200248 A1* | 8/2013 | Polzer .................. G01R 33/022 248/550 |
| 2013/0226390 A1 | 8/2013 | Luo et al. |
| 2013/0234411 A1 | 9/2013 | Hapyuk et al. |
| 2013/0238205 A1 | 9/2013 | Edwards et al. |
| 2013/0253814 A1 | 9/2013 | Wirthlin |
| 2013/0297154 A1 | 11/2013 | Burchett et al. |
| 2014/0047928 A1 | 2/2014 | Bao et al. |

(56) References Cited

U.S. PATENT DOCUMENTS

| | | |
|---|---|---|
| 2014/0054874 A1 | 2/2014 | Masanek, Jr. et al. |
| 2014/0062178 A1 | 3/2014 | Panse et al. |
| 2014/0081544 A1 | 3/2014 | Fry |
| 2014/0097595 A1 | 4/2014 | Williams, Jr. et al. |
| 2014/0110918 A1 | 4/2014 | McCoy |
| 2014/0151979 A1 | 6/2014 | Puckett et al. |
| 2014/0159340 A1 | 6/2014 | Kimener et al. |
| 2014/0174239 A1 | 6/2014 | Nagata et al. |
| 2014/0183841 A1* | 7/2014 | Jones ................. B60T 7/20 280/446.1 |
| 2014/0190275 A1 | 7/2014 | McILravey |
| 2014/0202776 A1 | 7/2014 | Kane et al. |
| 2014/0216169 A1 | 8/2014 | Romo et al. |
| 2014/0224553 A1 | 8/2014 | Ozawa |
| 2014/0224588 A1 | 8/2014 | Van Seumeren |
| 2014/0237868 A1 | 8/2014 | Whitchurch et al. |
| 2014/0262918 A1 | 9/2014 | Chu |
| 2014/0288769 A1 | 9/2014 | Trombley et al. |
| 2014/0288795 A1 | 9/2014 | Albright et al. |
| 2014/0298916 A1 | 10/2014 | Duan et al. |
| 2014/0309840 A1 | 10/2014 | Woolf et al. |
| 2014/0360282 A1 | 12/2014 | Gie Ibl |
| 2015/0009010 A1 | 1/2015 | Biemer |
| 2015/0012199 A1 | 1/2015 | Mederer et al. |
| 2015/0030423 A1 | 1/2015 | Reid |
| 2015/0043711 A1 | 2/2015 | Den Heeten et al. |
| 2015/0069736 A1 | 3/2015 | Trevino et al. |
| 2015/0069737 A1 | 3/2015 | McAllister |
| 2015/0105963 A1 | 4/2015 | Blackwell et al. |
| 2015/0105975 A1 | 4/2015 | Dunn |
| 2015/0135890 A1 | 5/2015 | Pertile |
| 2015/0137482 A1 | 5/2015 | Woolf et al. |
| 2015/0203156 A1 | 7/2015 | Hafner et al. |
| 2015/0210257 A1 | 7/2015 | Matoy et al. |
| 2015/0231938 A1 | 8/2015 | Gentner |
| 2015/0253151 A1 | 9/2015 | Inberg et al. |
| 2015/0275991 A1 | 10/2015 | De Leon |
| 2015/0290988 A1* | 10/2015 | Masten ................ B60D 1/242 280/446.1 |
| 2015/0306928 A1 | 10/2015 | McCollum |
| 2015/0314818 A1 | 11/2015 | Gaston |
| 2015/0321697 A1 | 11/2015 | Lu et al. |
| 2015/0343865 A1 | 12/2015 | Hile et al. |
| 2015/0344277 A1 | 12/2015 | Simons |
| 2015/0353063 A1 | 12/2015 | Tuhro et al. |
| 2015/0374558 A1 | 12/2015 | Strong et al. |
| 2016/0023525 A1 | 1/2016 | Lavoie |
| 2016/0023642 A1 | 1/2016 | Smith et al. |
| 2016/0029543 A1 | 2/2016 | Stich et al. |
| 2016/0031357 A1 | 2/2016 | Collins |
| 2016/0039480 A1 | 2/2016 | Pichlmaier |
| 2016/0052548 A1 | 2/2016 | Singh et al. |
| 2016/0059888 A1 | 3/2016 | Bradley et al. |
| 2016/0075281 A1 | 3/2016 | Singh et al. |
| 2016/0114844 A1 | 4/2016 | Harris |
| 2016/0121790 A1 | 5/2016 | Mains, Jr. |
| 2016/0137204 A1 | 5/2016 | Morselli |
| 2016/0144906 A1 | 5/2016 | Han et al. |
| 2016/0159176 A1 | 6/2016 | McCormick et al. |
| 2016/0167630 A1 | 6/2016 | Wolf |
| 2016/0185170 A1 | 6/2016 | McAllister |
| 2016/0187185 A1 | 6/2016 | Smith |
| 2016/0229394 A1 | 8/2016 | Fujii et al. |
| 2016/0229453 A1 | 8/2016 | Yang et al. |
| 2016/0231165 A1 | 8/2016 | Fredrickson |
| 2016/0236526 A1 | 8/2016 | Shepard |
| 2016/0236659 A1 | 8/2016 | Diehl et al. |
| 2016/0243908 A1 | 8/2016 | Lannen et al. |
| 2016/0251005 A1 | 9/2016 | Morselli et al. |
| 2016/0255760 A1 | 9/2016 | Sauder et al. |
| 2016/0257176 A1 | 9/2016 | Tabellini et al. |
| 2016/0264046 A1 | 9/2016 | Bochenek et al. |
| 2016/0280023 A1 | 9/2016 | Olesen et al. |
| 2016/0284217 A1 | 9/2016 | Lee et al. |
| 2016/0297361 A1 | 10/2016 | Drazan et al. |
| 2016/0297432 A1 | 10/2016 | Fletcher et al. |
| 2016/0303933 A1 | 10/2016 | Nowakowski |
| 2016/0304054 A1 | 10/2016 | Mansuri et al. |
| 2016/0309807 A1 | 10/2016 | Stanzione |
| 2016/0311280 A1 | 10/2016 | Gerbrandt et al. |
| 2016/0318493 A1 | 11/2016 | Drako |
| 2016/0332606 A1 | 11/2016 | Buchner et al. |
| 2016/0340122 A1 | 11/2016 | Lindblom |
| 2016/0375736 A1 | 12/2016 | Wilson |
| 2016/0375831 A1 | 12/2016 | Wang et al. |
| 2017/0008357 A1 | 1/2017 | Sallis, Sr. |
| 2017/0008559 A1 | 1/2017 | Shepard |
| 2017/0015163 A1 | 1/2017 | Sielhorst |
| 2017/0016757 A1 | 1/2017 | Strong et al. |
| 2017/0043806 A1 | 2/2017 | Muharemovic et al. |
| 2017/0043807 A1 | 2/2017 | Shepard |
| 2017/0049012 A1 | 2/2017 | Hoshikawa et al. |
| 2017/0072753 A1 | 3/2017 | Kadnikov et al. |
| 2017/0074634 A1 | 3/2017 | Yoon et al. |
| 2017/0074700 A1 | 3/2017 | Strnad et al. |
| 2017/0082509 A1 | 3/2017 | Bushnell et al. |
| 2017/0086346 A1 | 3/2017 | Payne et al. |
| 2017/0088104 A1 | 3/2017 | Risse et al. |
| 2017/0089777 A1 | 3/2017 | Obata et al. |
| 2017/0089778 A1 | 3/2017 | Toyoshima et al. |
| 2017/0100974 A1 | 4/2017 | Smith |
| 2017/0101141 A1 | 4/2017 | Booher et al. |
| 2017/0106869 A1 | 4/2017 | Lavoie et al. |
| 2017/0113745 A1 | 4/2017 | Cook et al. |
| 2017/0130768 A1 | 5/2017 | Matsuda et al. |
| 2017/0137002 A1 | 5/2017 | Taneyhill et al. |
| 2017/0144497 A1* | 5/2017 | Guntersweiler ......... B60D 1/62 |
| 2017/0144714 A1 | 5/2017 | Dupay et al. |
| 2017/0151845 A1 | 6/2017 | Allcorn et al. |
| 2017/0151935 A1 | 6/2017 | Prohaszka et al. |
| 2017/0158233 A1 | 6/2017 | Herzog et al. |
| 2017/0174179 A1 | 6/2017 | Schumacher et al. |
| 2017/0174275 A1 | 6/2017 | Mohamad Jembari et al. |
| 2017/0184460 A1 | 6/2017 | Matsuzawa et al. |
| 2017/0188505 A1 | 7/2017 | Potier et al. |
| 2017/0197598 A1 | 7/2017 | Lesher et al. |
| 2017/0211969 A1 | 7/2017 | Waite et al. |
| 2017/0211998 A1 | 7/2017 | Smith et al. |
| 2017/0217411 A1 | 8/2017 | Albright et al. |
| 2017/0218999 A1 | 8/2017 | Brown |
| 2017/0219447 A1 | 8/2017 | Ovaere et al. |
| 2017/0225692 A1 | 8/2017 | Ghannam et al. |
| 2017/0228145 A1 | 8/2017 | Schneider et al. |
| 2017/0231146 A1 | 8/2017 | Romig et al. |
| 2017/0232893 A1 | 8/2017 | Ebner et al. |
| 2017/0240152 A1 | 8/2017 | Strange et al. |
| 2017/0240153 A1 | 8/2017 | Ripley et al. |
| 2017/0241828 A1 | 8/2017 | Reichow et al. |
| 2017/0245417 A1 | 8/2017 | Frascella |
| 2017/0246521 A1 | 8/2017 | deGreef et al. |
| 2017/0253442 A1 | 9/2017 | Kimener et al. |
| 2017/0254694 A1 | 9/2017 | Toigo |
| 2017/0259791 A1 | 9/2017 | Kimener |
| 2017/0262717 A1 | 9/2017 | Drazan et al. |
| 2017/0276163 A1 | 9/2017 | Bernhardt |
| 2017/0282658 A1 | 10/2017 | Shepard |
| 2017/0297391 A1 | 10/2017 | Pilliod |
| 2017/0297490 A1 | 10/2017 | Lynam et al. |
| 2017/0305214 A1 | 10/2017 | Gray |
| 2017/0305215 A1 | 10/2017 | Scheips et al. |
| 2017/0305436 A1 | 10/2017 | Maskell et al. |
| 2017/0313141 A1 | 11/2017 | Casasanta |
| 2017/0314986 A1 | 11/2017 | Dyal |
| 2017/0326929 A1 | 11/2017 | Chmelar et al. |
| 2017/0334255 A1 | 11/2017 | McAllister |
| 2017/0334256 A1 | 11/2017 | Scheips et al. |
| 2017/0341917 A1 | 11/2017 | Adams |
| 2017/0349231 A1 | 12/2017 | Wood |
| 2017/0356818 A1 | 12/2017 | Gouko et al. |
| 2017/0359941 A1 | 12/2017 | Czapka et al. |
| 2017/0360279 A1 | 12/2017 | Gafford et al. |
| 2017/0363490 A1 | 12/2017 | Matsuzawa et al. |
| 2017/0368701 A1 | 12/2017 | Gester et al. |
| 2017/0368747 A1 | 12/2017 | Nolet et al. |

(56) References Cited

U.S. PATENT DOCUMENTS

| | | |
|---|---|---|
| 2017/0368897 A1 | 12/2017 | Brickley et al. |
| 2017/0370764 A1 | 12/2017 | Xu et al. |
| 2017/0370788 A1 | 12/2017 | Neuschaefer-Rube et al. |
| 2018/0000114 A1 | 1/2018 | Grampassi et al. |
| 2018/0001720 A1 | 1/2018 | McAllister |
| 2018/0001721 A1 | 1/2018 | Huger et al. |
| 2018/0001928 A1 | 1/2018 | Lavoie et al. |
| 2018/0003546 A1 | 1/2018 | Mignon et al. |
| 2018/0029155 A1 | 2/2018 | Garza |
| 2018/0029429 A1 | 2/2018 | Janardhana et al. |
| 2018/0037209 A1 | 2/2018 | Hecker et al. |
| 2018/0039266 A1 | 2/2018 | Dotzler et al. |
| 2018/0039278 A1 | 2/2018 | Huger et al. |
| 2019/0039865 A1* | 2/2019 | Verbeek ................ B66D 1/005 |

FOREIGN PATENT DOCUMENTS

| | | | |
|---|---|---|---|
| EP | 523880 | B1 | 11/1994 |
| EP | 610702 | B1 | 5/1995 |
| EP | 675820 | B1 | 10/1995 |
| EP | 694422 | B1 | 1/1996 |
| EP | 699899 | B1 | 3/1996 |
| EP | 700822 | B1 | 3/1996 |
| EP | 737608 | B1 | 10/1996 |
| EP | 697314 | B1 | 3/1997 |
| EP | 773075 | B1 | 10/1997 |
| EP | 798615 | A1 | 10/1997 |
| EP | 823368 | A1 | 2/1998 |
| EP | 625696 | B1 | 3/1998 |
| EP | 695655 | B1 | 4/1998 |
| EP | 667252 | B1 | 5/1998 |
| EP | 760717 | B1 | 5/1998 |
| EP | 730140 | A3 | 8/1998 |
| EP | 765251 | B1 | 9/1998 |
| EP | 816809 | A3 | 10/1998 |
| EP | 602054 | B1 | 12/1998 |
| EP | 595213 | B1 | 1/1999 |
| EP | 740139 | B1 | 1/1999 |
| EP | 625697 | B1 | 3/1999 |
| EP | 919165 | A1 | 6/1999 |
| EP | 693250 | B1 | 9/1999 |
| EP | 824386 | B1 | 9/1999 |
| EP | 728600 | B1 | 10/1999 |
| EP | 925456 | B1 | 12/1999 |
| EP | 650139 | B1 | 1/2000 |
| EP | 832000 | B1 | 2/2000 |
| EP | 679326 | B1 | 3/2000 |
| EP | 861179 | B1 | 3/2000 |
| EP | 983932 | B1 | 3/2000 |
| EP | 985342 | B1 | 3/2000 |
| EP | 712769 | B1 | 4/2000 |
| EP | 739226 | B1 | 4/2000 |
| EP | 644417 | B1 | 5/2000 |
| EP | 688687 | B1 | 5/2000 |
| EP | 985563 | B1 | 5/2000 |
| EP | 1002671 | B1 | 6/2000 |
| EP | 1012595 | A1 | 6/2000 |
| EP | 1002672 | B1 | 8/2000 |
| EP | 713638 | B1 | 10/2000 |
| EP | 960039 | B1 | 10/2000 |
| EP | 1049616 | A1 | 11/2000 |
| EP | 713637 | B1 | 12/2000 |
| EP | 941905 | B1 | 12/2000 |
| EP | 799730 | B1 | 1/2001 |
| EP | 799732 | B1 | 1/2001 |
| EP | 1084870 | B1 | 3/2001 |
| EP | 1084871 | A2 | 3/2001 |
| EP | 1086360 | A1 | 3/2001 |
| EP | 1103172 | B1 | 5/2001 |
| EP | 799731 | B1 | 6/2001 |
| EP | 884570 | B1 | 6/2001 |
| EP | 1106486 | B1 | 6/2001 |
| EP | 823343 | B1 | 7/2001 |
| EP | 1120334 | B1 | 8/2001 |
| EP | 921056 | A3 | 9/2001 |
| EP | 828622 | B1 | 10/2001 |
| EP | 1147973 | A1 | 10/2001 |
| EP | 1150109 | B1 | 10/2001 |
| EP | 881139 | B1 | 11/2001 |
| EP | 918655 | B1 | 11/2001 |
| EP | 950549 | B1 | 11/2001 |
| EP | 1151261 | A1 | 11/2001 |
| EP | 928250 | B1 | 12/2001 |
| EP | 953490 | A3 | 12/2001 |
| EP | 1160105 | A2 | 12/2001 |
| EP | 1162090 | B1 | 12/2001 |
| EP | 843956 | B1 | 1/2002 |
| EP | 1016572 | A3 | 1/2002 |
| EP | 1084872 | B1 | 1/2002 |
| EP | 1165330 | A1 | 1/2002 |
| EP | 1170155 | A2 | 1/2002 |
| EP | 1086835 | B1 | 2/2002 |
| EP | 1177889 | B1 | 2/2002 |
| EP | 900682 | B1 | 4/2002 |
| EP | 1160104 | B1 | 4/2002 |
| EP | 1192068 | A1 | 4/2002 |
| EP | 1195273 | B1 | 4/2002 |
| EP | 1195274 | B1 | 4/2002 |
| EP | 1142732 | B1 | 5/2002 |
| EP | 1182062 | B1 | 5/2002 |
| EP | 1138985 | B1 | 6/2002 |
| EP | 1216856 | B1 | 6/2002 |
| EP | 794110 | B1 | 7/2002 |
| EP | 1153770 | A3 | 7/2002 |
| EP | 1155881 | B1 | 7/2002 |
| EP | 1199547 | A3 | 7/2002 |
| EP | 1117584 | B1 | 8/2002 |
| EP | 1189772 | A4 | 8/2002 |
| EP | 1189772 | B1 | 8/2002 |
| EP | 1225067 | A3 | 8/2002 |
| EP | 1225068 | A3 | 8/2002 |
| EP | 1233895 | A1 | 8/2002 |
| EP | 876929 | B1 | 9/2002 |
| EP | 1040020 | B1 | 9/2002 |
| EP | 1007925 | B1 | 10/2002 |
| EP | 1251025 | B1 | 10/2002 |
| EP | 1253027 | A1 | 10/2002 |
| EP | 1038744 | B1 | 12/2002 |
| EP | 1225069 | B1 | 12/2002 |
| EP | 1279527 | B2 | 1/2003 |
| EP | 1279528 | B1 | 1/2003 |
| EP | 914264 | B1 | 3/2003 |
| EP | 1312492 | A2 | 5/2003 |
| EP | 848805 | B1 | 7/2003 |
| EP | 1245439 | B1 | 7/2003 |
| EP | 968852 | B1 | 8/2003 |
| EP | 991559 | B1 | 9/2003 |
| EP | 1295783 | B1 | 9/2003 |
| EP | 849207 | B1 | 10/2003 |
| EP | 1022164 | B1 | 10/2003 |
| EP | 1163529 | B1 | 10/2003 |
| EP | 1308358 | B1 | 10/2003 |
| EP | 1359085 | B1 | 11/2003 |
| EP | 1359321 | A1 | 11/2003 |
| EP | 1249365 | B1 | 1/2004 |
| EP | 1099575 | B1 | 2/2004 |
| EP | 1389541 | A1 | 2/2004 |
| EP | 1326772 | B1 | 3/2004 |
| EP | 1405738 | A1 | 4/2004 |
| EP | 1011994 | B1 | 5/2004 |
| EP | 1418843 | A1 | 5/2004 |
| EP | 1422366 | B1 | 5/2004 |
| EP | 1447246 | B1 | 8/2004 |
| EP | 1448431 | A2 | 8/2004 |
| EP | 1448952 | B1 | 8/2004 |
| EP | 1449115 | A2 | 8/2004 |
| EP | 1450658 | A1 | 9/2004 |
| EP | 1451058 | B1 | 9/2004 |
| EP | 1456043 | A1 | 9/2004 |
| EP | 1116431 | B1 | 10/2004 |
| EP | 1289781 | B1 | 10/2004 |
| EP | 1468899 | B1 | 10/2004 |
| EP | 1471339 | A2 | 10/2004 |
| EP | 1350683 | B1 | 11/2004 |

(56) References Cited

FOREIGN PATENT DOCUMENTS

| | | | |
|---|---|---|---|
| EP | 1476736 | A1 | 11/2004 |
| EP | 1116013 | B1 | 12/2004 |
| EP | 1129606 | B1 | 12/2004 |
| EP | 1455207 | B1 | 12/2004 |
| EP | 1485285 | A2 | 12/2004 |
| EP | 1486375 | B1 | 12/2004 |
| EP | 1499517 | B1 | 1/2005 |
| EP | 1254036 | B1 | 2/2005 |
| EP | 1400423 | B1 | 3/2005 |
| EP | 1171717 | B1 | 4/2005 |
| EP | 1288026 | B1 | 4/2005 |
| EP | 1486400 | A3 | 4/2005 |
| EP | 1093419 | B1 | 7/2005 |
| EP | 1347676 | B1 | 7/2005 |
| EP | 1375279 | B1 | 8/2005 |
| EP | 1562809 | A1 | 8/2005 |
| EP | 1334847 | B1 | 9/2005 |
| EP | 1580043 | A1 | 9/2005 |
| EP | 1301362 | B1 | 12/2005 |
| EP | 1380444 | B1 | 12/2005 |
| EP | 1499510 | B1 | 12/2005 |
| EP | 1604179 | B1 | 12/2005 |
| EP | 961722 | B1 | 1/2006 |
| EP | 1227945 | B1 | 1/2006 |
| EP | 1400379 | B1 | 2/2006 |
| EP | 1403102 | B1 | 2/2006 |
| EP | 1462280 | B1 | 2/2006 |
| EP | 1627803 | A1 | 2/2006 |
| EP | 1320734 | B1 | 3/2006 |
| EP | 1396417 | B1 | 3/2006 |
| EP | 1633599 | A1 | 3/2006 |
| EP | 1351340 | B1 | 4/2006 |
| EP | 1386761 | B1 | 4/2006 |
| EP | 1535765 | B1 | 4/2006 |
| EP | 1650095 | A1 | 4/2006 |
| EP | 1029440 | B1 | 6/2006 |
| EP | 1238577 | B1 | 6/2006 |
| EP | 1673274 | A1 | 6/2006 |
| EP | 1186510 | B1 | 7/2006 |
| EP | 1318066 | B1 | 7/2006 |
| EP | 1683696 | A2 | 7/2006 |
| EP | 1541385 | B1 | 8/2006 |
| EP | 1687158 | A2 | 8/2006 |
| EP | 1688727 | A1 | 8/2006 |
| EP | 1688728 | A1 | 8/2006 |
| EP | 1691996 | A1 | 8/2006 |
| EP | 1111353 | B1 | 9/2006 |
| EP | 1200276 | B1 | 9/2006 |
| EP | 1697207 | A1 | 9/2006 |
| EP | 1107894 | B1 | 10/2006 |
| EP | 1709419 | A2 | 10/2006 |
| EP | 1710129 | B1 | 10/2006 |
| EP | 1713609 | A1 | 10/2006 |
| EP | 1597098 | B1 | 11/2006 |
| EP | 1717134 | B1 | 11/2006 |
| EP | 1735168 | A2 | 12/2006 |
| EP | 1205097 | B1 | 1/2007 |
| EP | 1609344 | B1 | 1/2007 |
| EP | 1749193 | A1 | 2/2007 |
| EP | 1750108 | A1 | 2/2007 |
| EP | 1422124 | B1 | 3/2007 |
| EP | 1593552 | B1 | 3/2007 |
| EP | 1574399 | B1 | 4/2007 |
| EP | 1495883 | B1 | 5/2007 |
| EP | 1788363 | B1 | 5/2007 |
| EP | 1788364 | B1 | 5/2007 |
| EP | 1799540 | B1 | 6/2007 |
| EP | 1813513 | B1 | 8/2007 |
| EP | 1820708 | B1 | 8/2007 |
| EP | 1293363 | B1 | 9/2007 |
| EP | 1836063 | A1 | 9/2007 |
| EP | 1848599 | B1 | 10/2007 |
| EP | 1358453 | B1 | 11/2007 |
| EP | 1734355 | B1 | 11/2007 |
| EP | 1862050 | B1 | 12/2007 |
| EP | 1867499 | A1 | 12/2007 |
| EP | 1336824 | B1 | 1/2008 |
| EP | 1634729 | B2 | 1/2008 |
| EP | 1778507 | B1 | 1/2008 |
| EP | 1877268 | A1 | 1/2008 |
| EP | 1713649 | B9 | 2/2008 |
| EP | 1891344 | A2 | 2/2008 |
| EP | 1557299 | B1 | 3/2008 |
| EP | 1559592 | B1 | 3/2008 |
| EP | 1900552 | A2 | 3/2008 |
| EP | 1900609 | A2 | 3/2008 |
| EP | 1900610 | B1 | 3/2008 |
| EP | 1902917 | A2 | 3/2008 |
| EP | 1475253 | B1 | 4/2008 |
| EP | 1598249 | B1 | 4/2008 |
| EP | 1609345 | B1 | 4/2008 |
| EP | 1740400 | B1 | 4/2008 |
| EP | 1904351 | B1 | 4/2008 |
| EP | 1904357 | A2 | 4/2008 |
| EP | 1607248 | B1 | 5/2008 |
| EP | 1921432 | A1 | 5/2008 |
| EP | 1924451 | A1 | 5/2008 |
| EP | 1847448 | A3 | 6/2008 |
| EP | 1826033 | B1 | 7/2008 |
| EP | 1918137 | B1 | 7/2008 |
| EP | 1942037 | B2 | 7/2008 |
| EP | 1943138 | B1 | 7/2008 |
| EP | 1944224 | A1 | 7/2008 |
| EP | 1949822 | A1 | 7/2008 |
| EP | 1454808 | B2 | 9/2008 |
| EP | 1968846 | B1 | 9/2008 |
| EP | 1998965 | A1 | 12/2008 |
| EP | 2008892 | B1 | 12/2008 |
| EP | 2018981 | A1 | 1/2009 |
| EP | 1425209 | B1 | 2/2009 |
| EP | 1549124 | B1 | 2/2009 |
| EP | 1584499 | B1 | 2/2009 |
| EP | 2022654 | B1 | 2/2009 |
| EP | 2023111 | A2 | 2/2009 |
| EP | 2025536 | A1 | 2/2009 |
| EP | 2032417 | A2 | 3/2009 |
| EP | 1710100 | B1 | 5/2009 |
| EP | 1769949 | B1 | 5/2009 |
| EP | 1802516 | B1 | 5/2009 |
| EP | 2057444 | A2 | 5/2009 |
| EP | 2058151 | A1 | 5/2009 |
| EP | 2059400 | A1 | 5/2009 |
| EP | 2059400 | B1 | 5/2009 |
| EP | 2060892 | A1 | 5/2009 |
| EP | 1623913 | B1 | 7/2009 |
| EP | 2075562 | A2 | 7/2009 |
| EP | 1910152 | B1 | 8/2009 |
| EP | 2088062 | B1 | 8/2009 |
| EP | 2090481 | B1 | 8/2009 |
| EP | 2090874 | A1 | 8/2009 |
| EP | 2091807 | B1 | 8/2009 |
| EP | 1757466 | B1 | 10/2009 |
| EP | 1834852 | B1 | 10/2009 |
| EP | 1861306 | B1 | 10/2009 |
| EP | 2108553 | B1 | 10/2009 |
| EP | 1812278 | B1 | 11/2009 |
| EP | 1902870 | B1 | 11/2009 |
| EP | 2116400 | A1 | 11/2009 |
| EP | 2119927 | A1 | 11/2009 |
| EP | 1886847 | B1 | 12/2009 |
| EP | 1905617 | B1 | 12/2009 |
| EP | 1948498 | B1 | 12/2009 |
| EP | 1278656 | B1 | 1/2010 |
| EP | 2141472 | A1 | 1/2010 |
| EP | 1107893 | B1 | 2/2010 |
| EP | 1912852 | B1 | 2/2010 |
| EP | 1987967 | B1 | 2/2010 |
| EP | 2079627 | B3 | 2/2010 |
| EP | 2149476 | A2 | 2/2010 |
| EP | 2155507 | B1 | 2/2010 |
| EP | 1702812 | B1 | 3/2010 |
| EP | 1787872 | B1 | 3/2010 |
| EP | 2164638 | A1 | 3/2010 |
| EP | 2164733 | A2 | 3/2010 |

(56) References Cited

FOREIGN PATENT DOCUMENTS

| | | | |
|---|---|---|---|
| EP | 1886845 | B1 | 4/2010 |
| EP | 1917161 | B9 | 4/2010 |
| EP | 1917188 | B1 | 4/2010 |
| EP | 1932411 | B1 | 4/2010 |
| EP | 2176632 | A1 | 4/2010 |
| EP | 1927485 | B1 | 5/2010 |
| EP | 2181002 | A1 | 5/2010 |
| EP | 2184182 | B1 | 5/2010 |
| EP | 1561610 | B1 | 6/2010 |
| EP | 1810561 | B1 | 6/2010 |
| EP | 1812261 | B1 | 6/2010 |
| EP | 1933121 | A3 | 6/2010 |
| EP | 1970224 | B1 | 6/2010 |
| EP | 2118616 | B1 | 6/2010 |
| EP | 2199166 | A1 | 6/2010 |
| EP | 2208034 | A1 | 7/2010 |
| EP | 2210002 | B1 | 7/2010 |
| EP | 1210257 | B1 | 8/2010 |
| EP | 1298026 | B1 | 8/2010 |
| EP | 1821090 | A3 | 8/2010 |
| EP | 1995085 | B1 | 8/2010 |
| EP | 1612081 | B1 | 9/2010 |
| EP | 1784326 | B1 | 9/2010 |
| EP | 1916127 | B1 | 9/2010 |
| EP | 2042352 | B1 | 9/2010 |
| EP | 2090500 | B1 | 9/2010 |
| EP | 2129561 | B1 | 9/2010 |
| EP | 2240796 | A1 | 10/2010 |
| EP | 2243883 | A2 | 10/2010 |
| EP | 2253529 | B1 | 11/2010 |
| EP | 1638792 | B1 | 12/2010 |
| EP | 2258586 | A1 | 12/2010 |
| EP | 2260278 | A2 | 12/2010 |
| EP | 2261066 | B1 | 12/2010 |
| EP | 1562811 | B1 | 1/2011 |
| EP | 1913804 | B1 | 1/2011 |
| EP | 2100757 | B1 | 1/2011 |
| EP | 2277724 | B1 | 1/2011 |
| EP | 2280263 | A2 | 2/2011 |
| EP | 1530521 | B1 | 3/2011 |
| EP | 2289776 | B1 | 3/2011 |
| EP | 2301322 | B1 | 3/2011 |
| EP | 1818245 | B1 | 4/2011 |
| EP | 2151373 | B1 | 4/2011 |
| EP | 2311673 | B1 | 4/2011 |
| EP | 2093134 | B1 | 5/2011 |
| EP | 2110272 | B1 | 5/2011 |
| EP | 2189307 | B1 | 5/2011 |
| EP | 1472122 | B1 | 6/2011 |
| EP | 1896317 | B1 | 6/2011 |
| EP | 1676763 | B1 | 7/2011 |
| EP | 1792791 | B1 | 7/2011 |
| EP | 1919745 | B1 | 7/2011 |
| EP | 2021227 | B1 | 7/2011 |
| EP | 2164734 | B1 | 7/2011 |
| EP | 2110271 | B1 | 8/2011 |
| EP | 2222487 | B1 | 8/2011 |
| EP | 2349777 | B1 | 8/2011 |
| EP | 2356471 | A1 | 8/2011 |
| EP | 2103458 | B1 | 9/2011 |
| EP | 2165901 | B1 | 9/2011 |
| EP | 2291646 | B1 | 9/2011 |
| EP | 2363307 | B1 | 9/2011 |
| EP | 2373532 | A1 | 10/2011 |
| EP | 1849013 | B1 | 11/2011 |
| EP | 2138333 | B1 | 11/2011 |
| EP | 2384941 | A1 | 11/2011 |
| EP | 2099626 | B1 | 12/2011 |
| EP | 2223831 | B1 | 12/2011 |
| EP | 2394890 | A1 | 12/2011 |
| EP | 2300289 | B1 | 1/2012 |
| EP | 2401182 | A1 | 1/2012 |
| EP | 2404800 | A2 | 1/2012 |
| EP | 2405263 | B1 | 1/2012 |
| EP | 2141034 | B1 | 2/2012 |
| EP | 2417007 | B1 | 2/2012 |
| EP | 2417008 | A1 | 2/2012 |
| EP | 2432672 | A2 | 3/2012 |
| EP | 1557300 | B1 | 4/2012 |
| EP | 1902289 | B1 | 4/2012 |
| EP | 2436540 | A1 | 4/2012 |
| EP | 2439504 | A2 | 4/2012 |
| EP | 2447118 | A1 | 5/2012 |
| EP | 2450248 | A1 | 5/2012 |
| EP | 2289773 | B1 | 6/2012 |
| EP | 2274967 | B1 | 7/2012 |
| EP | 2316714 | B1 | 8/2012 |
| EP | 2480442 | A1 | 8/2012 |
| EP | 2492173 | B1 | 8/2012 |
| EP | 2289717 | B1 | 9/2012 |
| EP | 2493732 | A1 | 9/2012 |
| EP | 2503062 | A2 | 9/2012 |
| EP | 2303649 | B1 | 10/2012 |
| EP | 2511110 | A1 | 10/2012 |
| EP | 2092815 | B1 | 11/2012 |
| EP | 2335952 | B1 | 11/2012 |
| EP | 2520447 | A1 | 11/2012 |
| EP | 2368726 | B1 | 1/2013 |
| EP | 2542463 | B1 | 1/2013 |
| EP | 2542871 | A1 | 1/2013 |
| EP | 2543776 | B1 | 1/2013 |
| EP | 2163446 | B1 | 2/2013 |
| EP | 2344386 | B1 | 2/2013 |
| EP | 2556973 | A1 | 2/2013 |
| EP | 2570312 | A1 | 3/2013 |
| EP | 1606984 | B1 | 4/2013 |
| EP | 2576297 | B1 | 4/2013 |
| EP | 2584331 | A1 | 4/2013 |
| EP | 2370308 | A1 | 5/2013 |
| EP | 2502763 | B1 | 5/2013 |
| EP | 2588852 | A1 | 5/2013 |
| EP | 2266820 | B1 | 6/2013 |
| EP | 2607159 | A1 | 6/2013 |
| EP | 2607873 | A2 | 6/2013 |
| EP | 2132539 | B1 | 8/2013 |
| EP | 2268528 | B9 | 8/2013 |
| EP | 2433482 | B1 | 8/2013 |
| EP | 2626678 | A2 | 8/2013 |
| EP | 2340699 | B1 | 9/2013 |
| EP | 2366564 | B1 | 9/2013 |
| EP | 2540530 | B1 | 9/2013 |
| EP | 2540531 | B1 | 9/2013 |
| EP | 2634073 | B1 | 9/2013 |
| EP | 2654394 | A1 | 10/2013 |
| EP | 2683164 | B1 | 1/2014 |
| EP | 2295268 | B1 | 3/2014 |
| EP | 2708386 | B1 | 3/2014 |
| EP | 2708865 | A1 | 3/2014 |
| EP | 2711207 | A2 | 3/2014 |
| EP | 2055542 | B1 | 4/2014 |
| EP | 2722204 | A1 | 4/2014 |
| EP | 2722215 | A2 | 4/2014 |
| EP | 2729333 | A1 | 5/2014 |
| EP | 2729778 | A2 | 5/2014 |
| EP | 2730903 | A2 | 5/2014 |
| EP | 2734027 | A1 | 5/2014 |
| EP | 1024036 | B1 | 6/2014 |
| EP | 2343201 | B1 | 6/2014 |
| EP | 2602132 | B1 | 6/2014 |
| EP | 2316669 | B1 | 7/2014 |
| EP | 2417009 | B1 | 7/2014 |
| EP | 2608186 | A3 | 7/2014 |
| EP | 2751536 | | 7/2014 |
| EP | 2752650 | A1 | 7/2014 |
| EP | 2717239 | A3 | 8/2014 |
| EP | 2717240 | A3 | 8/2014 |
| EP | 2761708 | A1 | 8/2014 |
| EP | 2767417 | A2 | 8/2014 |
| EP | 2767418 | A1 | 8/2014 |
| EP | 2589504 | B1 | 9/2014 |
| EP | 2594534 | B1 | 9/2014 |
| EP | 2772739 | A1 | 9/2014 |
| EP | 2776258 | A1 | 9/2014 |
| EP | 2781378 | A1 | 9/2014 |

(56) References Cited

FOREIGN PATENT DOCUMENTS

| | | |
|---|---|---|
| EP | 2635447 B1 | 10/2014 |
| EP | 2788749 A1 | 10/2014 |
| EP | 2793009 A1 | 10/2014 |
| EP | 2533942 B1 | 11/2014 |
| EP | 2801488 A1 | 11/2014 |
| EP | 2817180 A1 | 12/2014 |
| EP | 2817187 A1 | 12/2014 |
| EP | 2817600 A1 | 12/2014 |
| EP | 2819858 A1 | 1/2015 |
| EP | 2390145 B1 | 2/2015 |
| EP | 2838742 A1 | 2/2015 |
| EP | 2848480 B1 | 3/2015 |
| EP | 2848502 B1 | 3/2015 |
| EP | 2415620 B1 | 4/2015 |
| EP | 2856099 A1 | 4/2015 |
| EP | 2452839 B1 | 5/2015 |
| EP | 2497658 B1 | 5/2015 |
| EP | 2608971 B1 | 5/2015 |
| EP | 2870446 A1 | 5/2015 |
| EP | 2874855 A1 | 5/2015 |
| EP | 2417306 B1 | 6/2015 |
| EP | 2548764 B1 | 6/2015 |
| EP | 2851667 A3 | 6/2015 |
| EP | 2269880 B1 | 7/2015 |
| EP | 2606653 B1 | 7/2015 |
| EP | 2889592 A1 | 7/2015 |
| EP | 2890956 A1 | 7/2015 |
| EP | 2891586 B1 | 7/2015 |
| EP | 2892738 A1 | 7/2015 |
| EP | 2899101 A1 | 7/2015 |
| EP | 2651678 B1 | 8/2015 |
| EP | 2905155 A1 | 8/2015 |
| EP | 2907710 A1 | 8/2015 |
| EP | 2521665 B1 | 9/2015 |
| EP | 2918469 A1 | 9/2015 |
| EP | 2636546 B1 | 10/2015 |
| EP | 2865585 B1 | 10/2015 |
| EP | 2934962 A1 | 10/2015 |
| EP | 2934964 A1 | 10/2015 |
| EP | 2362201 B1 | 2/2016 |
| EP | 2984914 A1 | 2/2016 |
| EP | 2984915 A1 | 2/2016 |
| EP | 2511109 B1 | 3/2016 |
| EP | 2988958 A1 | 3/2016 |
| EP | 2988973 A1 | 3/2016 |
| EP | 2988983 A1 | 3/2016 |
| EP | 2993373 A1 | 3/2016 |
| EP | 2994355 A1 | 3/2016 |
| EP | 2997429 A1 | 3/2016 |
| EP | 2602134 B1 | 4/2016 |
| EP | 3003802 A1 | 4/2016 |
| EP | 3007917 A1 | 4/2016 |
| EP | 3009923 A1 | 4/2016 |
| EP | 2139732 A1 | 5/2016 |
| EP | 2676820 B1 | 5/2016 |
| EP | 2839173 B1 | 5/2016 |
| EP | 2523837 B1 | 6/2016 |
| EP | 2558338 B1 | 6/2016 |
| EP | 2714436 B1 | 6/2016 |
| EP | 2727752 B1 | 6/2016 |
| EP | 2758258 B1 | 6/2016 |
| EP | 3028882 A2 | 6/2016 |
| EP | 3034373 A1 | 6/2016 |
| EP | 3036148 A1 | 6/2016 |
| EP | 3036986 A1 | 6/2016 |
| EP | 3040235 A1 | 7/2016 |
| EP | 3046805 A1 | 7/2016 |
| EP | 3060894 A1 | 8/2016 |
| EP | 2906923 B1 | 9/2016 |
| EP | 3000671 B1 | 9/2016 |
| EP | 3068640 A1 | 9/2016 |
| EP | 3072710 A1 | 9/2016 |
| EP | 2714437 B1 | 10/2016 |
| EP | 2893793 B1 | 10/2016 |
| EP | 3078513 A1 | 10/2016 |
| EP | 3078515 A1 | 10/2016 |
| EP | 3081405 A2 | 10/2016 |
| EP | 3084379 B1 | 10/2016 |
| EP | 3085217 A1 | 10/2016 |
| EP | 2594455 B1 | 11/2016 |
| EP | 2931569 B1 | 11/2016 |
| EP | 3098111 A1 | 11/2016 |
| EP | 2326540 B1 | 12/2016 |
| EP | 2602133 B1 | 12/2016 |
| EP | 3099545 A1 | 12/2016 |
| EP | 2272692 B1 | 1/2017 |
| EP | 3110636 A1 | 1/2017 |
| EP | 3122618 A1 | 2/2017 |
| EP | 3123697 A1 | 2/2017 |
| EP | 3128299 A1 | 2/2017 |
| EP | 3128759 A1 | 2/2017 |
| EP | 3133381 A1 | 2/2017 |
| EP | 3012180 B1 | 3/2017 |
| EP | 3134281 A2 | 3/2017 |
| EP | 2197718 B1 | 4/2017 |
| EP | 2664506 B1 | 4/2017 |
| EP | 2946647 B1 | 4/2017 |
| EP | 3152090 A1 | 4/2017 |
| EP | 3155886 A1 | 4/2017 |
| EP | 2928734 B1 | 5/2017 |
| EP | 3162666 A1 | 5/2017 |
| EP | 3163274 A1 | 5/2017 |
| EP | 3164325 A1 | 5/2017 |
| EP | 3164686 A1 | 5/2017 |
| EP | 3165974 A1 | 5/2017 |
| EP | 3166825 A1 | 5/2017 |
| EP | 2589503 B1 | 6/2017 |
| EP | 3177515 A1 | 6/2017 |
| EP | 3180217 A1 | 6/2017 |
| EP | 2987694 B1 | 7/2017 |
| EP | 3188480 A1 | 7/2017 |
| EP | 2535212 B1 | 8/2017 |
| EP | 2893527 B1 | 8/2017 |
| EP | 2893792 B1 | 8/2017 |
| EP | 2918452 B1 | 8/2017 |
| EP | 2981796 B1 | 8/2017 |
| EP | 3008985 B1 | 8/2017 |
| EP | 3197692 A1 | 8/2017 |
| EP | 3201586 A1 | 8/2017 |
| EP | 3204275 A1 | 8/2017 |
| EP | 3209509 A1 | 8/2017 |
| EP | 2729401 B1 | 9/2017 |
| EP | 3114440 A4 | 9/2017 |
| EP | 3222129 A1 | 9/2017 |
| EP | 2546627 A3 | 10/2017 |
| EP | 2573041 B1 | 10/2017 |
| EP | 2803618 B1 | 10/2017 |
| EP | 3227130 A1 | 10/2017 |
| EP | 2648950 B1 | 11/2017 |
| EP | 3239009 A1 | 11/2017 |
| EP | 3246685 A1 | 11/2017 |
| EP | 3249368 A1 | 11/2017 |
| EP | 3255214 A1 | 12/2017 |
| EP | 3260832 A1 | 12/2017 |
| EP | 2718094 B1 | 1/2018 |
| EP | 3065957 B1 | 1/2018 |
| EP | 3261890 A2 | 1/2018 |
| EP | 3265330 A2 | 1/2018 |
| WO | WO-2018/019859 A1 | 2/2018 |

OTHER PUBLICATIONS

Office Action, U.S. Appl. No. 16/523,418, dated Sep. 30, 3019, 20 pages.
The European Search Report dated Dec. 7, 2018.
International Search Report for PCT/US2019/019820 dated May 8, 2019 (2 pgs.).
K. Kasten et al., "iBolt Technology—A Weight Sensing System for Advanced Passenger Safety"; Advanced Microsystems for Automotive Applications 2006; pp. 171-186 (2006).

* cited by examiner $F_x = F_1 + F_2$

PIN1
Fz [Fz CHANNEL LEFT + Fz CHANNEL RIGHT INTERNAL]
PIN2
NONE

PIN1
Fx [Fx CHANNEL LEFT + Fx CHANNEL RIGHT INTERNAL]
Fz [Fz CHANNEL LEFT + Fz CHANNEL RIGHT INTERNAL]
PIN2
Fz [Fz CHANNEL LEFT + Fz CHANNEL RIGHT INTERNAL]

TOWING SYSTEMS AND METHODS USING MAGNETIC FIELD SENSING

CROSS-REFERENCE TO RELATED APPLICATIONS

This nonprovisional patent application is based on and claims the benefit of the respective filing dates and disclosures of U.S. Provisional Application No. 62/635,848, filed on Feb. 27, 2018, entitled "Magneto-elastic Based Sensor Assembly and Method"; U.S. Provisional Application No. 62/635,869, filed on Feb. 27, 2018, entitled "Tow Hitches With Magneto-elastic Sensing Devices and Methods"; U.S. Provisional Application No. 62/635,890, filed on Feb. 27, 2018, entitled "Towing System With Hitch Forces Sensing Method"; and U.S. Provisional Application No. 62/677,378, filed on May 29, 2018, entitled "Towing System Using Magnetic Field Sensing Method," the contents of each of which are incorporated herein.

BACKGROUND OF THE INVENTION

Field of Invention

The invention is related in general to systems and methods involving the use of magnetic field sensors and magneto-elastic devices for measuring a load and outputting a signal indicative of a load force dynamically applied to an object. The invention is also related to use of the force-sensing apparatus in connection with a vehicle-trailer hitch or tow coupling. The invention is also related to methods for determining a direction and magnitude of the force vector on the hitch or a particular hitch component.

Description of Related Art

Tow coupling devices are popular accessories for owners of passenger automobiles (cars and trucks) who tow trailers. These coupling devices may be purchased and installed in a new automobile, or purchased in the aftermarket and installed by owners after acquiring an automobile. The automotive and tow hitch industries classify trailer hitches according to various criteria. In one aspect, hitches are classified in one of Class 1-5. Each class of hitch includes associated real-world standards such as minimum force load requirements, including at least longitudinal tension, longitudinal compression, transverse thrust, vertical tension, and vertical compression.

In many trailer hitch use cases, strain gauges are used for sensing a force load on a hitch. Strain gauges, however, often require a structural weakening of the load-conducting elements. There is a need for load measurements without compromising the structural stability of the measuring device. This is especially true for tow couplings.

Furthermore, there is a strong demand for smart tow couplings, e.g., for systems providing at least the following: a load weight gauge (measuring the tongue load of a tow coupling), a tow load weight shift alert, an unsafe trailer load distribution alert, a vehicle limit notification, an automated trailer brake control (closed loop), a low/flat trailer tire notification, a check trailer brake notification, a closed loop braking control, a vehicle shift control, an engine control, and a stability control. These and other functions require the measurement of tow loads and/or tongue loads at the tow coupling.

Prior art load measurement devices for tow couplings have significant shortcomings, e.g. the complexity of the measurement and control devices, and the costs of the sensor assembly. Thus, there is a need for a tow coupling apparatus that may be purchased and installed in an automobile that provides the above functions without weakening over time.

BRIEF SUMMARY OF THE INVENTION

In one aspect of the invention, an improved magneto-elastic based sensor assembly is provided to effectively measure stress and strain in systems having a portion, which is subject to a mechanic load. The invention also provides a method of determining a direction of a load vector acting on a magneto-elastic based sensor assembly.

In one aspect of the invention, a tow hitch assembly includes a hitch tube, a first part, a second part, a receiver tube, and first and second load sensor pins 8, 9 connecting the first and second parts. The hitch tube is typically a longitudinally extending, round, oval, square, or other shape member for attaching to a vehicle, typically near the rear bumper of a passenger vehicle. Bolts or other fastening means may be used to attach the hitch tube to the vehicle.

The first part of the tow hitch assembly may be a bracket with two side flange portions having through-holes: first and second through-holes on one flange, and third and fourth through-holes on the other, such that the first and third through-holes are axially aligned with each other and the second and fourth through-holes are also axially aligned with each other.

The second part may include a receiver tube connected to a longitudinally extending middle adapter member that fits between the two flanges of the bracket when the hitch components are in an assembled state. In one aspect, the adapter may be configured to include a front portion that would be positioned in front of the hitch tube, and a back portion that would be positioned in back of the hitch tube, the front and the back portions each having a through-hole axially aligned with the through-holes on the bracket when the first and second parts are in an assembled state. In another aspect, the entirety of the adapter could be in front of the hitch tube, or behind the hitch tube, or in some other configuration.

In another aspect, the first and second load sensor pins 8, 9 are configured to sense forces applied to the receiver tube and other components of the hitch assembly. One of the two load sensor pins 8, 9 extends through the first and third through-holes of the bracket and one of the through-holes of the adapter, and the other pin extends through the second and fourth through-holes of the bracket and a different through-hole of the adapter to secure the first and second parts together.

In another aspect, there is a gap of about 0.5 mm between the top of the middle adapter member and the base portion of the bracket, and the thickness of the base portion of the bracket in the configuration shown is 8 mm. Alternatively, the thickness of the base portion of the bracket is about 10 mm, and the gap is about 5 mm between the top of the middle adapter member and the base portion of the bracket. Press-fit bushings could be used, having a pre-determined radial thickness inserted into the axially-aligned through-holes of the bracket.

In another aspect, during use of the assembled tow hitch, a force is applied to the proximate end of a drawbar and transmitted to the front pin. The output signals from magnetic field sensors associated with the front pin may be received in a suitable software algorithm, for example one that is embedded on a circuit board having a suitable processor located inside the front pin. The receive output signals from the sensors, which may be indicative of the magnetic field/flux exhibited by the front pin magneto-elastic active regions, may be used to determine the forces.

In U.S. Pat. No. 9,347,845, owned by Methode Electronics, which is incorporated herein by reference in its entirety, a magneto-elastic sensor having a longitudinally extending shaft like member with at least one magneto-elastically active region and a magnetic field sensor device is described. The longitudinally extending shaft like member is subject to a load introducing mechanic stress in the member. The at least one magneto-elastically active region is directly or indirectly attached to the shaft like member. However, the at least one magneto-elastically active region may also form a part of the member. The magneto-elastically active region is arranged in such a manner that the mechanic stress is transmitted to the active region. The region includes at least one magnetically polarized region such that the magnetic polarization becomes increasingly helically shaped as the applied stress increases. The magnetic field sensor means or device is arranged proximate the at least one magneto-elastically active region. The magnetic field sensor means/device is further configured for outputting a signal corresponding to a stress-induced magnetic flux, which emanates from the magnetically polarized region. The sensor may be a magnetic sensor device with at least one direction sensitive magnetic field sensor. This direction sensitive magnetic field sensor is configured for determination of a shear stress and/or of a tensile or compressive stress. In particular, the direction sensitive magnetic field sensor is arranged to have a predetermined and fixed spatial coordination with the member.

One object of the invention described herein, which is also described in EP17162429.9, owned by Methode Electronics and incorporated herein by reference in its entirety, is a sensor assembly for force sensing, the force sensor being associated with a vehicle hitch assembly. The improved magneto-elastic based sensor assembly is useful for effectively measuring stress and strain in systems having a portion, which is subject to a mechanic load. The invention provides a method of determining a direction of a load vector acting on a magneto-elastic based sensor assembly.

According to an aspect of the invention, a sensor assembly for force sensing can include a first portion having a first and a second through-hole. The sensor assembly can further include a second portion having a third and a fourth through-hole. The third and the fourth through-hole can be positioned in correspondence to the first and the second through-holes.

The sensor assembly can further include a first pin and a second pin. The first pin can be arranged such that it extends through the first and the third through-hole and the second pin can be arranged such that it extends through the second and the fourth through-hole, so as to couple the first portion to the second portion. At least one out of the first and the second pin can include at least one magneto-elastically active region that may directly or indirectly be attached to or form a part of the pin in such a manner that mechanic stress on the pin is transmitted to the magneto-elastically active region. The magneto-elastically active region can include at least one magnetically polarized region such that a polarization of the magnetically polarized region may become increasingly helically shaped as the applied stress increases.

The sensor assembly can further include a magnetic field sensor means or device which may be arranged proximate the at least one magneto-elastically active region. The magnetic field sensor means/device may be configured to output a signal corresponding to a stress-induced magnetic flux which may emanate from the magnetically polarized region.

The magnetic field sensor means/device may comprise at least one direction sensitive magnetic field sensor which may be configured to determine a shear force in at least one direction. The at least one direction sensitive magnetic field sensor may in particular be arranged to have a predetermined and fixed spatial coordination with the pin, wherein this pin may at least be partially hollow. The at least one direction sensitive magnetic field sensor may be arranged inside an interior of this pin.

By means of the sensor assembly, stress which is applied to a pin caused by a mechanic load can effectively be measured. The sensor assembly according to aspects of the invention thus described overcomes the drawback of the prior art solutions. In particular, the sensor assembly does not tend to drift with respect to the measurement values and is less error-prone.

According to another aspect of the invention, at least one out of the first and the second pin of the sensor assembly can comprise at least one X-direction sensitive magnetic field sensor, which can be configured to detect a force component Fx1 in a longitudinal direction X, and/or at least one Z-direction sensitive magnetic field sensor, which can be configured to detect a force component Fz1 in a vertical direction Z. The longitudinal direction X can be defined by a direction of longitudinal extension of the second portion. The vertical direction Z can be substantially perpendicular to the longitudinal direction X and substantially perpendicular to the transversal direction Y of longitudinal extension of the at least one pin.

According to another aspect of the invention, the first through-hole and the third through-hole of the sensor assembly can be configured such that they encompass the first pin in a positive-fitting manner. A positive-fitting manner of the fitting allows the pin to be substantially rigidly fixed to the first portion and the second portion by the first and the third through-hole. This means that the pin has almost no play inside the first and third through-hole and that the accuracy of the force measurement is advantageously increased compared to a configuration in which the first pin has play inside the first and the third through-hole.

According to another aspect of the invention, the first pin may be cryogenically treated, such as by subjecting the entire first pin to liquefied nitrogen, thereby causing a reduction in the cross-section dimension of the pin. After super-cooling the first pin, it may be positioned in the first and third through-holes and allowed to return to ambient temperature. As the material in the pin warms up to ambient temperature, the cross-section dimension will increase until the first pin is substantially rigidly fixed in the first and third through-holes.

According to another aspect, the second pin of the sensor assembly may be encompassed by the second through-hole in a positive-fitting manner and the fourth through-hole may be configured such that the second pin may have one additional degree of freedom of movement within the fourth through-hole. The additional degree of freedom of movement allows the second pin to be insensitive with respect to shear forces acting in the direction of the additional degree of freedom of movement. This means that the determination of the shear force along this direction can advantageously be simplified since the shear effect occurs exclusively on the first pin.

According to another aspect, the second pin, like the first pin, may be cryogenically treated, such as by subjecting the entire first pin to liquefied nitrogen, thereby causing a reduction in the cross-section dimension of the pin. After super-cooling the second pin, it may be positioned in the second and fourth through-holes and allowed to return to ambient temperature. As the material in the second pin warms up to ambient temperature, the cross-section dimension will increase until the second pin is substantially rigidly fixed in the second and fourth through-holes with the additional degree of freedom of movement noted above.

According to another aspect, the additional degree of freedom of movement may extend in the longitudinal direction X. Since the additional degree of freedom of movement corresponds to the longitudinal direction X, the determination of the shear force along this direction can advantageously be simplified.

According to another aspect, the first and/or the second pin of the sensor assembly can include a first magneto-elastically active region and a second magneto-elastically active region. The first and the second magneto-elastically active regions may be directly or indirectly attached to or form parts of the pin in such a manner that mechanic stress may be transmitted to the magneto-elastically active regions. Each magneto-elastically active region can include a magnetically polarized region. Particularly, the magnetic polarization of the first magneto-elastically active region and the magnetic polarization of the second magneto-elastically active region may be substantially opposite to each other. The magnetic field sensor means/device can include at least one first direction sensitive magnetic field sensor which may be arranged approximate the first magneto-elastically active region. The magnetic field sensor means/device may be configured to output a first signal corresponding to a stress-induced magnetic flux which may emanate from the first magneto-elastically active region. The magnetic field sensor means/device may include at least one second direction sensitive magnetic field sensor which may be arranged approximate the second magneto-elastically active region. The magnetic field sensor means/device may be configured to output a second signal corresponding to a stress-induced magnetic flux which may emanate from the second magneto-elastically active region. This way, the shear force can advantageously be determined in two opposing directions thereby improving the quality of the determination of the shear force. This "vice versa" configuration of the magnetic field sensors enables the shear directions to be determined by the magneto-elastically active regions. For example, the directions may be distinguishable, if the measurement data, which is acquired from the first direction sensitive magnetic field sensor and the second direction sensitive magnetic field sensor, is differentially processed.

The differential evaluation of the signals advantageously doubles the signal, which is correlated with the applied stress. Because the polarization of the first and second magneto-elastically active region is opposite to each other, theoretically possible external fields may be compensated. The sensor assembly according to this embodiment may be more sensitive and less susceptible to errors.

According to another aspect of the invention, the first and/or the second pin of the sensor assembly can include at least one first X-direction sensitive magnetic field sensor and/or at least one second X-direction sensitive magnetic field sensor and/or at least one Z-direction sensitive magnetic field sensor and/or at least one second Z-direction sensitive magnetic field sensor. The at least one X-direction sensitive magnetic field sensor may be configured to detect a force component $Fx1$ in the first magneto-elastically active region in the longitudinal direction X of the second portion. The at least one second X-direction sensitive magnetic field sensor may be configured to detect a force component $Fx2$ in the second magneto-elastically active region in the longitudinal direction X of the second portion. The at least one Z-direction sensitive magnetic field sensor may be configured to detect a force component $Fz1$ in the first magneto-elastically active region in the vertical direction Z. The at least one second Z-direction sensitive magnetic field sensor may be configured to detect a force component $Fz2$ in the second magneto-elastically active region in the vertical direction Z. Advantageously, the shear force can be determined in different directions being perpendicularly aligned with respect to each other.

According to another aspect, the first pin of the sensor assembly can include the at least one Z-direction sensitive magnetic field sensor and the at least one second Z-direction sensitive magnetic field sensor. Advantageously, the first pin can be configured to exclusively react on a shear force acting along the Z-direction.

According to still another aspect of the above invention, the first pin of the sensor assembly can include the at least one first X-direction sensitive magnetic field sensor, the at least one second X-direction sensitive magnetic field sensor, the at least one first Z-direction sensitive magnetic field sensor and the at least one second Z-direction sensitive magnetic field sensor and the second pin of the sensor assembly can comprise the at least one Z-direction sensitive magnetic field sensor and the at least one second Z-direction magnetic field sensor. Advantageously, the first pin can be configured to exclusively react on the shear effect along the X-direction which simplifies the shear force evaluation, wherein the shear force along the vertical Z-direction is acting on both load sensor pins 8, 9.

According to another aspect, the first pin of the sensor assembly can include the at least one first X-direction sensitive magnetic field sensor, the at least one second X-direction sensitive magnetic field sensor, the at least one first Z-direction sensitive magnetic field sensor and the at least one second Z-direction sensitive magnetic field sensor, and the second pin of the sensor assembly can include the at least one first X-direction sensitive magnetic field sensor, the at least one second X-direction sensitive magnetic field sensor, the at least one first Z-direction sensitive magnetic field sensor and the at least one second Z-direction sensitive magnetic field sensor. This way, both load sensor pins 8, 9 are sensitive to all shear forces along the vertical Z-direction as well as along the longitudinal X-direction. The first and the second pin advantageously can detect the different components of the shear force at different positions of the system.

The magnetic field sensor means/device may be configured for determination of a first component and a second component of the load, which is applied to the pin. In particular, the at least one first X-direction sensitive magnetic field sensor and the at least one second X-direction sensitive magnetic field sensor can form a first group of sensors and the at least one first Z-direction sensitive magnetic field sensor and the at least one second Z-direction sensitive magnetic field sensor can form a second group of sensors. The first group of sensors is suitable for determination of a load component, which is directed along the X-axis. The second group of sensors senses a component of the load, which is substantially perpendicular to the first component along the Z-direction. Consequently, the direction and the value of the stress or force, which is applied to the load sensor pins 8, 9, may be determined from said components in this coordinate system.

According to another aspect, the second portion of the sensor assembly can comprise a center wall which may extend in the longitudinal direction X and the vertical direction Z. The third and the fourth through-hole may also extend through the center wall. Advantageously, the center wall allows the first portion to be effectively affected by the shear force at an additional point of action.

According to another aspect, the first and/or the second pin of the sensor assembly may be fixedly attached in a predetermined manner to the first portion. The first and/or the second pin can advantageously be fixedly attached in all six degrees of freedom. This way, the determination of the shear forces is effectively possible since the load sensor pins 8, 9 do not have play inside the through-holes of the first portion.

According to another aspect, the first portion of the sensor assembly can have a yoke-like shape. The yoke legs of the first portion can comprise the first and the second through-holes. The second portion of the sensor assembly can have a tubular shape. The side walls of the second portion can comprise the third and fourth through-holes. The direction sensitive magnetic field sensor(s) may be configured to detect force components of shear forces introduced into the load sensor pins 8, 9 by the first portion and the second portion. Advantageously, a yoke-like shape of the first portion and a tubular shape of the second portion allow the sensor assembly to be implemented in an elongated joint connection of two objects, whereas the load sensor pins 8, 9 are arranged in the through-holes and connect both objects.

According to another aspect, the first portion of the sensor assembly can have a yoke-like shape. The yoke legs of the first portion can comprise the first and the second through-holes. The center wall can comprise the third and fourth through-holes. The direction sensitive magnetic field sensor(s) may be configured to detect force components of shear forces introduced into the load sensor pins 8, 9 by the first portion and the second portion. In particular, the side walls of the second portion can comprise through-holes which may be larger than the third and the fourth through-holes such that the shear forces may be introduced into the load sensor load sensor pins 8, 9 by abutment surfaces of the first and the second through-holes in the yoke legs and abutment surfaces of the third and the fourth through-holes in the center wall. The abutment surfaces allow the transmission of power between the first portion and the second portion to be configured in an advantageous manner.

According to another aspect, a tow coupling can comprise a sensor assembly wherein the first portion is a hitch assembly that may be configured to be attached to a car chassis and wherein the second portion may be a receiving tube which may be configured to receive a drawbar, alternatively a hitch bar or a ball mount of the tow coupling. Advantageously, the sensor assembly is configured to detect the forces of a tow coupling of an automobile, which may be part of a land based on-road or off-road vehicle.

According to another aspect, the first portion of the sensor assembly may be a supporting yoke having two yoke legs. The yoke legs may comprise recesses which are aligned in correspondence to each other and which represent the first and the second through-holes of the first portion.

According to another aspect, the first portion of the sensor assembly may be a supporting yoke having four yoke legs. The yoke legs may comprise recesses which are aligned in correspondence to each other and which represent the first and the second through-holes of the first portion.

According to another aspect, the sensor assembly dispenses with a mechanical linkage or connection between the magnetic field sensor means and the second portion. This eliminates sources of error, which result from mechanic failure of this connection. The sensor assembly reliably operates even under extreme operating conditions. The drift of the measurement values during long term measurement is reduced. The sensor assembly according to aspects of the invention is versatile in that it may be applied to or integrated in nearly every tubular shaped portion, which may be for example a part of a hydraulic unit of a land-, marine-, rail- or air transport vehicle.

According to another aspect, the forces which are detectable by the sensor assembly are not exclusively restricted to shear forces which originate from shear stress but may also originate due to tensile or compressive stress acting on the magneto-elastically active region(s) of the first pin and/or the second pin of the sensor assembly. In other words, shear stress and normal stress may both induce a variation of the polarization of the magnetically polarized region emanating from the magneto-elastically active region(s). This polarization may be detectable by the magnetic field sensor means which may output a signal corresponding to a stress-induced magnetic flux towards the polarization direction sensitive magnetic field sensor that may be configured to determine the acting force. Consequently, the magneto-elastically active region may be sensitive to all stress types. The embodiment may particularly be suitable, if the pin is exposed to only one single type of stress.

According to another aspect, the direction sensitive magnetic field sensors L may be one of a Hall-effect, magneto-resistance, magneto-transistor, magneto-diode, MAGFET field sensors or fluxgate magnetometer. These aspects advantageously apply to all embodiments of the invention.

According to another aspect, any hydraulic piston, crane application, car and other various applications incorporating bolts and load sensor pins 8, 9, where shear forces may be applied, may be equipped with the sensor assembly according to aspects of the invention. Traditionally, shear force sensors using strain-gauges are designed in that they get intentionally weaken to provide enough deformation so as to allow a measurement of the applied loads. The magneto-elastically active region of the sensor assembly, however, provides the possibility to design the bolt without weaken locations and significantly higher overload capability. The load pin having the integrated magneto-elastically active region provides the possibility to detect shear forces in load sensor pins 8, 9, screws, bolts etc.

According to another aspect, a method of determining a direction of a load vector is provided. Within said method, a sensor assembly according to aspects of the invention is provided. In other words, a sensor assembly is provided which can comprise a first portion having a first and a second through-hole. The sensor assembly can further comprise a second portion having a third and a fourth through-hole. The third and the fourth through-hole can be positioned in correspondence to the first and the second through-hole. The sensor assembly can further comprise a first pin and a second pin. The first pin can be arranged such that it extends through the first and the third through-hole and the second pin can be arranged such that it extends through the second and the fourth through-hole, so as to couple the first portion to the second portion. At least one out of the first and the second pin can comprise at least one magneto-elastically active region that may directly or indirectly be attached to or form a part of the pin in such a manner that mechanic stress on the pin is transmitted to the magneto-elastically active region. The magneto-elastically active region can comprise at least one magnetically polarized region such that a polarization of the magnetically polarized region may become increasingly helically shaped as the applied stress increases. The sensor assembly can further comprise a magnetic field sensor means which may be arranged approximate the at least one magneto-elastically active region. The magnetic field sensor means may be configured to output a signal corresponding to a stress-induced magnetic flux which may emanate from the magnetically polarized region. The magnetic field sensor means may comprise at least one direction sensitive magnetic field sensor which may be configured to determine a shear force in at least one direction. The at least one direction sensitive magnetic field sensor may in particular be arranged to have a predetermined and fixed spatial coordination with the pin, wherein this pin may at least be partially hollow. The at least one direction sensitive magnetic field sensor may be arranged inside an interior of this pin.

Furthermore, within the method according to another aspect, the first pin and the second pin may be exposed to a load. Measurement data of the at least one direction sensitive magnetic field sensor may be processed so as to determine a shear stress and/or a tensile or compressive stress that is applied by the second portion and the first portion to the first and/or second load sensor pins 8, 9.

In particular, a direction of a force F may be determined from the measurement data on the one hand and the predetermined and known spatial coordination between the direction sensitive magnetic field sensor(s), the first pin, the second pin and the point of load. The force F is applied to the sensor assembly via the second portion.

Same or similar advantages which have been already mentioned with respect to the sensor assembly having a magneto-elastically active region according to aspects of the invention apply in a same or similar way to the method of determining a direction of the load vector and will be not repeated.

Devices and methods related to magnetizing a cylindrical shaft, pin, or similar shaped object, and using magnetic field sensors positioned proximate to the same for detecting a magnetic flux emanating from the object and other magnetic fields, are disclosed in one or more of the following patents owned by Methode Electronics, the entire contents and disclosures of which are incorporated herein by reference: U.S. Pat. No. 6,490,934 ("Circularly magnetized non-contact torque sensor and method for measuring torque sing the same"); U.S. Pat. No. 6,553,847 ("Collarless circularly magnetized torque transducer and method for measuring torque using the same"); U.S. Pat. No. 6,904,814 ("Magnetic torque sensor system"); U.S. Pat. No. 7,140,258 ("Magnetic-based force/torque sensor"); U.S. Pat. No. 8,087,304 ("Magneto-elastic torque sensor with ambient field rejection"); U.S. Pat. No. 8,578,794; ("Magneto-elastic torque sensor with ambient field rejection"); and U.S. Pat. No. 8,893,562 ("System and method for detecting magnetic noise by applying a switching function").

In many of the above references, a magneto-elastic torque sensor is described, in which an output signal indicative of a force applied to a member is provided. The sensor includes a first magneto-elastically active region in the member, the region being ferromagnetic, magnetostrictive magnetically polarized in a single circumferential direction and possessing sufficient magnetic anisotropy to return the magnetization in the region to the single circumferential direction when the applied torque is reduced to zero, whereby the ferromagnetic, magnetostrictive region produces a magnetic field varying with the torque. Magnetic field sensors are mounted proximate to the ferromagnetic, magnetostrictive region to sense the magnetic field at the sensors and provide the output signal in response thereto.

Apparatus and methods related to strain-induced magnetic anisotropy to measure the tension or compression present in a plate-like object are described in US20150204737 ("Magneto-elastic sensor"), owned by Methode Electronics, the entire content and disclosure of which are incorporated herein by reference. The device includes an annular region of a plate is magnetized with a circumferential magnetization. Magnetic field sensors are then placed near this magnetized band at locations where the magnetization direction is non-parallel and non-perpendicular to the axis of tension. The strain-induced magnetic anisotropy caused by tension or compression then produces a shift in the magnetization direction in the plate regions near the field sensors, thereby causing magnetic field changes which are detected by the magnetic field sensors. The magnetic field sensors are connected to an electronic circuit which outputs a voltage signal which indicates the tension or compression in the plate.

According to another aspect, an embedded software program is used to receive signals from various sensors and output a signal containing information useful in determining or assessing a load weight gauge (measuring the tongue load of a tow coupling), a tow load weight shift alert, an unsafe trailer load distribution alert, a vehicle limit notification, an automated trailer brake control (closed loop), a low/flat trailer tire notification, a check trailer brake notification, a closed loop braking control, a vehicle shift control, an engine control, and a stability control.

According to another aspect, shielding material or a shielding device or multiple shielding devices may be used to shield the load sensor pins 8, 9 from the effects of external magnetic sources, such as nearby permanent magnets. In one embodiment, a flux directly may be used to direct external magnetic fields to minimize or reduce their effect on the load sensor pins 8, 9 and the output signal from the load sensor pins 8, 9.

According to another aspect, the load sensor pins 8, 9 output one or more signals to one or more microcontroller units. The microcontrollers are adapted to processing the signals and providing processed signals to a vehicle onboard control system via the vehicle's bus network. The processed signal may include information related to a comparison of the load pin forces to one or more threshold forces and instructional data for corrective actions to be taken by one or more vehicle control systems in response thereto.

In another aspect, the load sensor pins 8, 9 and other components of the tow coupling apparatus may be used to measure a sprung weight of a towing or towed vehicle by measuring the sheer forces on the load sensor pins 8, 9 caused by the weight on the vehicle producing a force on the load sensor pins 8, 9.

The present invention provides additional advantageous features related to magneto-elastic sensors for measuring forces, especially loads applied to one or more components of a vehicle hitch assembly.

DETAILED DESCRIPTION OF THE INVENTION

Figure 1:
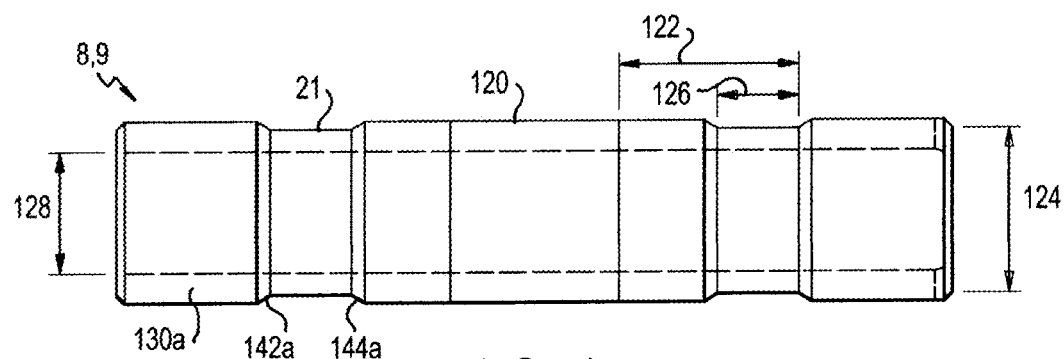
FIG. 1 is a simplified, schematic diagram of the outside of a load sensor pin for use with a tow coupling apparatus.

Several preferred embodiments of the invention are described for illustrative purposes, it being understood that the invention may be embodied in other forms not specifically described below and/or shown in the drawings.

For reference purposes, a Cartesian coordinate system is used to describe certain features, components, and directions, and unless otherwise stated or shown in the figures otherwise, the x-axis generally refers to a longitudinal direction, the y-axis generally refers to a transverse direction that is perpendicular to the x-axis, and the z-axis generally refers to a vertical direction that is perpendicular to a plane formed by the x- and y-axes.

Figure 5:
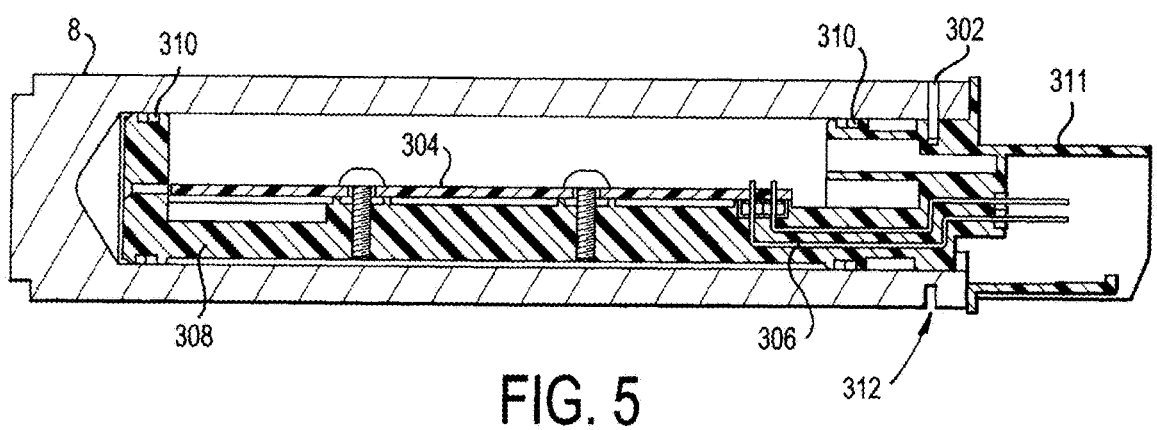
FIG. 5 is a simplified, cross-sectional, plan view diagram of the load sensor of FIG. 3.

Turning first to FIG. 1, shown therein is a simplified, schematic diagram of a load sensor pin 8 (and similar load sensor pin 9; as best seen in FIG. 5) for use with a tow coupling apparatus, one that is adapted to being attached to a towing vehicle (e.g., passenger automobile car or truck; not shown) at/near the back/rear bumper of the towing vehicle. The load sensor pin 8 referred to here is a "front" load sensor pin given its relative position with respect the load sensor pin 9; that is, in one embodiment, the load sensor pin 8 is installed in the tow coupling apparatus such that it would be closer to the front of a towing vehicle when the tow coupling apparatus is mounted to the towing vehicle, whereas the load sensor pin 9 is behind the load sensor pin 8 and thus would be closer to the back of the towing vehicle. The relative positions of the load sensor pins 8, 9 may be different than the arrangement shown in the drawings, depending on the particular type of tow coupling application.

The load sensor pins 8, 9 may include a center portion 120 and longitudinally spaced apart end portions 130*a*, 130*b* on either side of the center portion 120. Between the center portion 120 and the end portion 130*a* is a magneto-elastically active portion 21 bordered by joints 142*a* and 144*a* (the same features are shown on the other side of the center portion 120). The magneto-elastically active portion 21 is treated in such a way that a longitudinally-extending portion of the surface of the load sensor pins possess a magneto-elastic active region for producing an external magnetic field/flux, as further described below.

Each of the load sensor pins 8, 9 are preferably hollow shafts having a wall thickness ranging from about 0.2 mm at its thinnest to about 3 mm at its thickest along its longitudinal dimension, but the actual wall thickness may be determined based on a particular needs of the application in which the load sensor pins 8, 9 are used. The outer surface of the load sensor pins 8, 9 may have portions that are round or flat.

The dimension 122, which spans a portion of the center portion 120 and the magneto-elastically active portion 21 (as well as a portion of the center portion 120 and the magneto-elastically active portion 22), may vary by application. The dimension 124, which is a diameter of the end face of the end portion 130*b* of the load sensor pin 8, 9 (as well as a diameter of the end face of the end portion 130*a* of the load sensor pin 8, 9) may also vary as necessary. The dimension 126, which is the width of the magneto-elastically active portions 22 (as well as the width of the magneto-elastically active portions 21) may be about 8 mm to about 24 mm. The dimension 128, which is a diameter of the inner wall surface of the load sensor pin 8, 9 at the ends of the end portion 130*a* of the load sensor pin 8, 9 (as well as the a diameter of the inner wall surface of the load sensor pin 8, 9 at the ends of the end portion 130*b* of the load sensor pin 8, 9) may also vary by application.

All or some of the center portion 120 and the end portions 130*a*, 130*b* may be made from non-magnetic materials to keep near field magnetic field generating sources, such as a permanent magnet, magnetized wrench, motor, or solenoid, at a minimum distance from the load sensor pins 8, 9 to reduce or eliminate (below detection) the path of magnetic fields from those types of sources. This would limit or eliminate the effect these near field sources have on the force dependent field measurements produced by the magneto-elastically active portions 21, 22 of the load sensor pins 8, 9.

Another way to reduce the influence of external magnetic fields in/on the load sensor pins 8, 9 is to have only the shear areas of the load sensor pins 8, 9 made of ferromagnetic material. That is, it is not necessary for the rest of the load sensor pins 8, 9 to be made from a ferromagnetic material, and in some instances it is rather undesirable as such materials only act as a flux director for channeling external magnetic fields towards the magnetic field measurement coils (not shown).

The load sensor pins 8, 9 are further described in Applicant's European patent application EP17162429.9, which is incorporated herein by reference.

Figure 2:
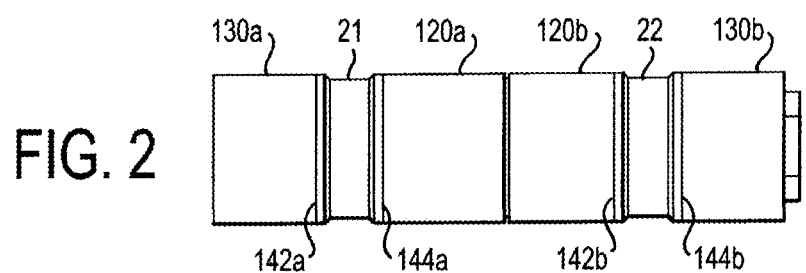
FIG. 2 is a simplified, schematic diagram of the outside of another load sensor pin for use with a vehicle tow coupling apparatus.

Turning now to FIG. 2, shown therein is a simplified, schematic diagram of another aspect of the load sensor pin 8, 9 of FIG. 1 in which the center portion 120 is divided into two separate center portions 120*a*, 120*b*, separated by a joint. In this embodiment, all or some of the center portions 120*a*, 120*b*, along with their adjacent magneto-elastic active portions 21, 22, are made from a material and/or treated as described above in such a way that they produce an external magnetic field/flux.

To construct the load sensor pins 8, 9 as shown in FIG. 1 and FIG. 2, the different materials of the various portions could be welded together (e.g. using friction welding). Another possibility would be to take a load sensor pin 8,9 constructed of austenitic stainless steel (non-magnetic) and transform the shear areas to a martensitic material through the process of cold working thus forming the magneto-elastic active portions 21, 22.

Figure 3:
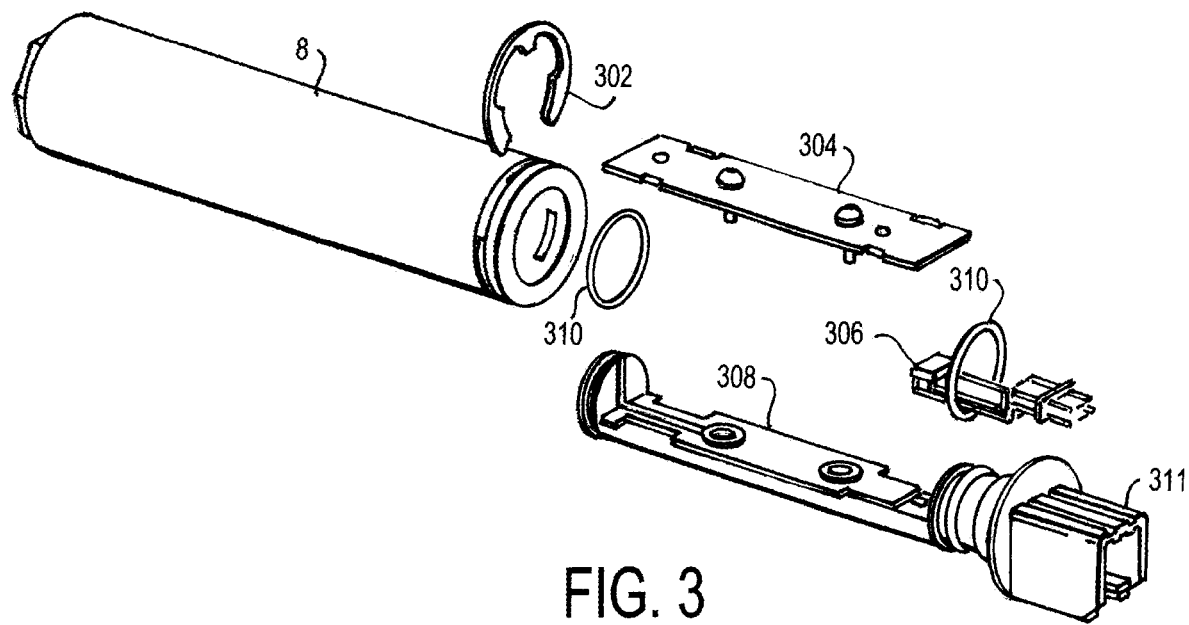
FIG. 3 is a simplified, perspective, exploded view diagram of some of the components of a "front" load sensor pin.
Figure 4:
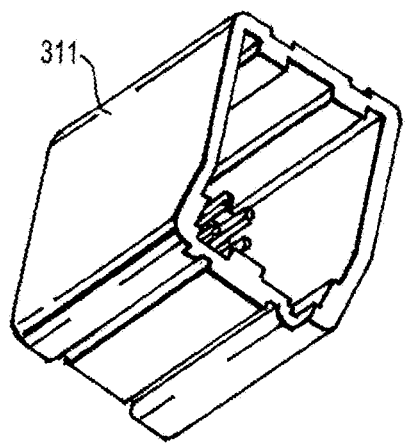
FIG. 4 is a simplified perspective view schematic diagram of a multi-pin electrical connector for use with the load sensor pin of FIG. 3.
Figure 12A:
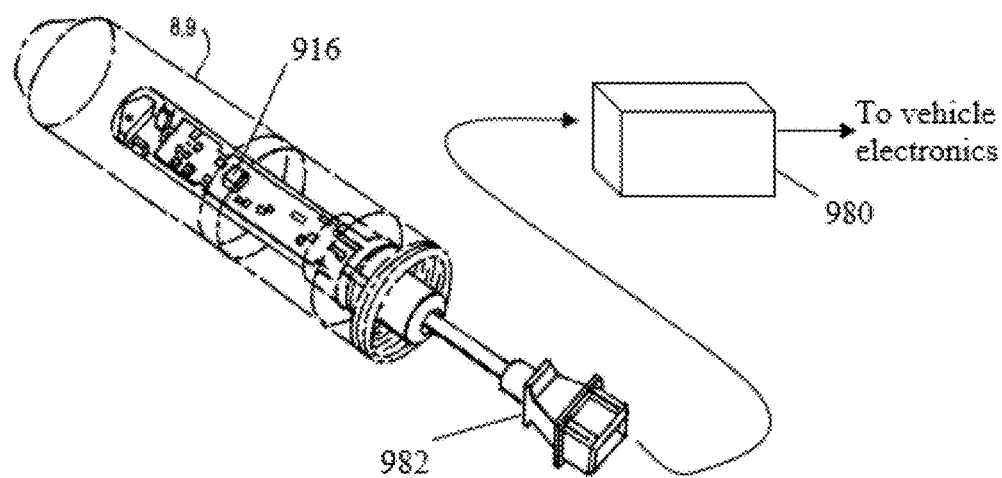
FIG. 12A is a simplified, partial, perspective view diagram of some of the components of a load sensor pin having a secondary magnetic field sensor.

Turning now to FIG. 3 and FIG. 5, shown therein are a simplified, perspective and cross-sectional, and exploded view diagrams of some of the components of the first load sensor pin 8. As shown, the load sensor pin 8 includes a retaining clip 302, a printed circuit board 304, a set of connector pins 306, a support member 308 having a pin connector housing 311 (as also shown in FIG. 4) on a terminating end, and a pair of sealing rings 310. The retaining clip 302 is used to fix the support member 308 in a way that minimizes movement after it is fixed in its final assembled state. The printed circuit board 304 may have one or more (such as four) magnetic field sensors (described below) mounted thereon each with leads for connecting to the set of connector pins 306. The printed circuit board 304 includes a suitable processor, memory, and embedded software (not shown). The set of connector pins 306 include insert molded pins on one end for extending up and through pre-drilled through-holes on the printed circuit board 304 for connecting to the one or more magnetic field sensors and other circuit components on the printed circuit board 304. The other end of the set of connector pins 306 terminate with suitable latch-type or friction fit-type pins that connect with a suitable connector of an electrical harness (as best seen in FIG. 12A). The sealing rings 310 are used to prevent anything from entering the interior of the load sensor pin 8.

Figure 6:
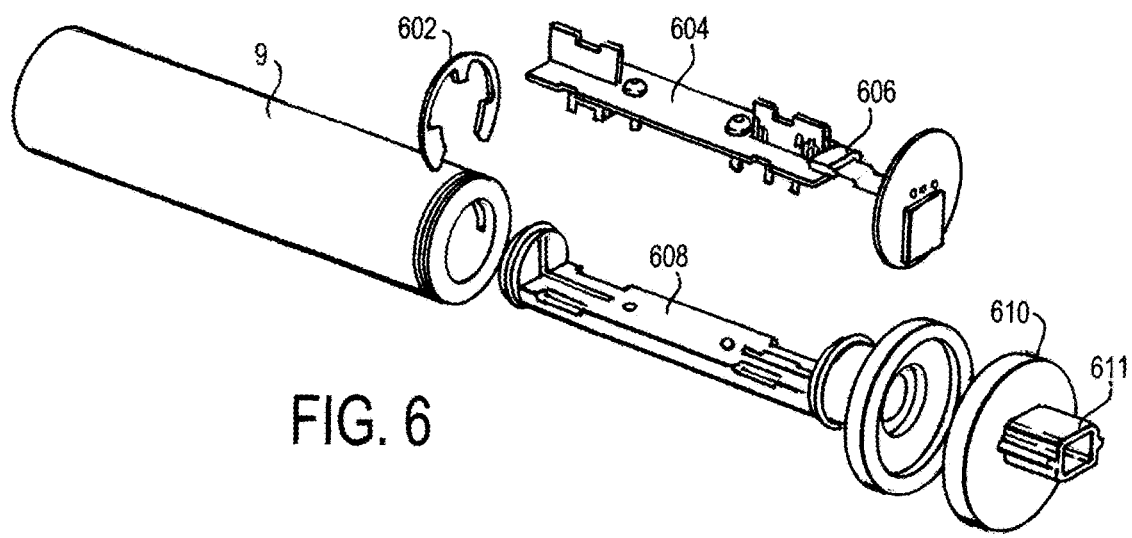
FIG. 6 is a simplified, perspective exploded view diagram of some of the components of a "back" load sensor pin.
Figure 7:
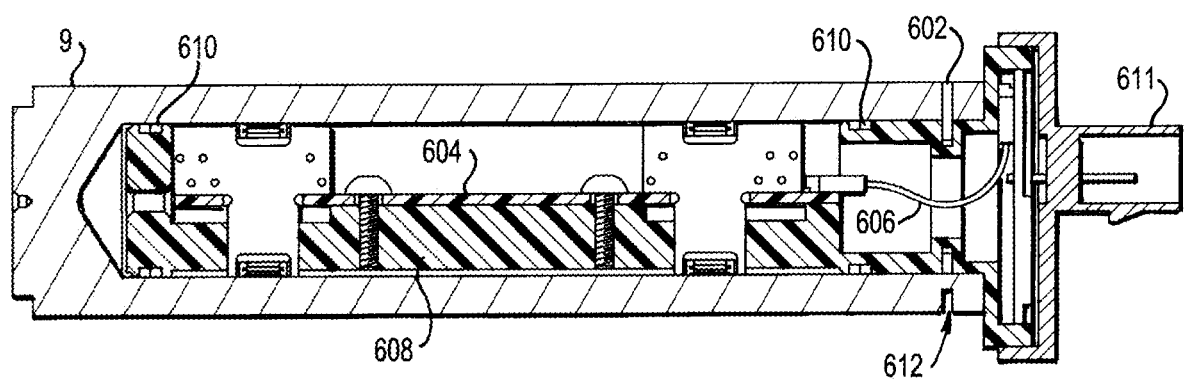
FIG. 7 is a simplified, cross-sectional, plan view diagram of the load sensor of FIG. 6.
Figure 8:
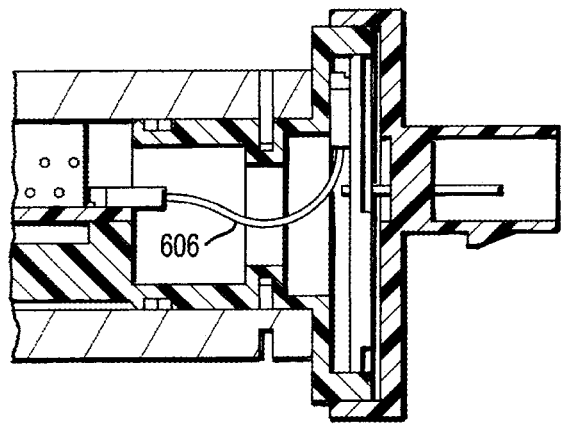
FIG. 8 is a simplified, partial, cross-sectional, plan view diagram of the load sensor of FIG. 6.

Turning now to FIG. 6 and FIG. 7, shown therein are simplified, perspective and cross-sectional, exploded view diagrams of some of the components of the second load sensor pin 9. As shown, the load sensor pin 9 includes a retaining clip 602, a printed circuit board 604, a set of connector pins 606, a support member 608, a pair of sealing rings 610, and a connector housing 611. The retaining clip 602 is used to fix the support member 608 after it is fixed in its final assembled state to prevent movement. The printed circuit board 604 may have one or more (such as eight) magnetic field sensors (not shown) mounted thereon each with leads for connecting to the connector pins 606, which in turn lead to a flat, circular-shaped printed circuit board. The printed circuit board 604 includes a suitable processor, memory, and embedded software (not shown). A micro ribbon or cable (as shown in FIG. 8) connects the printed circuit board 604 and a circular printed circuit board. The flat, circular-shaped printed circuit board connects to a four-pin connector inside the connector housing 611. The sealing rings 610 are used to prevent anything from entering the interior of the load sensor pin 9.

Figure 9:
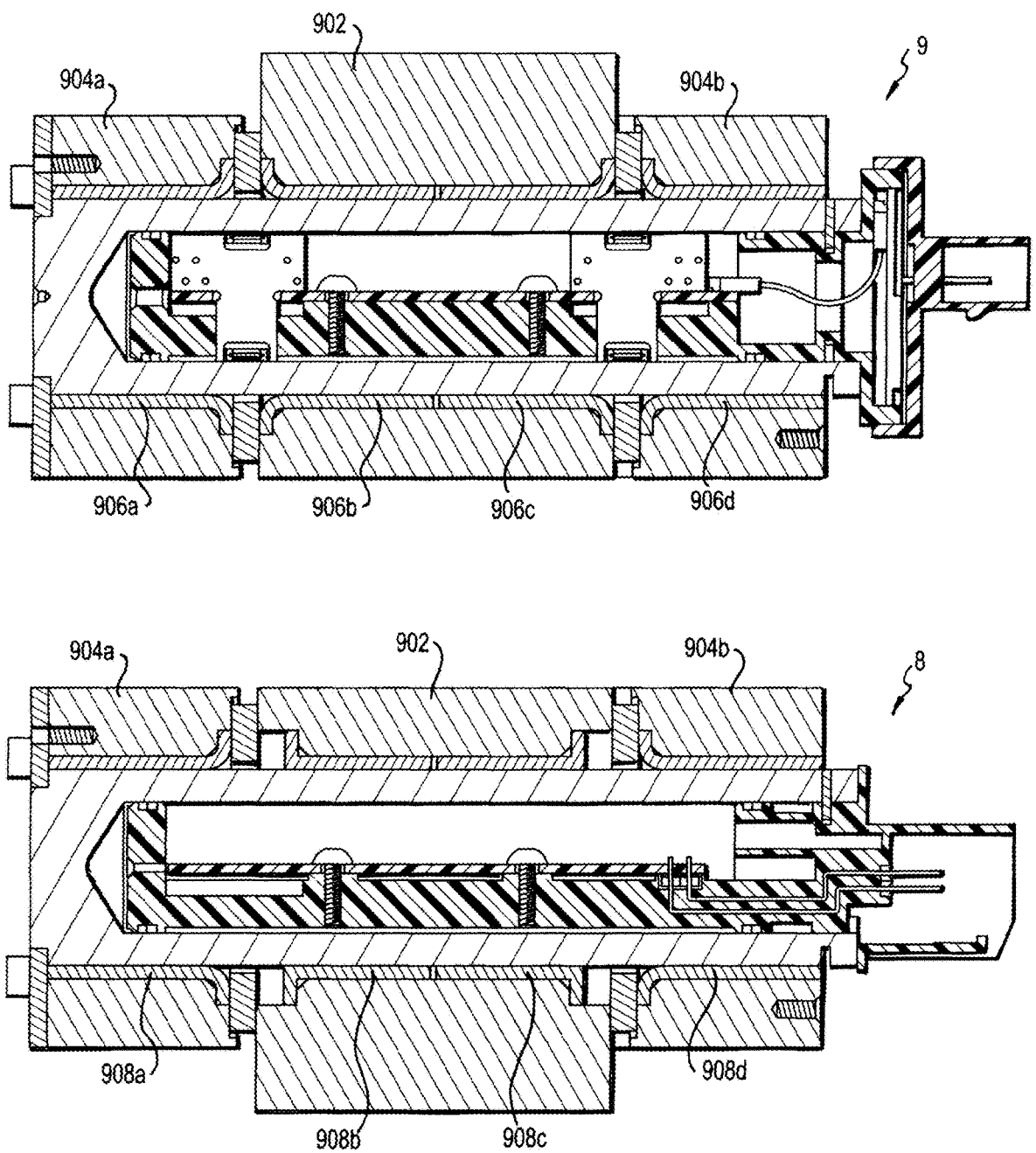
FIG. 9 is a simplified, partial, cross-sectional, plan view diagram of the "front" and "back" load sensor pins of FIGS. 3 and 6 and some of the components of a tow coupling apparatus.

Turning now to FIG. 9, shown therein is a simplified, partial, cross-sectional, plan view diagram of the "front" and "back" load sensor pins of FIGS. 3 and 6 and some of the components of a tow coupling apparatus as they could be employed in connection with a tow coupling apparatus (for ease of reference, the two load sensor pins are shown with load sensor pin 9 on top of load sensor pin 8). As shown, the center portions 120 of the load sensor pins 8, 9 are rigidly fixed inside the through-holes of a bracket 902 that generally surrounds the load pins 8, 9. The end portions 130a, 130b of the load sensor pins 8, 9 are further rigidly fixed inside corresponding through-holes of the yoke-like projections 904a, 904b of a generally U-shaped adapter 904 (supporting yoke) that surrounds the bracket 902. Bushings 906a, 906b, 906c, 906d surround respective portions of the load sensor pin 9, and bushings 908a, 908b, 908c, 908d surround respective portions of the load sensor pin 8. The bushings may be brass or some other material. In some embodiments, no bushings are used between the end portions 130a, 130b of the load sensor pins 8, 9 and the respective through-holes of the side yoke-like projections 904a, 904b of the adapter 904. In that embodiment, the load sensor pins 8, 9 are in direct contact with the walls of the through-holes.

The load sensor pins 8, 9 are made from one or more materials, in addition to ferromagnetic materials, and are constructed in such a way that they are suitable for forming the magneto-elastic active regions 21, 22. The chosen materials and construction of the various portions of the load sensor pins 8, 9 should be such that the nature of the shaft of the load sensor pins 8, 9 is one that is elastically deformable. This provides for the relative movement between the center portions 120 (caused by a force imparted by the bracket 902 on the center portions 120) and the rigidly fixed end portions 130a, 130b (maintained in a stationary position by the adapters 904). The eccentric deformation caused by forces imparted on the load sensor pins 8, 9 causes the magneto-elastic active regions 21, 22 to produce the external magnetic field/flux as previously described.

Figure 10A:
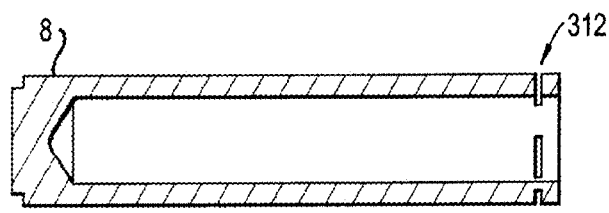
FIG. 10A is a simplified, cross-sectional view drawing of another aspect of a load sensor pin.
Figure 10B:
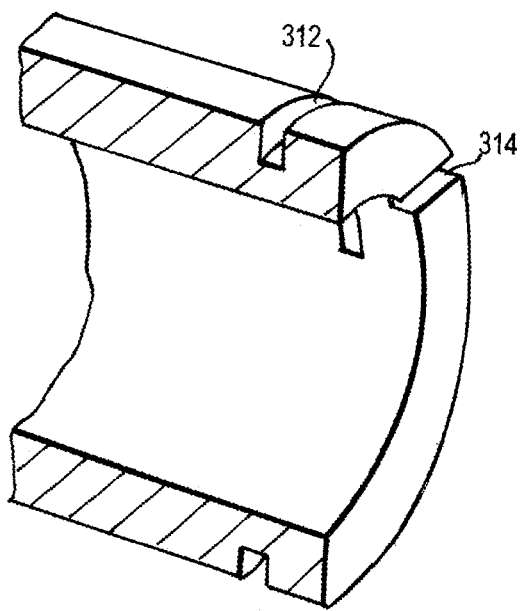
FIG. 10B is a simplified, partial, cross-sectional, perspective view diagram of the load sensor pin of FIG. 10A.
Figure 10C:
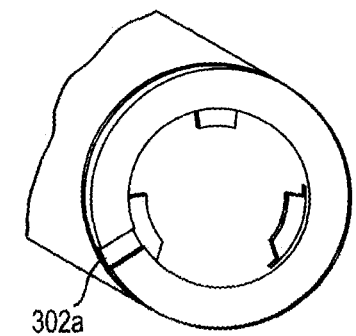
FIG. 10C is a simplified, partial, perspective view diagram of another aspect of a load sensor pin of FIG. 10A.
Figure 10D:
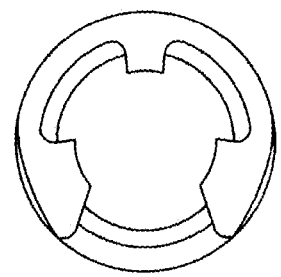
FIG. 10D is a simplified, end view diagram of yet another aspect of the load sensor pin of FIG. 10A.

Turning now to FIGS. 10A through 10D, shown therein are a simplified cross-sectional, perspective view drawings of others aspects of a load sensor pin 8, 9. In FIG. 10A, a load sensor pin 8 has a length along its longitudinal direction such that the slot 312 (and slot 612) for receiving the retaining clip 302 is outside the bushing 908d (906d in the case of the load sensor pin 9). In one embodiment, the slots 312, 316 may be about 1.5 mm wide and have an inner diameter of about 24 mm, and they may be about 4 mm from the end of the load sensor pin 8. In FIG. 10C, the retaining clip 302 includes a raised flange or post 302a that fits inside a pole yoke opening 314 as best seen in FIG. 10B to prevent the retaining clip 302 from slipping out of its slot 312 (similarly, the retaining clip 602 includes a raised flange or post to prevent the retaining clip 602 from slipping out of its slot 612). The pole yoke opening 314 may extend through the wall of the load sensor pin 8, for example to accept a raised flange or post 302a having about a 2 mm length. In FIG. 10D, one possible configuration for the retaining clips 302, 602 is shown.

Figure 11A:
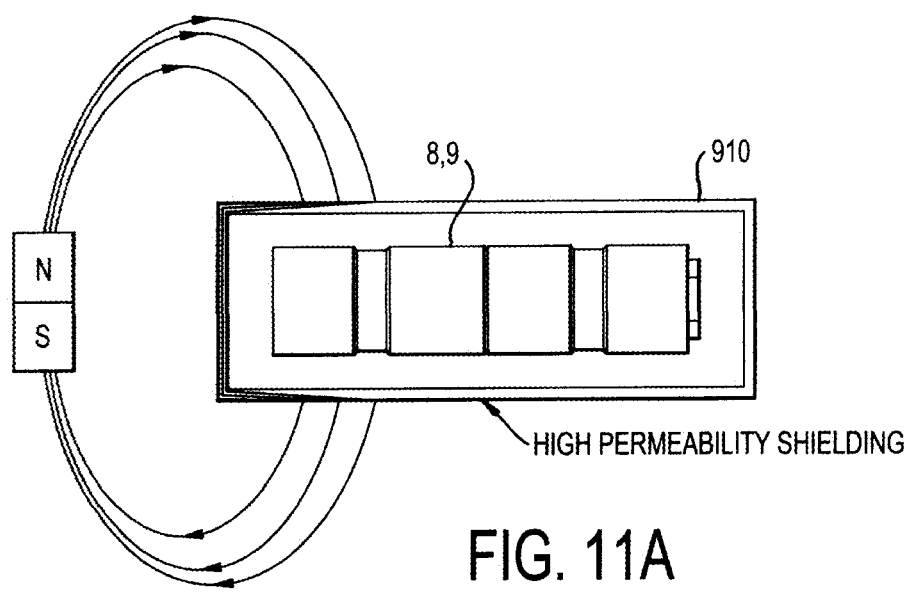
FIG. 11A is a simplified, schematic diagram of the load sensor pin of FIG. 2 with a shielding device.
Figure 11B:
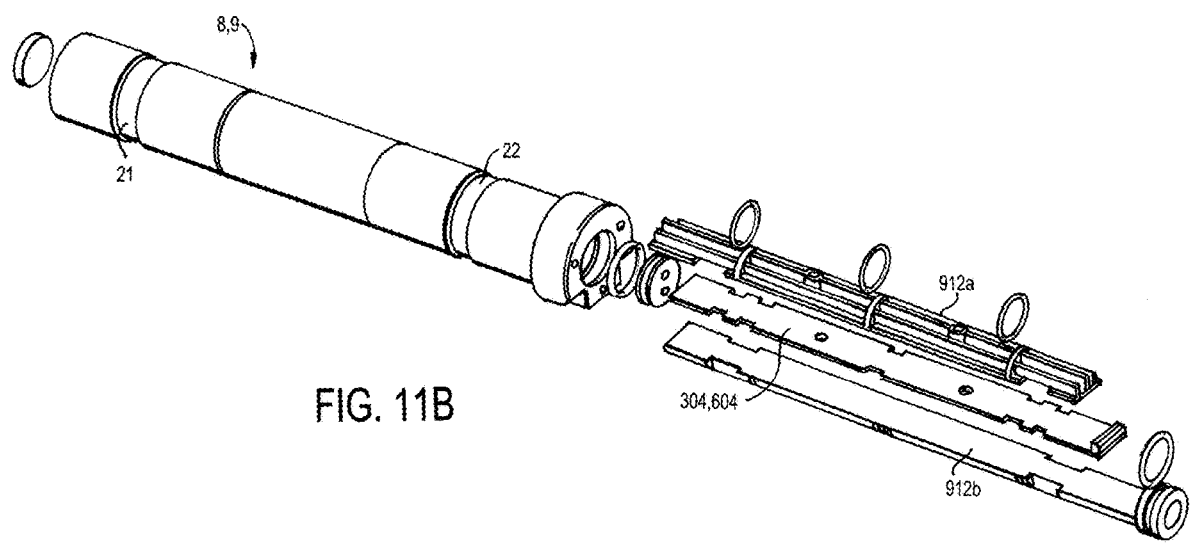
FIG. 11B is a simplified, exploded, perspective view diagram of the components of a load sensor pin showing a printed circuit board between two elongated magnetic field shielding members.

Turning now to FIG. 11A and FIG. 11B, shown therein is a simplified, schematic diagram of one of the load sensor pins 8, 9 of FIG. 2 inside a shielding device 910, and a simplified, exploded, perspective view diagram of the components of a load sensor pin 8, 9 showing a printed circuit board 304, 604 between two elongated magnetic field shielding members 912a, 912b, respectively. In FIG. 11A, the shielding device 910 may be a box or other shape and is made using materials with high magnetic permeability, which shunts an external magnetic field by offering a path of low resistance to the field and thereby minimizing or eliminating the influence of the field on the force dependent field measurements produced by the load sensor pins 8, 9. In FIG. 11B, the shielding members 912, 912b also help to minimize or eliminate the influence of the field on the force dependent field measurements produced by the load sensor pins 8, 9. Shielding effects are further described in Applicant's U.S. Pat. No. 8,578,794 (Magneto-elastic Torque Sensor with Ambient Field Rejection), which is incorporated herein by reference in its entirety.

Figure 12B:
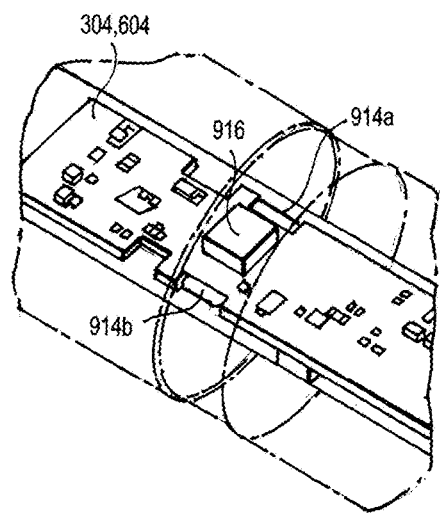
FIG. 12B is another simplified, partial, perspective view diagram of some of the components of the load sensor pin of FIG. 12A.

Turning now to FIG. 12A, shown therein is a simplified, partial, perspective view diagram of some of the components of a load sensor pin having a secondary magnetic field sensor 916. FIG. 12B shows another simplified, partial, perspective view diagram of some of the components of the load sensor pin of FIG. 12A. The components of one of the load sensor pins 8, 9, is shown in which its respective printed circuit board 304, 604 includes primary magnetic field sensors 914a, 914b and a secondary magnetic field sensor 916. The secondary magnetic field sensor 916 may be a 3-axis compass sensor (either standalone or as part of a 9-axis sensor), which is used to detect the presence of external magnetic fields in the case that the shielding elements described above are not effective in eliminating all external fields. Information outputted by the secondary magnetic field sensor 916 could be used to perform compensation calculations on the force measurements. In addition, each of the load sensor pins 8, 9 could include extra sensing coils arranged in a way to minimize the influence of external magnetic fields on the measurement of the forces by the primary magnetic field sensors 914a, 914b.

The effects of external magnetic fields may also be taken into account by computational means using a suitable algorithm, which may be processed by embedded software on the printed circuit board 304, 604, or in a separate electronics module 980 connected to the printed circuit board 304, 604 via cable connector 982. Due to the mechanical configuration of a sensor system assembly (especially ones with two or more load sensor pins 8, 9 or two sensing planes), there can be certain relationships between the forces detected by the load sensor pins 8, 9 that have to be fulfilled. An external field is likely to cause an implausible relationships/combination of individual forces measured, which an algorithm could detect and compensate for.

Figure 13:
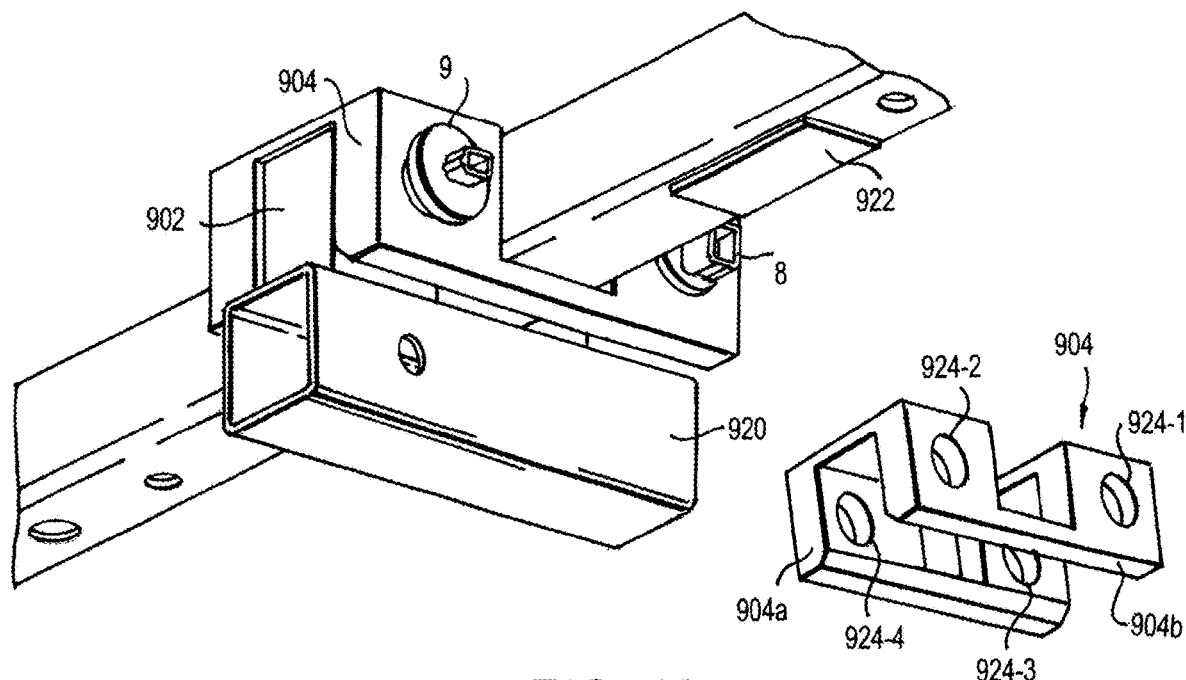
FIG. 13 is a simplified, partial, perspective view diagram of some of the components of a tow coupling apparatus showing front load sensor pin 8 and back load sensor pin 9.

Turning now to FIG. 13, shown therein is a simplified, partial, perspective view diagram of some of the components of a tow coupling apparatus showing front load sensor pin 8 and back load sensor pin 9 for coupling a towing vehicle to a towed vehicle. As shown, the tow coupling apparatus includes a bracket 902 attached to a receiver tube 920, and a generally U-shaped adapter 904 attached to a hitch tube 922.

The hitch tube 922 is a longitudinally extending, round, oval, square, or other shape member of the type typically used to attach to a towing vehicle (not shown) near the rear bumper of the towing vehicle. The hitch tube 922 is the component that couples the tow coupling apparatus to the towing vehicle to transmit force (generated by the towing vehicle's engine) to a towed vehicle (not shown), such as a trailer. Bolts or other fastening means may be used to securely attach the hitch tube 912 to the towing vehicle.

The adapter 904 has two side yoke-like projections 904a, 904b extending approximately 90-degrees from a base portion such that they are parallel to each other. Each side wall includes through-holes: first and second through-holes 924-1, 924-2 on the side wall 904b, and third and fourth through-holes 924-3, 924-4 on the side wall 904a, such that the first and third through-holes 924-1, 924-3 are axially aligned with each other, and the second and fourth through-holes 924-2, 024-4 are also axially aligned with each other. The end portions 130a, 130b of the load sensor pins 8, 9 are rigidly fixed inside the through-holes of the side yoke-like projections 904a, 904b of the adapter 904, in some cases using collars or bushings, that surrounds the bracket 902 as shown.

The bracket 902, which may be a single member or two separate members arranged on front and back sides of the hitch tube 922, fits between the two side yoke-like projections 904a, 904b of the adapter 904 when the tow coupling apparatus components are in an assembled state. The bracket 902 includes a front portion and a back portion. The front portion and the back portion each includes a through-hole (not shown) axially aligned with the through-holes on the adapter 904 when the components are in the assembled state. Through-holes on the front and back portions of the adapter 904 may be slightly larger than the through-holes 924-1, 924-2, 924-3, 924-4 such that shear forces transmitted from the receiver tube 920 are introduced into the load sensor pins 8, 9 by abutment surfaces of the through-holes 924-1, 924-2, 924-3, 924-4 in the adapter 904 and abutment surfaces of the through-holes in the bracket 902.

The bracket 902 and the adapter 904 are each made of a material selected from suitable materials that resist deforming over time under a range of expected applied forces.

There may a gap of about 0.5 mm between the top of the bracket 902 and the connecting base portion of the adapter 904 (the portion that connects to the hitch tube 922). The thickness of the base portion of the adapter 904 in the configuration shown may be 8 mm. Alternatively, the thickness of the base portion of the adapter 904 may be 10 mm, which may be achieved, for example, by modifying the placement of the various through-holes and changing other dimensions of the adapter 904.

Figure 14:
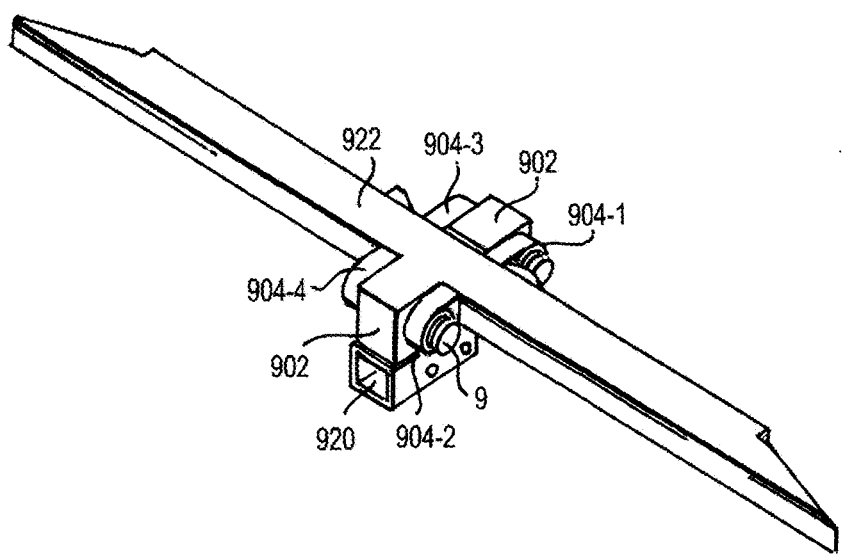
FIG. 14 is another simplified, partial, perspective view diagram of the components of the tow coupling apparatus showing front load sensor pin 8 and back load sensor pin 9.

Turning now to FIG. 14, shown therein is another simplified, partial, perspective view diagram of the components of the tow coupling apparatus showing front load sensor pin 8 and back load sensor pin 9. In this embodiment, an alternative approach to using the adapter 904 is shown. Instead of a one-piece adapter 904 with a base portion, two spaced apart side yoke-like projections 904a, 904b, and through-holes 924-1, 924-2, 924-3, 924-4, the alternative adapter includes four separate adapters 904-1, 904-2, 904-3, 904-4 each separately connected directly to a hitch tube 922 as shown.

Figure 15:
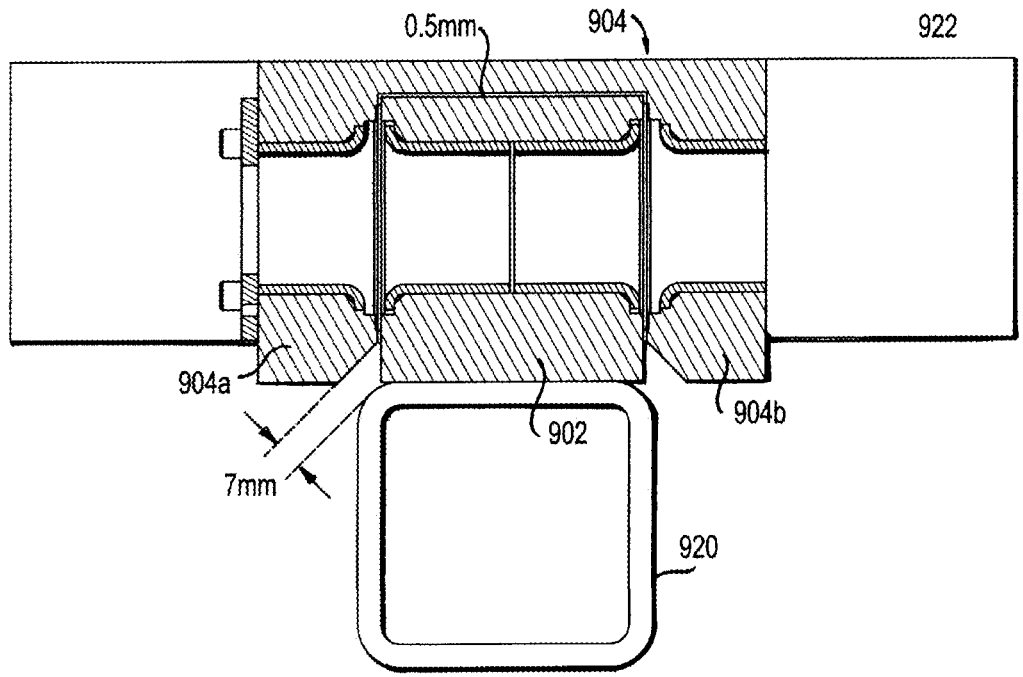
FIG. 15 is a simplified, partial, cross-sectional, end view diagram of the components of the tow coupling apparatus of FIG. 13.
Figure 16:
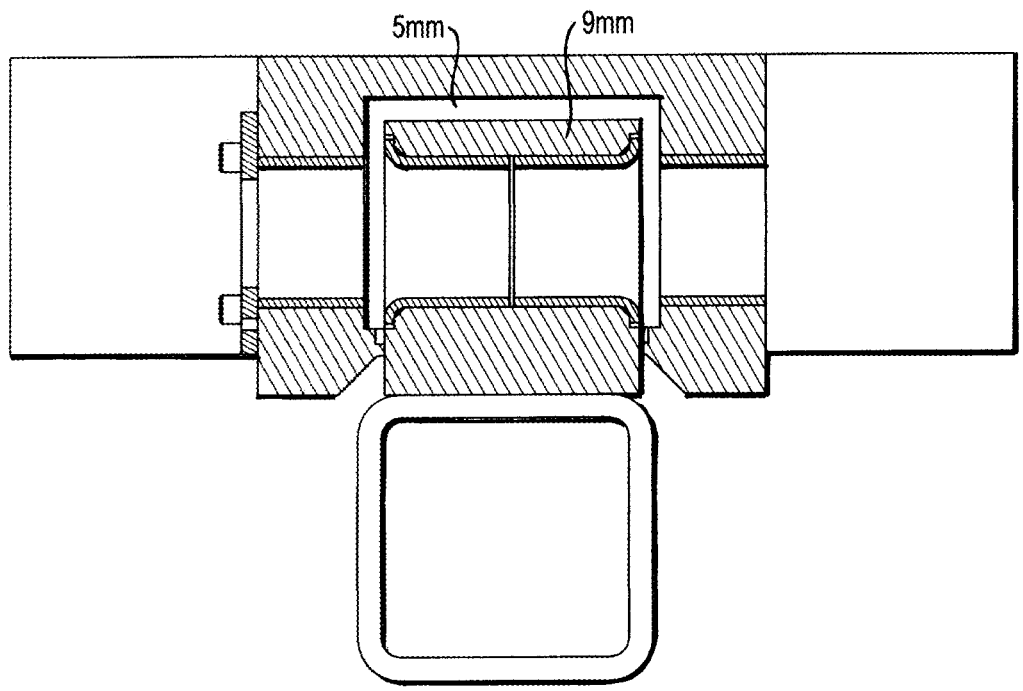
FIG. 16 is another simplified, partial, cross-sectional, end view diagram of the components of the tow coupling apparatus of FIG. 13.

Turning now to FIG. 15 and FIG. 16, shown therein are simplified, partial, cross-sectional, end view diagrams of the components of the tow coupling apparatus of FIG. 13. As shown in FIG. 15, the lower edge of the side yoke-like projections 904a, 904b of the adapter 904 include a beveled edge such that there is a gap of about 7 mm between the bevel edge and the closest edge of the receiver tube 920. There is also a gap of about 0.5 mm between the upper edge of the bracket 902 and the base portion of the adapter 904 (the thickness of the base portion here could be about 8 mm or as needed to provide rigidity for the side yoke-like projections 904a, 904b). As shown in FIG. 16, the gap between the upper edge of the bracket 902 and the base portion of the adapter 904 is increased from 0.5 mm to 5 mm (the thickness of the base portion here could be about 10 mm to provide additional rigidity for the side yoke-like projections 904a, 904b). Various other dimensions (thickness) of the base portion of the adapter 904 are also contemplated and may be suitable for different expected forces or loads on the tow coupling apparatus components. Also shown are press-fit bushings having a pre-determined radial thickness inserted into the axially-aligned through-holes of the bracket.

Figure 17A:
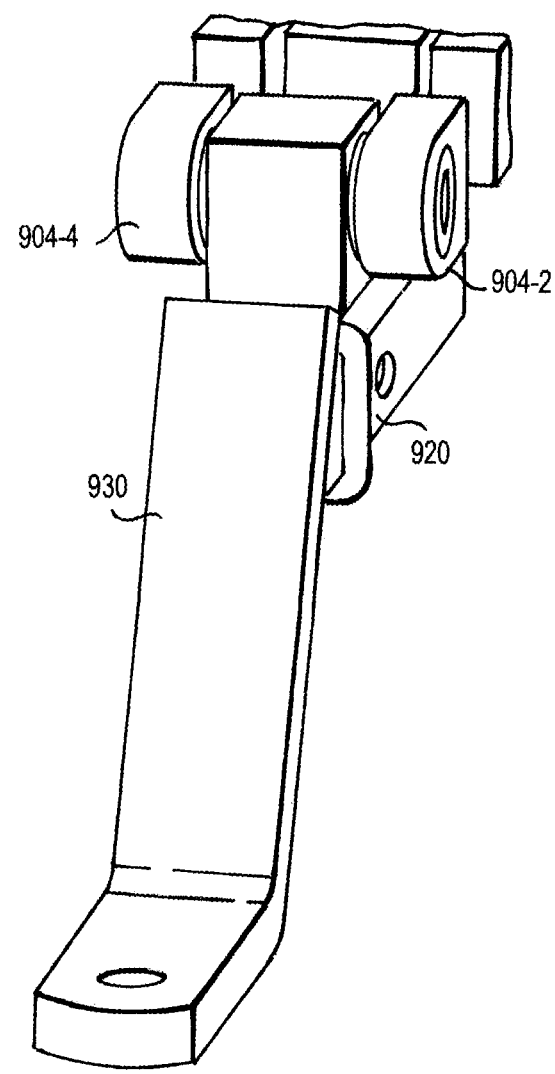
FIG. 17A is a simplified, partial, perspective view diagram of the tow coupling apparatus of FIG. 14.
Figure 17B:
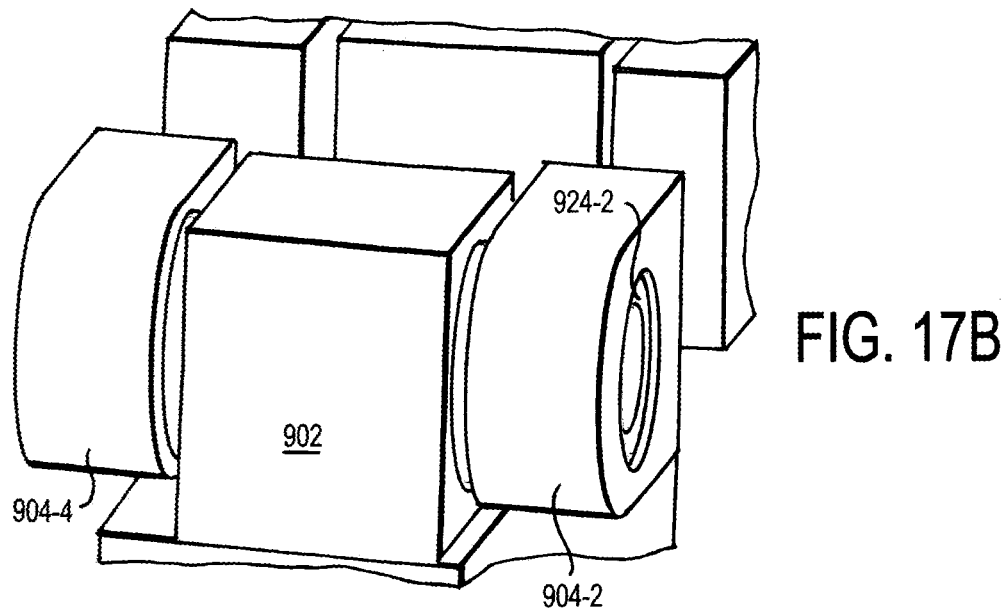
FIG. 17B is a close-up simplified, partial, perspective view diagram of the apparatus of FIG. 14.

Turning now to FIG. 17A and FIG. 17B, shown therein are simplified, partial, perspective view diagrams of the tow coupling apparatus of FIG. 14. Specifically, a drawbar 930 is shown inserted into the receiver tube 920 and may be fastened in the receiver tube 920 with a connecting pin (not shown). As described below, the drawbar 930 is the connection member between the tow coupling apparatus and the towed vehicle (e.g., trailer), and thus is a force-transmitting member that can be monitored by use of the load sensor pins 8, 9 as previously described.

Figure 18A:
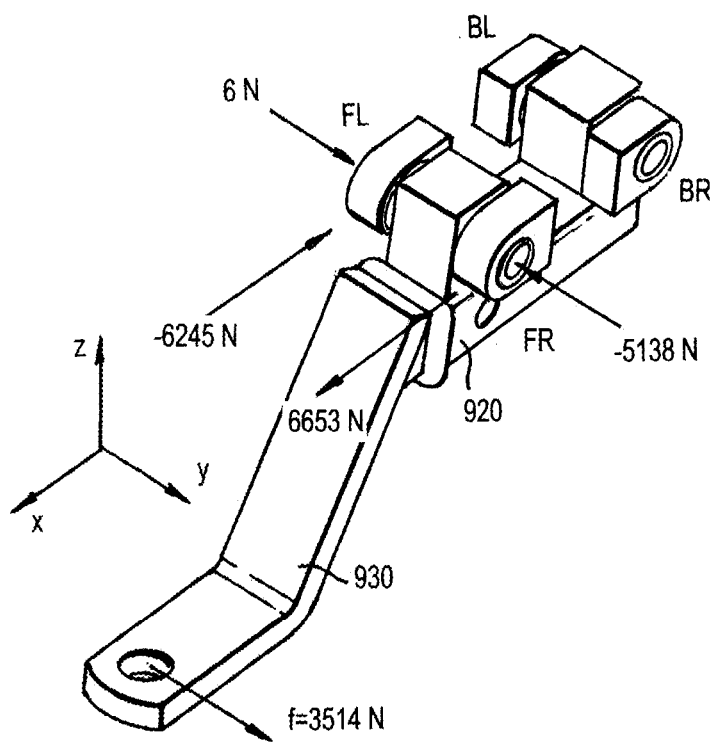
FIG. 18A is a simplified, partial, perspective view diagram of some of the components of the tow coupling apparatus of FIG. 14 showing a first load case.

In particular, FIG. 18A is a simplified, partial, perspective view diagram of some of the components of the tow coupling apparatus of FIG. 14 showing a first load case in which a force is applied to the proximate or free end of the drawbar 930 (i.e., the end closest to the viewer). This applied force will be transmitted to the distal or pinned end of the drawbar 930 inside the receiver tube 920. That is, the force corresponding to the transmitted force at the distal end of the drawbar 930 by the towed vehicle may be transmitted to the receiver tube 920. That force then acts on the bracket 902 attached to the receiver tube 920. As the bracket 902 displaces the load sensor pins 8, 9 (the ends of which are rigidly attached to the adapter 904), the sheer force causes the magneto-elastically active portions 140a, 140b to output a magnetic field that is detectable by magnetic field sensors 914a, 914b.

For example, assume a force is applied to the proximate end of the drawbar 930 in the direction shown. In this embodiment, the force transmitted to the back load sensor pin 9 may be determined with respect to the adapters 904-2, 904-4. The output signals from the magnetic field sensors associated with the load sensor pin 9 may be received in a suitable algorithm, for example one that is embedded on a circuit board having a suitable processor located inside the load sensor pin 9, or in a separate module 980 (FIG. 12A) that could be integrated into the towing vehicle electronics. The received output signals from the load sensor pin 9 (and from the load sensor pin 8) may be indicative of the magnetic field/flux exhibited by the load sensor pins, and thus may be used to determine that a force has vector components of 6653 N in the x-direction and −5138 N in the y-direction (associated with the x-y-z Cartesian coordinate system shown). Moreover, the received output signals may be further used to determine that the other force vector components are −6245 N in the x-direction and 6 N in the y-direction as shown. The algorithm/processor may compute that the force applied to the proximate end of the drawbar 930 has a magnitude of 3514 N and is applied in the direction shown (i.e., toward the right or in the y-direction). The table below indicates the forces that may be determined as a result of forces transmitted to the load sensor pins 8, 9.

TABLE 1

| Force Vectors on Adapters | | Front Reaction (N) | Joint Probe (N) | Total (N) |
|---|---|---|---|---|
| 904-1 | x | 5387.6 | 0 | 5387.6 |
| | y | 6.3344 | 0 | 6.3344 |
| | z | −2082.9 | −1012.4 | −3095.3 |
| 904-3 | x | −5513.2 | 0 | −5513.2 |
| | y | 1641.7 | −29.643 | 1612.057 |
| | z | 4731.4 | −1772.6 | 2958.8 |

TABLE 1-continued

| Force Vectors on Adapters | | Front Reaction (N) | Joint Probe (N) | Total (N) |
|---|---|---|---|---|
| 904-2 | x | 6652.6 | 0 | 6652.6 |
| | y | −5018.3 | −119.39 | −5137.69 |
| | z | 399.02 | −5634.6 | −5235.58 |
| 904-4 | x | −6245.6 | 0 | −6245.6 |
| | y | 5.6106 | 0 | 5.6106 |
| | z | 2745.4 | 2626.7 | 5372.1 |

The information about the applied force at the proximate end of the drawbar 930, and related information (such as a result of a comparison of the force computation to a predetermined force threshold or limit value), may be provided to the towing vehicle for any number of useful purposes, such as displaying the information and/or related information to the vehicle operator or as input to a vehicle system such as a braking system, a stability system, a transmission system, a trailer backing system, or an engine controller system.

Figure 18B:
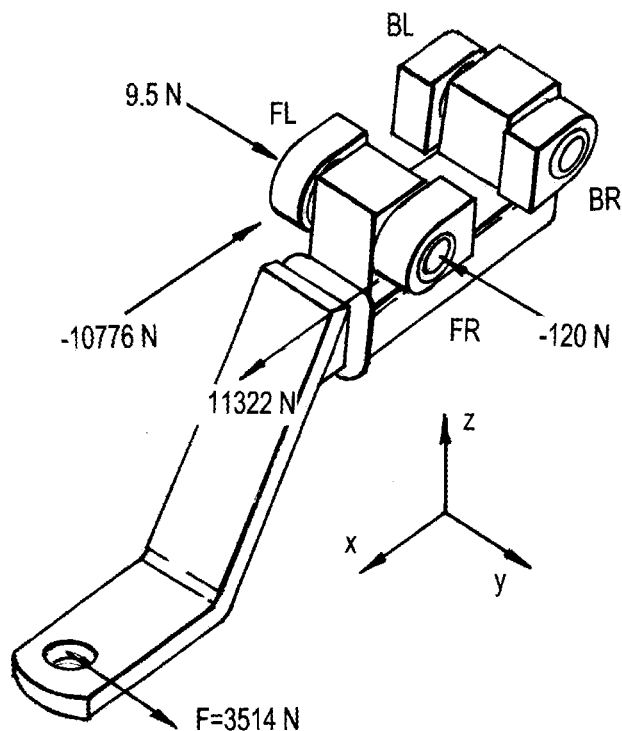
FIG. 18B is another simplified, partial, perspective view diagram of some of the components of the tow coupling apparatus of FIG. 14 showing a different load case.

Turning now to FIG. 18B, shown therein is another simplified, partial, perspective view diagram of some of the components of the tow coupling apparatus of FIG. 14 showing a different load case as summarized in the following table.

TABLE 2

| Force Vectors on Adapters | | Front Reaction (N) | Joint Probe (N) | Total (N) |
|---|---|---|---|---|
| 904-1 | x | 9285.7 | 0 | 9285.7 |
| | y | −3343 | 0 | −3343 |
| | z | −2947.5 | −1493.6 | −4441.1 |
| 904-3 | x | −9282.6 | 0 | −9282.6 |
| | y | 5.0979 | −65.01 | −59.9121 |
| | z | 5260.1 | −1087.9 | 4172.2 |
| 904-2 | x | 11322 | 0 | 11322 |
| | y | 8.541 | −128.91 | −120.369 |
| | z | 893.49 | −5098.8 | −4205.31 |
| 904-4 | x | −10776 | 0 | −10776 |
| | y | 9.5836 | 0 | 9.5836 |
| | z | 2265.8 | 2208.5 | 4474.3 |

Figure 19A:
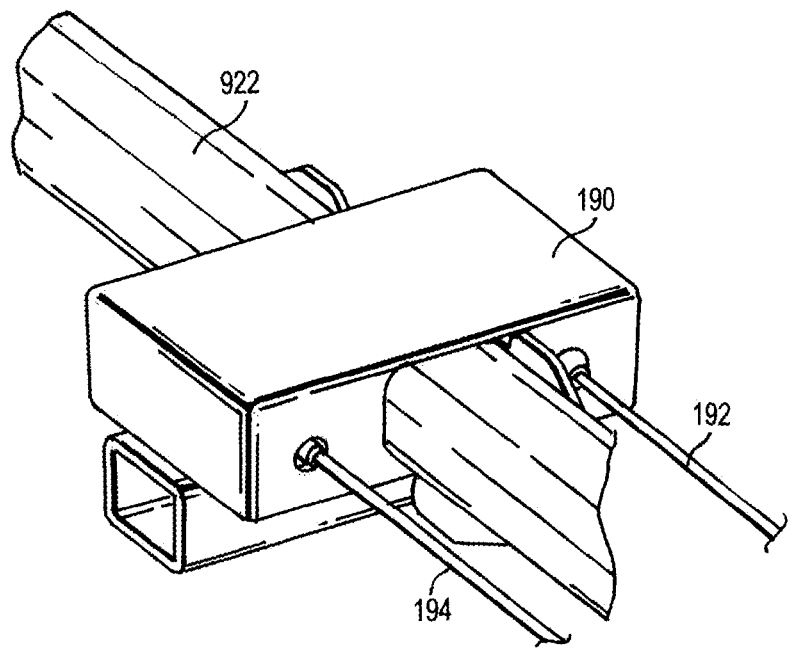
FIG. 19A is a simplified, partial, perspective view diagram of the vehicle tow coupling apparatus of FIG. 14 with a shielding device.
Figure 19B:
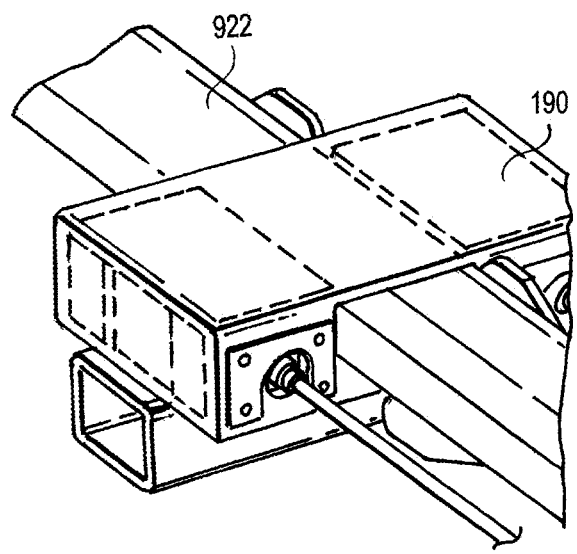
FIG. 19B is a semi-transparent diagram of FIG. 19A.
Figure 19C:
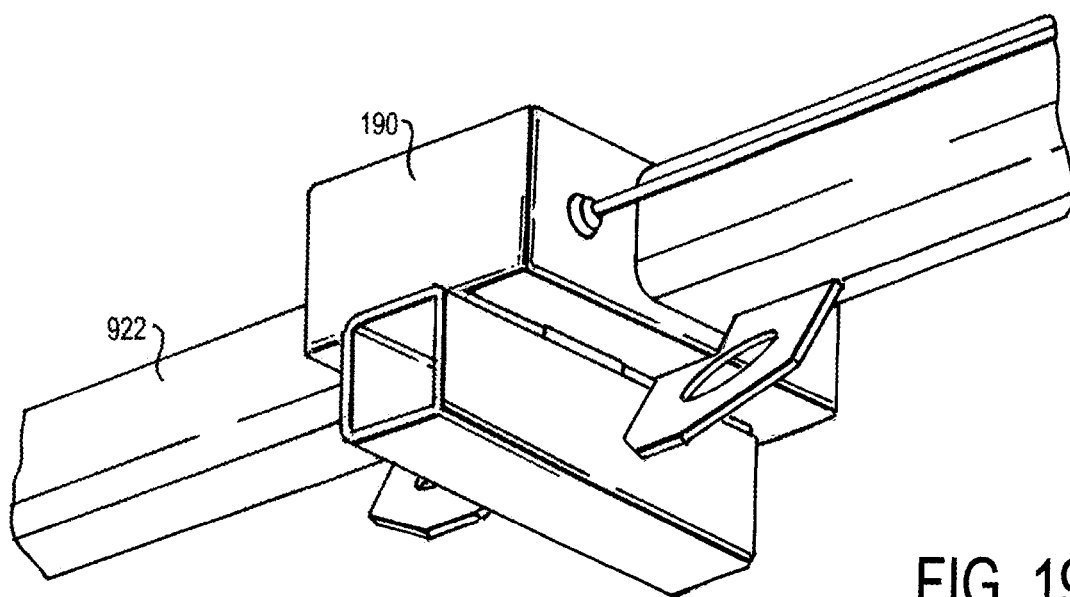
FIG. 19C is another view of the shielding device of FIG. 19A.

Turning now to FIG. 19A, FIG. 19B, and FIG. 19C, shown therein are simplified, partial, perspective view diagrams of the vehicle tow coupling apparatus of FIG. 14 in which a shielding device 190 is used to surround the load sensor pins 8, 9 for shielding the magneto-elastically active portions 140a, 140b and the magnetic field sensors 914a, 914b from external magnetic fields. The shielding device 190 is preferably made from or utilizes highly magnetically permeable materials to conduct external magnetic fields away from the load sensor pins 8, 9. The shielding device 190 provides openings for sheathed cables 192, 194, which connect the electronics of the load sensor pins 8, 9 to external circuits, to pass through the shielding device 190. In case of an AC near field source, even a thin metal shielding device 190 is able to provide good shielding. An external AC magnetic field will create eddy currents inside of the shield material, which in turn will create a magnetic field that opposes the incident field, thereby cancelling the incident field. The shielding material may be magnetic or non-magnetic but should have a high electric conductivity.

Figure 20:
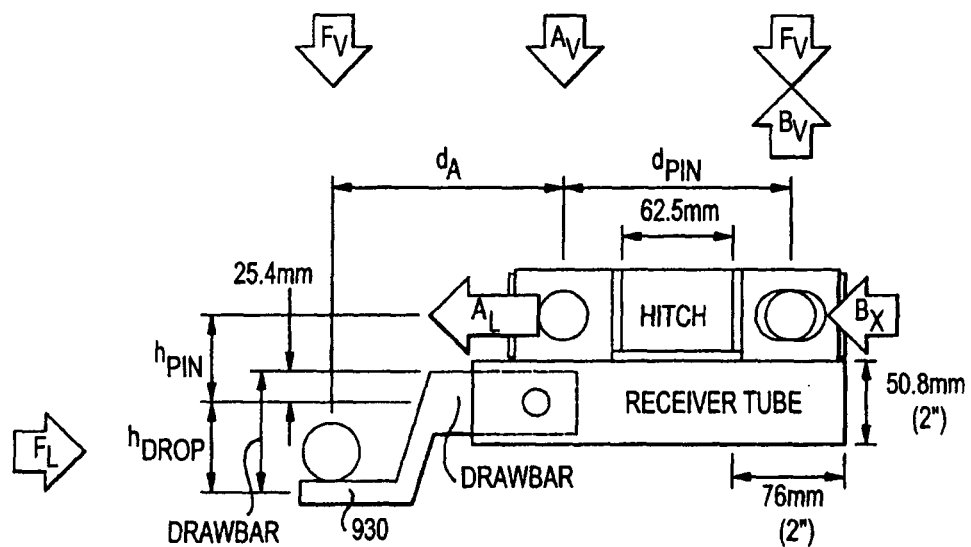
FIG. 20 is a simplified, side view diagram of the tow coupling apparatus of FIG. 14 showing another load case.

Turning now to FIG. 20, shown therein is a simplified, side view diagram of the tow coupling apparatus of FIG. 14 showing another load case. In particular, a drawbar 930 with a ball-style hitch (typically welded or bolted to the proximate or free end of the drawbar 930) is shown inserted in the receiver tube 920 and held in place with a fastening pin (other devices for connecting the drawbar and receiver are also contemplated). The large arrows indicate the forces that might act on the assembled tow coupling apparatus in the plane of the diagram (x-z plane, assuming the y-direction is out of the page).

An algorithm (such as in the form of embedded software in/on the load sensor pins 8,9 or in the separate module 980 (FIG. 12A)) may utilize values for the following variables (all linear dimensions are measured along the x- or z-direction as shown):

TABLE 3

| Variable/Parameter | Type/Description |
|---|---|
| Load sensor pin, outer diameter | Length (mm) |
| Load sensor pin, inner diameter | Length (mm) |
| Load sensor pin, width overall | Length (L) (mm) |
| Load sensor pin, height | Length ($h_{pins}$) (mm) |
| Drawbar drop | Length (mm) |
| Drawbar drop height | Length ($h_{drop}$ (mm)) |
| Distance to back load sensor pin 9 | Length ($d_A$) (mm) |
| Distance between load sensor pins | Length ($d_{pins}$) (mm) |
| Drawbar fastening pin hole size, diameter | Length (mm) |
| Distance between the end of the drawbar and the drawbar fastening pin hole | Length (mm) |
| Distance between the coupling point (ball) and the drawbar fastening pin hole | Length (mm) |
| Distance of the material between the two load sensor pins | Length (mm) |
| Distance from the back load sensor pin to the back end of the tow coupling apparatus | Length (mm) |
| Distance between the drawbar fastening pin hole and the front load sensor pin | Length (mm) |

Inputs associated with each of the above variables will be processed by the aforementioned processor which executes software algorithms that are embedded in/on the memory or storage device on the printed circuit boards 304, 604 of the load sensor pins 8, 9, or that are embedded in/on a printed circuit board of the separate module 980 outside the load sensor pins 8, 9. The inputs are used in at least the following equations:

$$\sum F_L = 0: \tag{1}$$

$$F_L - A_L = 0 \tag{2}$$

$$\sum F_V = 0: \tag{3}$$

$$F_V + A_V - B_V = 0 \tag{4}$$

$$\sum M_A = 0 \tag{5}$$

$$B_V \cdot d_{Pins} + F_V \cdot d_A + F_L \cdot (h_{Pins} + h_{Drop}) = 0 \tag{6}$$

$$A_L = F_L \tag{7}$$

$$A_V = -F_V + B_V \tag{8}$$

$$B_V = \frac{-F_V \cdot d_A - F_L \cdot (h_{Pins} + h_{Drop})}{d_{Pins}} \tag{9}$$

In one embodiment, the software computes a tongue force (F-tongue), tow force (F-tow), and a sway force (F-sway) according to industry-specific and federal specifications, such as those of Ultimate Load (per SAE J684 for Hitch Test Loads), and Ultimate Loads (per SAE J684 Strength Test Loads for Balls and Trailer couplings). Other methods and standards may also be used, including those for other countries/regions (e.g., European Union).

In another embodiment, the embedded software may be used to receive signals from various other sensors (not shown) and output a signal containing information useful in determining or assessing a load weight gauge (measuring the tongue load of a coupling between the tow and towing vehicles), a tow load weight shift alert, an unsafe towed vehicle load distribution alert, a towing vehicle limit notification, an automated towed vehicle brake control (closed loop) signal, a low/flat towed vehicle tire notification, a check towed vehicle brake notification, a closed loop braking control, a towing vehicle shift control, a towing vehicle engine control, and a towing vehicle stability control.

In still another embodiment, the software may provide a signal corresponding to a value in a pre-determined output range (provided in, e.g., N and lb), an ultimate or maximum load weight carrying output (provided in, e.g., N and lb), and an ultimate or maximum ball load and trailer hitch output (also in, e.g., N and lb).

Additional software inputs may include load sensor pin outer diameter, inner diameter, wall thickness, free length L, and sheer points (all in millimeters). Calculated stress values may include maximum sheer stress and bending stress, among others (all in $N/mm^2$). A static safety factor may also be computed.

Figure 21:
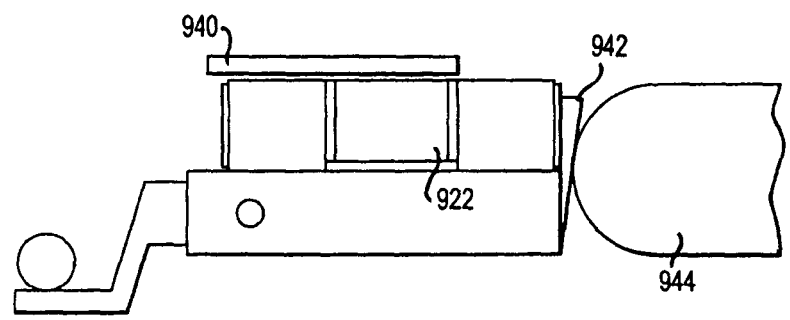
FIG. 21 is a simplified, side view diagram of a tow coupling apparatus and vehicle components.

Turning now to FIG. 21, shown therein is a simplified, side view diagram of a tow coupling apparatus and vehicle components. In particular, the tow coupling apparatus is mounted such that it does not interfere with a bumper step 940 (which is above the hitch tube 922) and spare tire 944 (which is behind the hitch tube 922, in some cases by only a few inches, such as 3 inches). Spare tires stored below a towing vehicle's body frame or other components are typically lowered to the ground by a cable and winch mechanisms (not shown), and can swing on the cable and potentially strike the tow coupling apparatus. To ensure that the spare tire 944 avoids striking the tow coupling apparatus upon being raised or lowered, an angled guide member 942 is positioned forward of the tow coupling apparatus and between the tow coupling apparatus and the spare tire 944 as shown.

Figure 22:
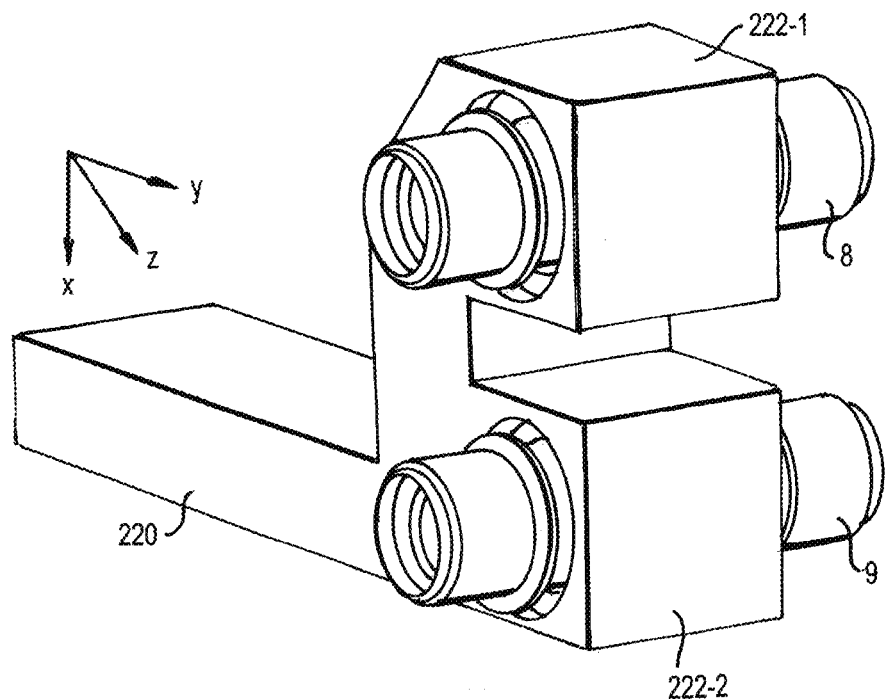
FIG. 22 is a simplified, perspective view diagram of one component of a tow coupling apparatus showing upper and lower load sensor pins 8, 9.
Figure 23:
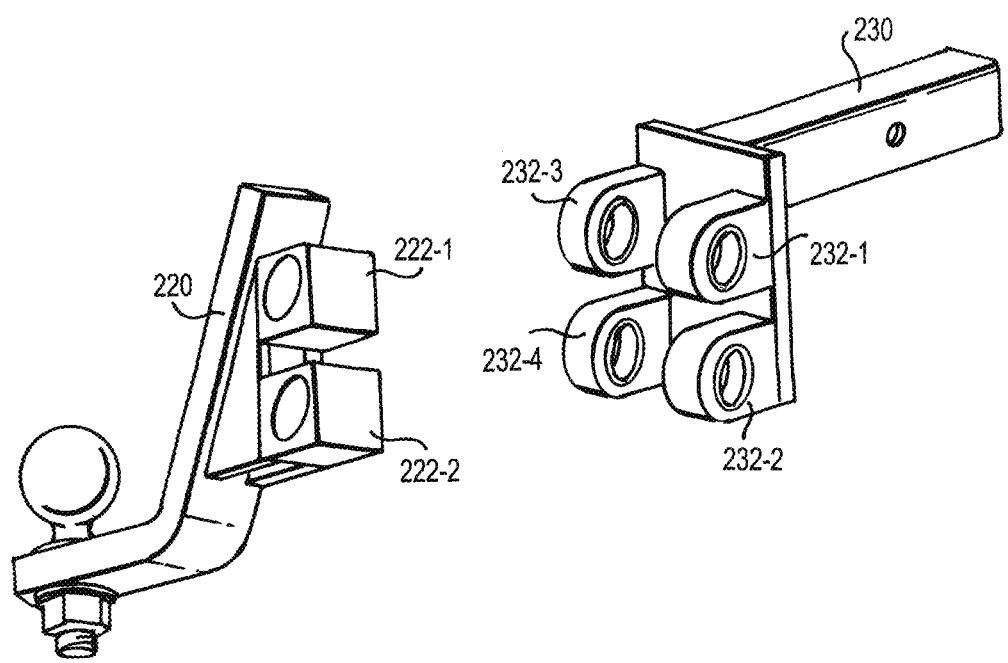
FIG. 23 is a simplified, perspective view diagram of the coupling components of a vehicle tow coupling apparatus.
Figure 24:
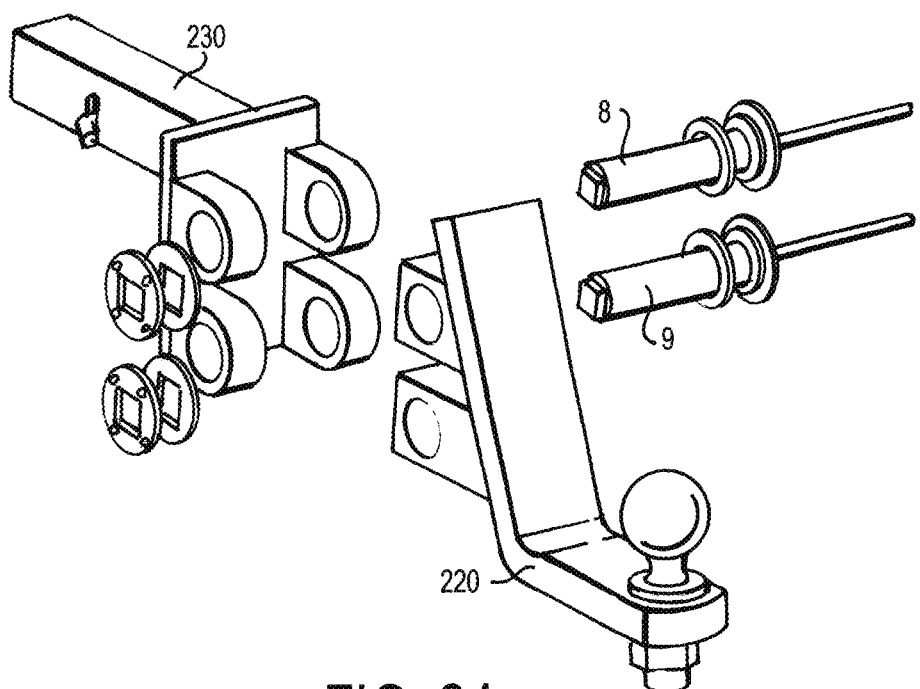
FIG. 24 is a simplified, perspective, exploded view diagram of some of the components of another tow coupling apparatus.

Turning now to FIG. 22 through FIG. 27, shown therein are simplified, schematic, exploded, perspective and plan view diagrams of another tow coupling apparatus for coupling a towing vehicle to a towed vehicle. FIG. 22 is a simplified, perspective view diagram of one component of a tow coupling apparatus showing upper and lower load sensor pins 8, 9 for use with a towed vehicle coupler 220, which mates with a towing vehicle coupler 230. In the embodiments shown, the load sensor pins 8, 9 are arranged generally vertically (along z-axis) with respect to each other (as compared to, for example, the embodiments of FIG. 13 and FIG. 14, in which the load sensor pins 8, 9 are arranged horizontally (along x-axis)). The two load sensor pins 8, 9 are positioned in the towed vehicle coupler 220 in respective upper and lower brackets 222-1, 222-2, with or without bushings. The towing vehicle coupler 230 includes four adapters 232-1, 232-2, 232-3, 232-4 such that the through-holes on the upper bracket 222-1 are axially aligned with the through-holes of the adapters 232-1, 232-2, and the through-holes on the lower bracket 222-2 are axially aligned with the through-holes of the adapters 232-3, 232-4. When aligned, the load sensor pins 8, 9 may be rigidly fixed in the through-holes, such that the couplers 220 and 230 may be coupled together as illustrated in FIG. 24.

Figure 25:
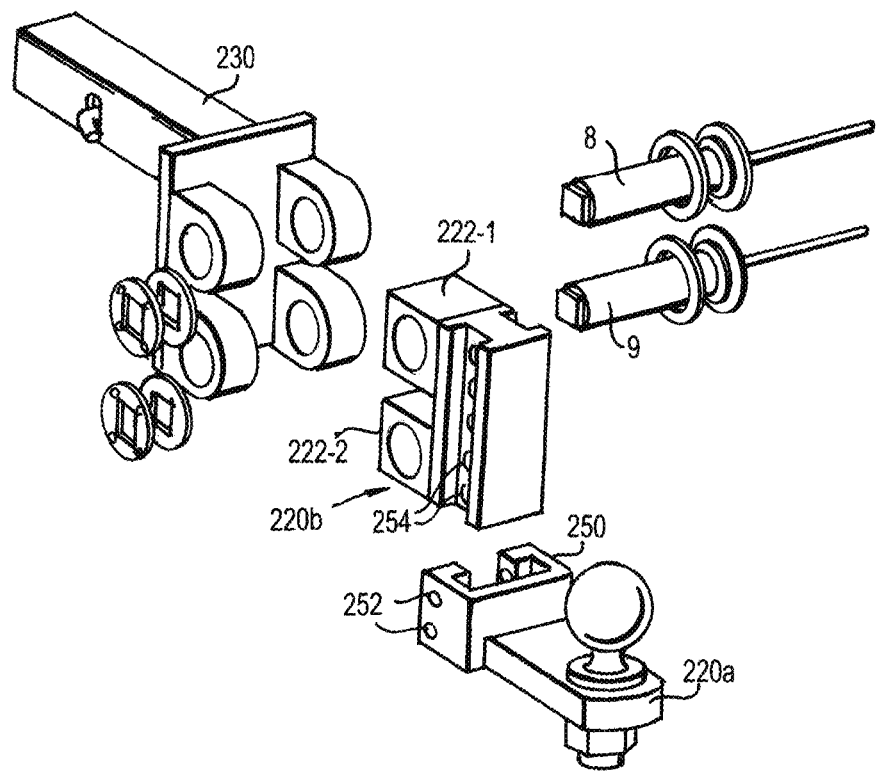
FIG. 25 is another simplified, perspective, exploded view diagram of the modified components of the tow coupling apparatus of FIG. 24.
Figure 26:
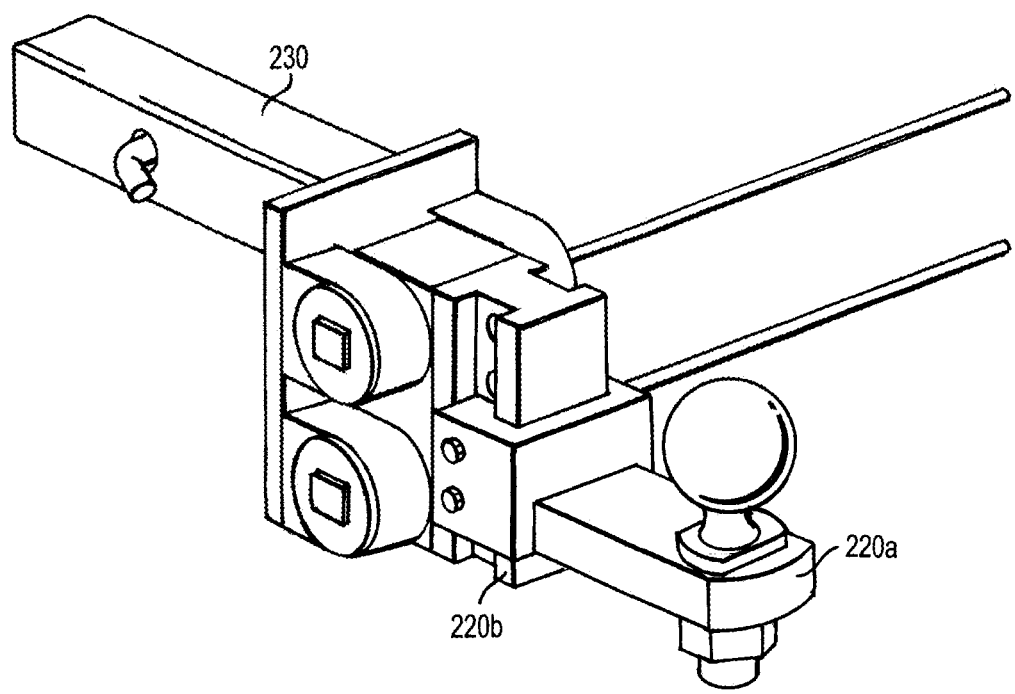
FIG. 26 is a simplified, perspective view diagram of the components of the tow coupling apparatus of FIG. 24.

In FIG. 25, the towed vehicle coupler 220 is modified such that it includes a hitch part 220a having a bracket 250 and through-holes 252, and a coupler part 220b having through-holes 254. The through-holes 252, 254 permit a user to vertically adjust (z-axis) the relative position of the hitch part 220a and the coupler part 220b with respect to each other (a fastening pin, not shown, is inserted into the through-holes 252, 254, once they are axially aligned). When the hitch part 220a, couplers part 220b, and towing vehicle coupler 230 aligned, the load sensor pins 8, 9 may be rigidly fixed in the through-holes, such that the tow coupling apparatus may be coupled together as illustrated in FIG. 26.

Figure 27:
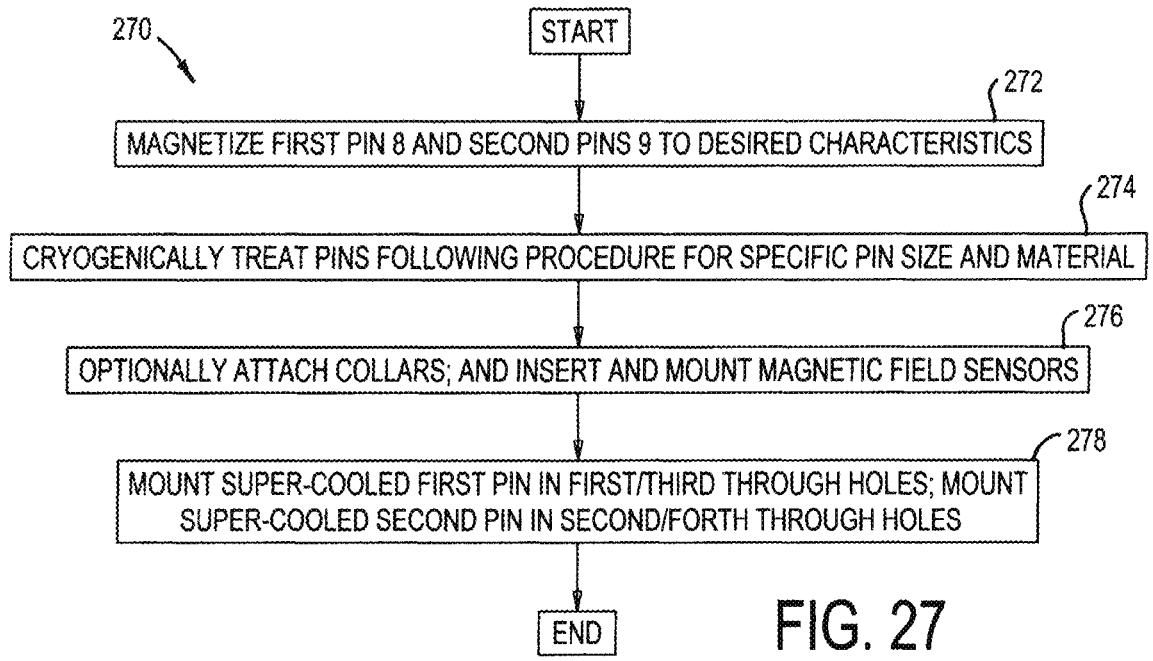
FIG. 27 is a simplified, process flow diagram of a method of cryogenically treating a load sensor pin.

Turning now to FIG. 27, shown therein is a simplified, process flow diagram 270 describing a method for rigidly fixing the load sensor pins 8, 9 inside the brackets and adapters as shown and described above. As an initial step, the load sensor pins 8, 9 are first received along with the various tow coupling apparatus components. With reference to FIG. 13, for example, these would include providing a bracket 902 attached to a receiver tube 920, and a generally U-shaped adapter 904 attached to a hitch tube 922.

In a first treatment step 272, the first magneto-elastically active region 21 and the second magneto-elastically active region 22 of the load sensor pins 8, 9 are each directly or indirectly attached to or form respective parts of the load sensor pins 8, 9, such that the load sensor pins 8, 9 will have the characteristics previously described (the magneto-elastic properties are described in more detail in the aforementioned Applicant's patents incorporated by reference).

In a second treatment step 274, when it is desired for the load sensor pins 8, 9 to have one or more collars (not shown) around all or a portion of the end portions 130a, 130b of the load sensor pins 8, 9, the collars are arranged such that the positions of the one or more collars substantially correspond to one or more of the positions of the through-holes 924-1, 924-2 on the side wall 904b of the bracket 904, and through-holes 924-3, 924-4 on the side wall 904a of the bracket 904. Also, when it is desired for the bracket 902 and adapter 904 to be configured in such a way as to provide a gap therebetween, a gap material may be inserted.

In the next step 276, the load sensor pins 8, 9, and when necessary the collars/bushing 906a, 906b, 906c, 906d, 908a, 908b, 908c, 908d (as best seen in FIG. 9), may be cryogenically treated to reduce their cross-section dimension to permit inserting in the respective through-holes.

In the next step 278, respective printed circuit board 304, 604 with magnetic field sensors are mounted or arranged proximate to the magneto-elastically active portion 140a, 140b either before or after the load sensor pins 8, 9 are treated and positioned in the respective through-holes after being treated.

In a next step, the cryogenically treated load sensor pins 8, 9, and the various tow coupling apparatus components described above are all aligned. The load sensor pins 8, 9 are then inserted and the load sensor pins 8, 9 and other components are allowed to return to ambient temperature. The cryogenic treatment process may be conducted in conjunction with (such as following) a heat treatment process performed on the load sensor pins 8, 9. Both treatment processes are performed in a manner such that crystalline changes following magnetization of the load sensor pins 8, 9 is avoided.

Figure 28A:
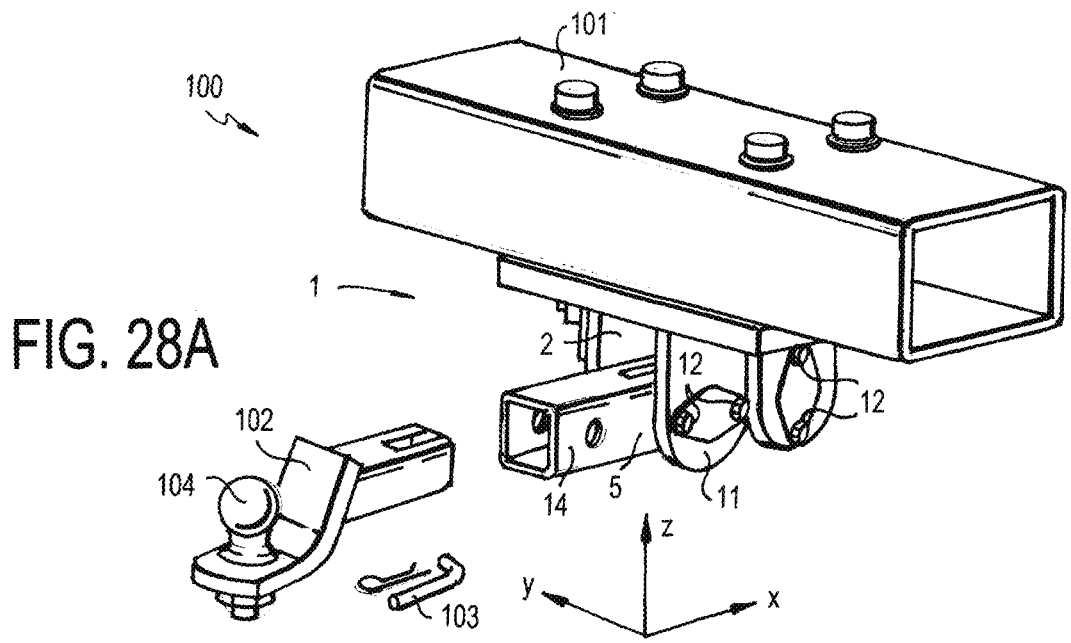
FIG. 28A is a simplified, partial, exploded, perspective view diagram of a tow coupling apparatus including load sensor pins 8, 9.
Figure 28B:
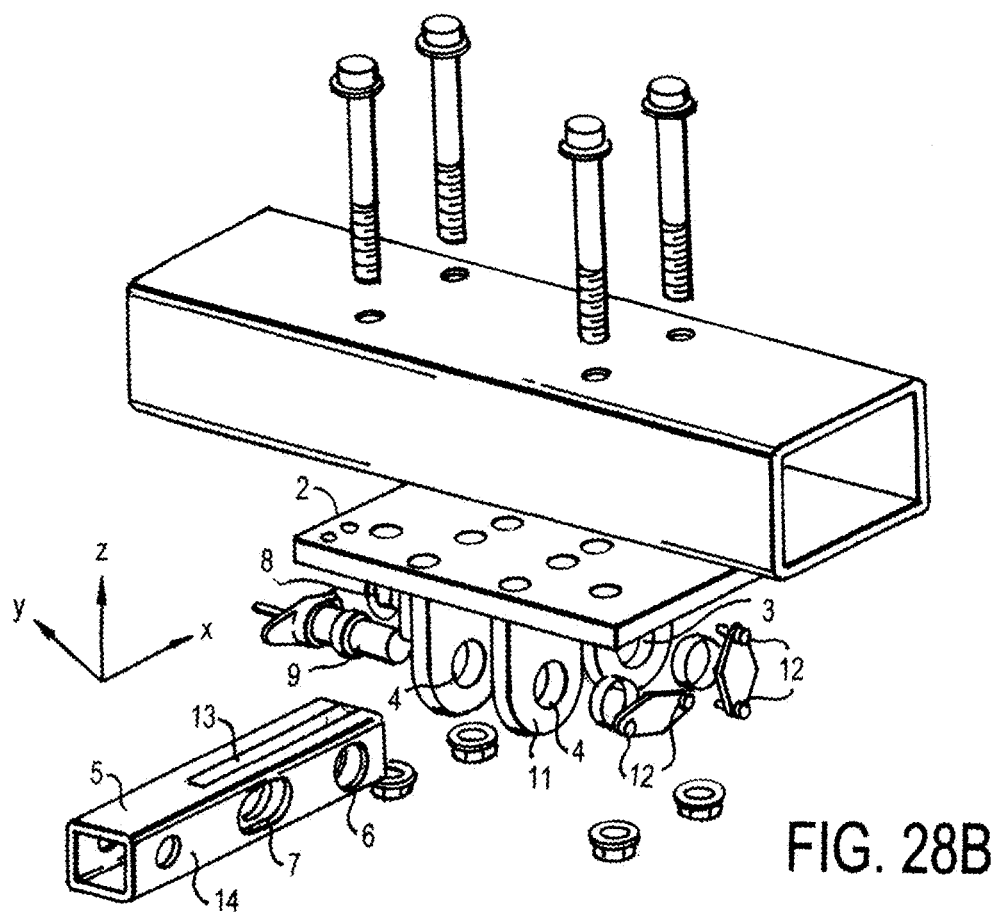
FIG. 28B is another simplified, partial, exploded, perspective view diagram of the tow coupling apparatus of FIG. 28A.

Turning now to FIG. 28A and FIG. 28B, shown therein are simplified, partial, exploded, perspective view diagrams of another type of vehicle tow coupling apparatus 100 incorporating the load sensor pins 8, 9. The tow coupling apparatus 100 includes a sensor assembly 1 for force sensing. The sensor assembly includes a first portion 2 (supporting yoke) having a first through-hole 3 and a second through-hole 4, a second portion 5 (receiving tube) having a third through-hole 6 and fourth through-hole 7. The third and fourth through-holes 6, 7 are positioned in correspondence to the first and second through-holes 3, 4.

The second portion defines a Cartesian coordinate system having a longitudinal x-axis direction, a transversal y-axis direction, and a vertical z-axis direction. The longitudinal direction extends in the direction of longitudinal extension of the second portion. The transversal direction extends in a direction perpendicular to the longitudinal direction and in a horizontal plane. The vertical direction extends in a direction that perpendicular to the longitudinal direction and the transversal direction.

The sensor assembly 1 further includes a first load sensor pin 8 and a second load sensor pin 9. The load sensor pin 8 is arranged such that it extends through the first and third through-holes 3, 6. The load sensor pin 9 is arranged such that it extends through the second and fourth through-holes 4, 7. The first portion 2 is coupled to the second portion 5 via the first and second load sensor pins 8, 9.

Figure 30:
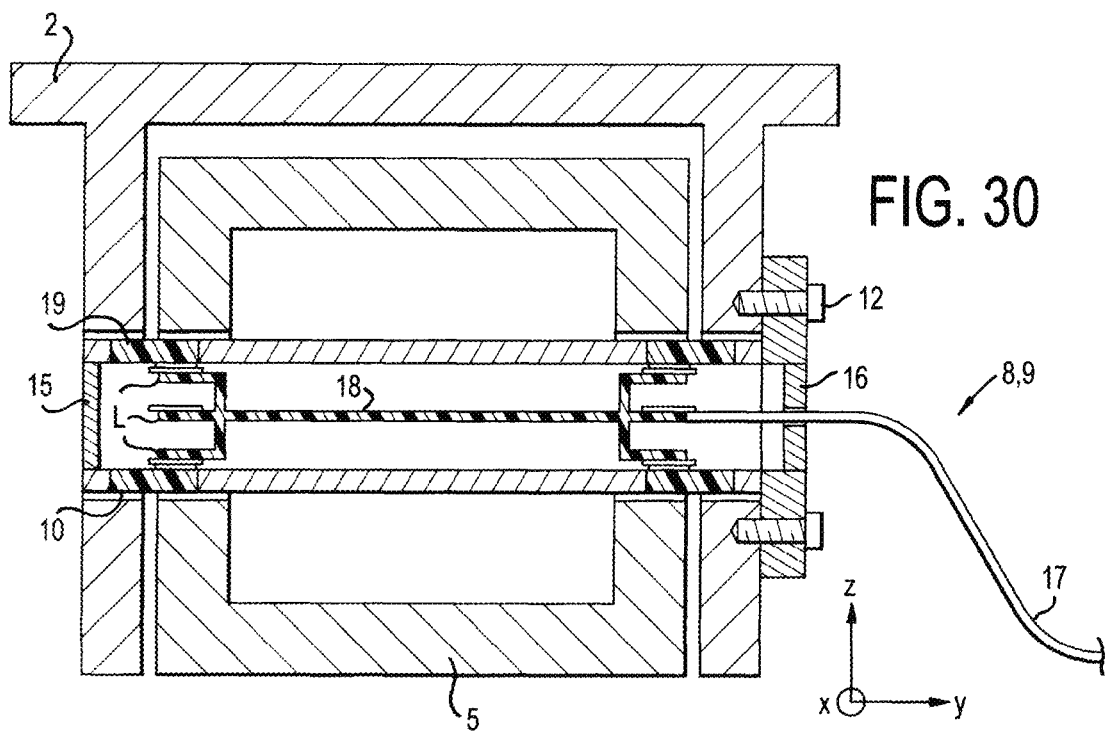
FIG. 30 is a simplified, partial, cross-sectional view diagram of the tow coupling apparatus of FIG. 28A.

At least one out of the first and the second load sensor pin 8, 9 includes at least one magneto-elastically active region 10 (as shown in FIG. 30) that is directly or indirectly attached to or forms a part of the load sensor pin 8, 9 in such a manner that mechanic stress of the load sensor pin 8, 9 is transmitted to the magneto-elastically active region 10. The magneto-elastically active region 10 includes at least one magnetically polarized region such that a polarization of the polarized region becomes increasingly helically shaped as the applied stress increases.

The at least one load sensor pin 8, 9 further includes a magnetic field sensor means arranged approximate the at least one magneto-elastically active region 10 for outputting a signal corresponding to a stress-induced magnetic flux emanating from the magnetically polarized region.

The magnetic field sensor means includes at least one direction sensitive magnetic field sensor L. The at least one direction sensitive magnetic field sensor is configured for determination of a shear force in at least one direction. The at least one direction sensitive magnetic field sensor L is in particular arranged to have a predetermined and fixed spatial coordination with the respective load sensor pin 8, 9.

The load sensor pin 8, 9 includes the at least one direction sensitive magnetic field sensor L is at least partially hollow. The at least one direction sensitive magnetic field sensor L is arranged inside the interior of the pin 8, 9.

The first through-hole 3 and the third through-hole 6 are configured such that they encompass the first load sensor pin 8 in a positive-fitting manner. In other words, the first load sensor pin 8 extends through the first and third through-holes 3, 6, and the first load sensor pin 8 is supported in at least two rotational degrees of freedom and at least two translational degrees of freedom by abutting surfaces of the through-holes.

The second load sensor pin 9 is encompassed by the second through-hole 4 in a positive-fitted manner. In other words, the second load sensor pin 9 extends through the second through-hole 4, and the second load sensor pin 9 is supported in at least two rotational degrees of freedom and at least two translational degrees of freedom by abutting surfaces of the second through-hole 4.

The fourth through-hole 7 is configured such that the second load sensor pin 9 has one additional degree of freedom of movement (compared to the first load sensor pin 8 in the third through-hole 6) within the fourth through-hole 7. Differently stated, the second load sensor pin 9 extends through fourth through-hole 7, and the second load sensor pin 9 is supported in at least two rotational degrees of freedom and at least one translational degree of freedom by abutting surfaces of the through-holes. The number of translational degrees of freedom of the second load sensor pin 9 in the fourth through-hole 7 is one more than the number of translational degrees of freedom of the first load sensor pin 8 the third through-hole 6.

The additional degree of freedom is a translational degree of freedom that extends in the longitudinal x-axis direction.

The first portion 2 has a yoke-like shape, wherein yoke legs 11 of the first portion comprise the first through-hole 3 and second through-hole 4. The second portion 5 has a tubular shape, wherein side walls and/or a center wall of the second portion 5 comprise the third through-hole 6 and the fourth through-hole 7.

The direction sensitive magnetic field sensor is (or the direction sensitive magnetic field sensors are) configured to detect force components of shear forces introduced into the load sensor pins 8, 9 by the first portion 2 and the second portion 5.

The first and/or second load sensor pin 8, 9 is fixedly attached (in all six degrees of freedom in a predetermined manner to the first portion 2. Bolts 12 screw the load sensor pins 8, 9 (via attachment flanges of the pins) to yoke legs 11 of the first portion 2.

Figure 29:
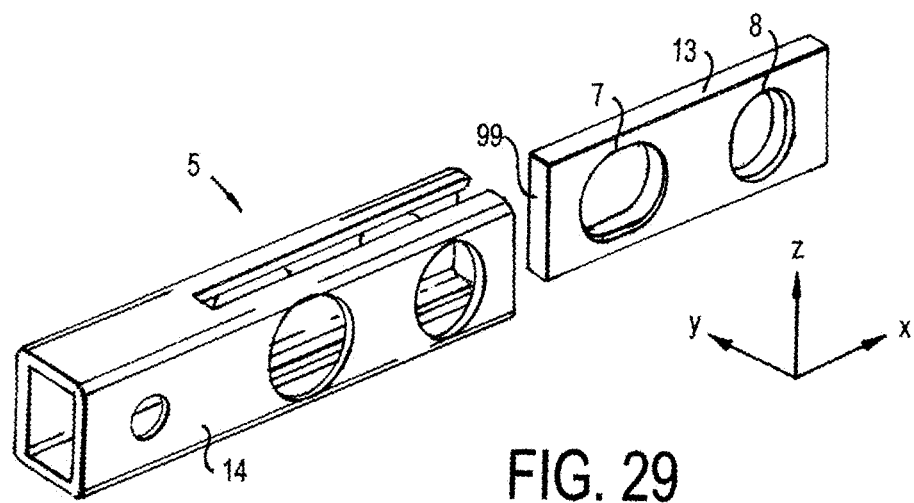
FIG. 29 is a simplified, exploded, perspective view diagram of some of the components of the vehicle tow coupling apparatus of FIG. 28A.

The second portion 5 includes a center wall 13 extending in the longitudinal x-axis direction and the vertical z-axis direction, the third through-hole 6 and fourth through-hole 7 extend through the center wall 13 (as best seen in FIG. 29).

The first portion 2 has a yoke-like shape, wherein the yoke legs 11 of the first portion 2 comprise the first and second through-holes 3, 4, and wherein the center wall includes the third and fourth through-holes 6, 7.

Direction sensitive magnetic field sensor(s) L is/are configured to detect force components of shear forces introduced into the load sensor pins 8, 9 by the first portion 2 and the second portion 5.

Side walls 14 of the second portion 5 comprise through-holes in side walls that are larger than the third and fourth through-holes 6, 7, such that the shear forces are introduced into the load sensor pins 8, 9 by abutment surfaces of the first and second through-holes 3, 4 in the yoke legs 11 and abutment surfaces of the third and fourth through-holes 6, 7 in the center wall 13.

The tow coupling apparatus 100 includes the sensor assembly 1. The first portion 2 is a tow coupling apparatus that is attached to a hitch tube 101 of a towing vehicle.

The second portion 5 is a receiving tube that is configured to receive a drawbar 102 (hitch bar, ball mount) of the tow coupling apparatus 100. The drawbar 102 can be partially inserted into the second portion 5. A pin 103 secures the drawbar 102 to the second portion 5.

Turning now to FIG. 30, shown therein is a simplified, cross-sectional view diagram of another tow hitch sensor assembly including first and second load sensor pins 8, 9 extend through the first through-hole 3 and the second through-hole 4 in the first portion 2 and through the third through-hole 6 and the fourth through-hole 7 in the second portion 5. The first and/or second load sensor pins 8, 9 is an at least partially hollow pin that may be sealed by a front cover 15 and a rear cover 16. The rear cover 16 may provide a cable bushing to provide access for supply and/or signal lines 17. The load sensor pins 8, 9 include a plurality of direction sensitive field sensors L. A printed circuit board 18 supports the direction sensitive field sensors L. The load sensor pins 8, 9 can include one or more collars 19 of comparatively low magnetic permeability (compared to the hollow shaft of the load sensor pins 8, 9) arranged such that the positions of the one or more collars 19 substantially correspond to one or more of the positions of the through-holes 3, 4, 6, 7 in the first and/or second portion. Alternatively, one or more of the through-holes 3, 4, 6, 7 can comprise a collar/bushing 19 of comparatively low magnetic permeability (compared to the hollow shaft of the load sensor pins 8, 9). The first portion 2 and the second portion 5 may be configured to provide a gap between the first portion 2 and the second portion 5. The gap may comprise a material of low magnetic permeability (compared to the hollow shaft of the load sensor pins 8, 9).

Figure 31A:
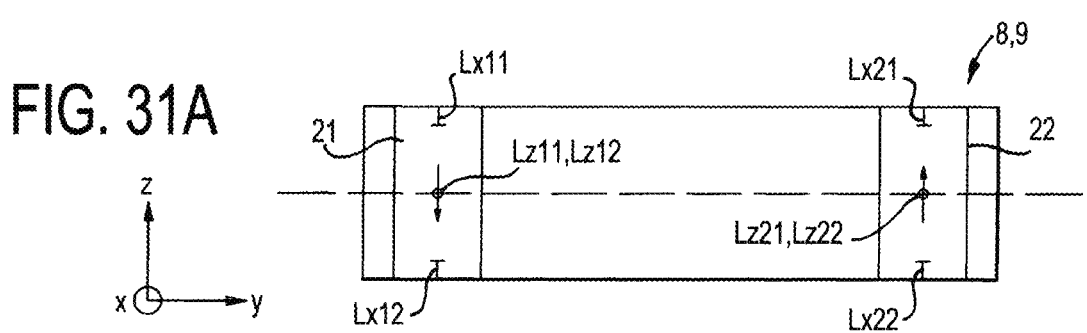
FIG. 31A is another simplified, plan view diagram of a load sensor pin.
Figure 31B:
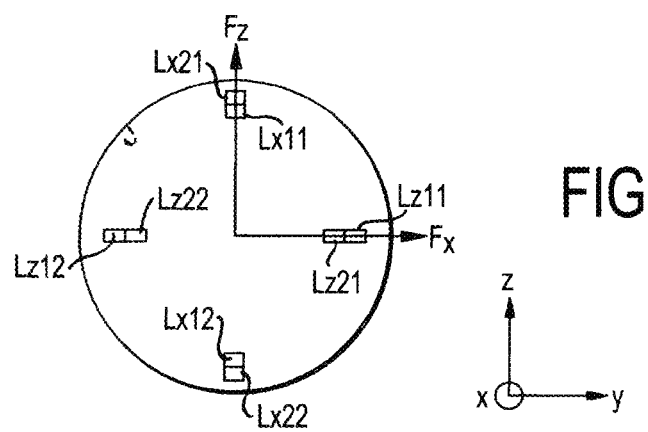
FIG. 31B is an end view diagram of the load sensor pin of FIG. 31A.

Turning now to FIG. 31A and FIG. 31B, shown therein are a simplified, partial, cross-sectional plan and end view diagrams of another configuration of the load sensor pins 8, 9 as used in, for example, the tow coupling apparatus of FIG. 30. The first and/or the second load sensor pin 8, 9 includes at least one respective first x-axis direction sensitive magnetic field sensor Lx11, Lx12 configured to detect a force component Fx1 in the first magneto-elastically active region 21 in the longitudinal x-axis direction. The first and/or the second load sensor pins 8, 9 includes at least one respective second x-axis direction sensitive magnetic field sensor Lx21, Lx22 configured to detect a force component Fx2 in the second magneto-elastically active region 22 in the longitudinal x-axis direction. The first and/or the second load sensor pins 8, 9 includes at least one respective first z-axis direction sensitive magnetic field sensor Lz11, Lz12 configured to detect a force component Fz1 in the first magneto-elastically active region 21 in the vertical x-axis direction. The first and/or the second load sensor pins 8, 9 includes at least one second z-axis direction sensitive magnetic field sensor Lz21, Lz22 configured to detect a force component Fz2 in the second magneto-elastically active region in the vertical z-axis direction.

The sensor means includes at least four magnetic field sensors L having a first to fourth sensing direction, wherein the sensing directions and a shaft axis A (FIGS. 32A and 32B) are at least substantially parallel to each other. The first to fourth magnetic field sensors are arranged along the circumference of the load sensor pin 8, 9 having substantially equal distances in circumferential direction between each other.

The at least one magneto-elastically active regions 21, 22 project along a circumference of the respective load sensing pin 8, 9, wherein the regions are magnetized in such a way that the domain magnetizations in the magnetically polarized regions 21, 22 are in a circumferential direction of the member.

Figure 32A:
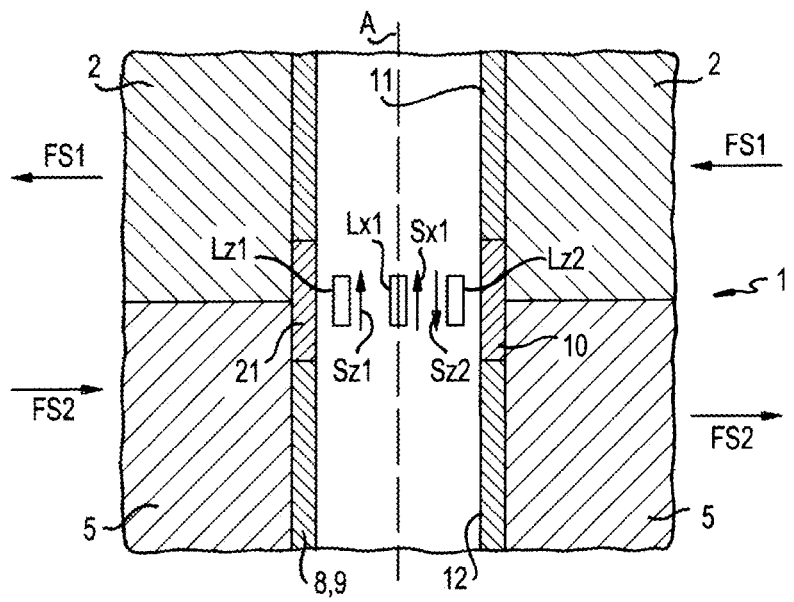
FIG. 32A is a simplified, partial, axial, cross-sectional view diagram of a load sensor pin for use in the tow coupling apparatus of FIG. 31A.
Figure 32B:
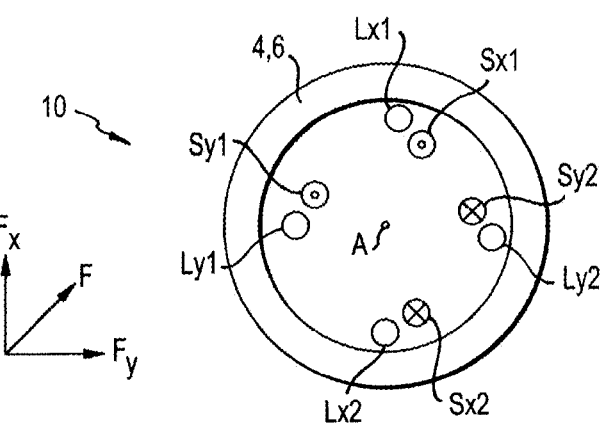
FIG. 32B is a simplified, partial, cross-section, end view diagram of the load sensor pin of FIG. 32A.

Turning now to FIG. 32A and FIG. 32B, shown therein are simplified, partial, axial, cross-sectional view diagrams of a load sensor pin 8, 9 for use in a tow coupling apparatus, in which a sensor assembly 1 has a first portion 2 coupled to a second portion 5 via the load sensor pins 8, 9. The first portion 2, which may correspond to the adapter 904, is subject to a first shear force FS1 pointing to the left. The second portion 5, which may correspond to the bracket 902, is exposed to a second and opposite shear force FS2, pointing to the right. The load sensor pin 8, 9 includes a magneto-elastically active region 21, which is arranged at the transition between the first and the second portion 2, 5. Consequently, the active region 21 is subject to shear forces causing the magnetic flux emanating from the magnetically polarized region of said active region 21 to become increasingly helically shaped, when the shear forces FS1, FS2 increase. The sensor means of the load sensor pins 8, 9 includes four direction sensitive magnetic field sensors Lx1, Lx2, Lz1, Lz2 being arranged along the inner circumference of the load sensor pin 8, 9.

The first direction sensitive sensor Lx1 and the third direction sensitive sensor Lx2 form a first group of magnetic field sensors.

The second group of sensors consists of the second direction sensitive sensor Lz1 and the fourth direction sensitive sensor Lz2.

The sensing direction Sx1 of the first sensor Lx is 180 degrees opposite to the third sensing direction Sx2 of the third sensor Lx2.

The first sensing direction Sx1 points out of the paper plane, the third sensing direction Sx2 points into the paper plane.

Similar to the first group of sensors Lx1, Lx2, the second sensing direction Sz1 and the fourth sensing direction Sz2 are 180 degrees opposite to each other.

The second and fourth sensor Lz1, Lz2 are arranged accordingly.

As it is indicated using the commonly known direction signs, the second sensing direction Sz1 points out of the paper plane while the fourth sensing direction Sz2 is directed into the paper plane.

The second sensor Lz1 (having the second sensing direction Sz1) and the fourth sensor Lz2 (having the fourth sensing direction Sz2) are shown.

The first sensor Lx1 and the first sensing direction Sx1 are shown solely for clarification of the configuration of the sensors. Naturally, the first sensor Lx1 is not arranged in a common plane with the second and fourth sensor Sz1, Sz2.

FIG. 32B shows a simplified cross section of a load sensor pin 10 according to another embodiment, which includes a first or upper member 11, which is coupled to a second or lower member 12 via the shaft like member 4. The upper member 11 is subject to a first shear force FS1 pointing to the left. The lower member 12 is exposed to a second and opposite shear force FS2, pointing to the right. The shaft like member 4 includes an active region 6, which is arranged at the transition between the upper and lower member 11, 12. Consequently, the active region 6 is subject to shear forces causing the magnetic flux emanating from the magnetically polarized region of said active region 6 to become increasingly helically shaped, when the shear forces FS1, FS2 increase. The sensor means of the load sensor pin 10 includes four direction sensitive magnetic field sensors LX1, LX2, LY1, LY2 being arranged along the inner circumference of the shaft like member 4.

Figure 33:
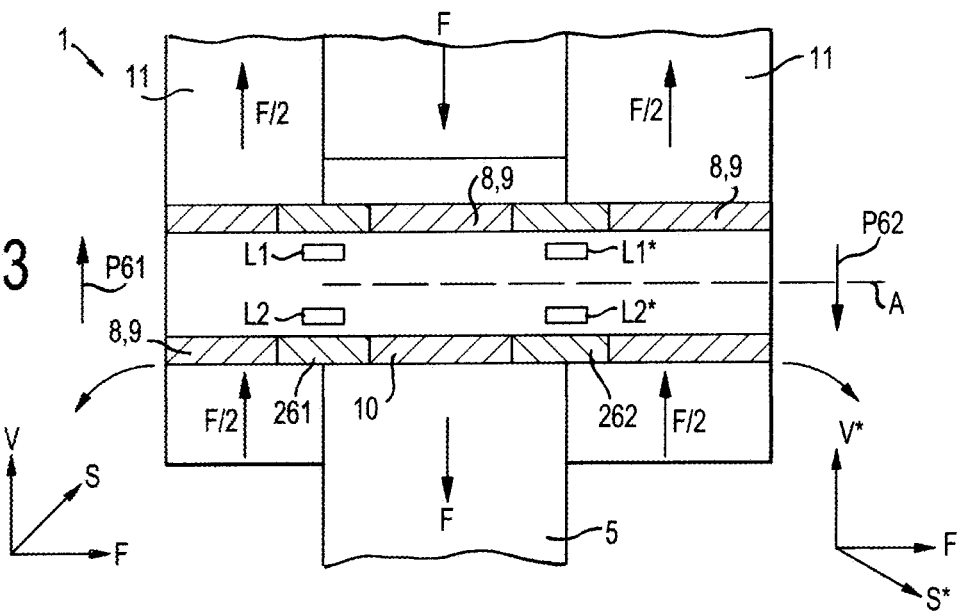
FIG. 33 is simplified, partial, cross-sectional view diagram of a load sensor pin for use in a tow coupling apparatus.

Turning now to FIG. 33, shown therein is a simplified, cross-sectional view diagram of some of the components of a tow coupling apparatus in which the first portion 2 surrounds the second portion 5, which is exposed to a force F. The load sensor pin 8, 9 intersects the first and the second portions 2, 5 along the shaft axis A. The load sensor pin 8, 9 includes a first magneto-elastically active region 261 and a second magneto-elastically active region 262. Similar to the other embodiments of the invention, these regions are directly or indirectly attached to or form a part of the load sensor pin 8, 9 in such a manner that the mechanic stress is transmitted to the active regions 261, 262. The active regions 261, 262 are magnetically polarized in opposite circumferential directions, P61, P62, which are substantially 180 degrees opposite to each other. Furthermore, the directions of polarizations are substantially perpendicular to the shaft axis A.

A first pair of magnetic field sensors comprising a first sensor L1 and a second sensor L2 arranged inside the load sensor pin 8, 9 in that this pair of sensors cooperates with the first active region 261. Similar, a second pair of magnetic field sensors comprising a first and a second sensor L1* and L2* arranged inside the load sensor pin 8, 9 so as to interact with the second active region 262. The sensors L1, L2 of the first pair and the sensors L1*, L2* of the second pair are arranged approximate the first and the second magneto-elastically active region 261, 262, respectively. The first sensor pair L1, L2 outputs a first signal S, which is illustrated as a voltage V varying with the applied force F in the lower left of FIG. 33. The signal S corresponds to a stress-induced magnetic flux emanating from the first magnetically polarized region 261.

Similarly, the second pair of magnetic sensors L1*, L2* outputs a second signal S* corresponding to a stress-induced magnetic flux emanating from the second magnetically polarized region 262. This signal S* is also a voltage V* varying with the applied F (see lower right of FIG. 33). However, the slope of the second signal S* is opposite to that of the first signal S. A control unit (not shown) of the magneto-elastic sensor assembly is configured for determination of the force F inducing a stress in the load sensor pin 8, 9. The control unit performs a differential evaluation of the signals S and S* of the first pair of sensors L1, L2 and the second pair of sensors L1*, L2*. This differential evaluation advantageously doubles the sensitivity of the signal, which is correlated with the applied stress. Because the polarization P61 and P62 of the first and second magnetically active region 261, 262 is opposite to each other, theoretically possible external fields are compensated. The magneto-elastic sensor assembly according to this embodiment is more sensitive and less susceptible to errors.

Advantageously, all embodiments of the invention may be equipped with the sensor configuration of FIG. 33 having separate, oppositely polarized active regions 261, 262 and two corresponding sets i.e. pairs of sensors L1, L2 and L1*, L2*.

Furthermore, the embodiment of FIG. 8 may be equipped with the sensor configuration, which is known from the load pin in FIG. 31B. In other words, the sensor pairs L1, L2 and L1*, L2* may be replaced by a sensor configuration having four sensor pairs Lx11/Lx12, Lx21/Lx22, Lz11/Lz12, Lz21/Lz22. According to this particular embodiment of the invention, additional force vectors may be determined.

Figure 34:
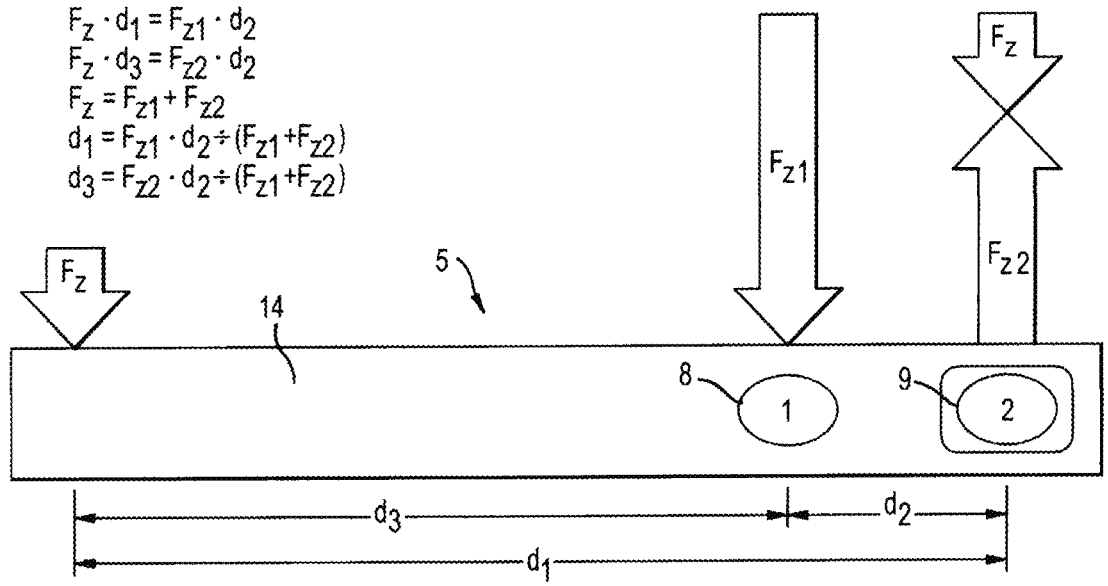
FIG. 34 through FIG. 41 are simplified, schematic, top view diagrams of a portion of a tow coupling apparatus showing various simplified load cases.

Turning now to FIG. 34, shown therein is a simplified, side, plan view diagram of a portion of the vehicle tow coupling apparatus of FIGS. 28A and 28B showing a first simplified load case. In particular, shown therein are the forces associated with the simplified load case. A force F has a vertical force component Fz in the vertical z-axis direction. The force F is applied to the sensor assembly via the second portion 5, and more precisely via the ball coupling 104 of the drawbar 102. For determining the force component Fz the following set of equations are solved:

$$Fz*d1=Fz1*d2 \quad (10)$$

$$Fz*d3=Fz2*d2 \quad (11)$$

$$Fz=Fz1+Fz2 \quad (12)$$

$$d1=Fz1*d2/(Fz1+Fz2) \quad (13)$$

$$d3=Fz2*d2/(Fz1+Fz2) \quad (14)$$

Fz1 is a reaction force on the first load sensor pin 8, Fz2 is a reaction force on the second load sensor pin 9. Distance d2 is the distance between (the axes of) the first and the second load sensor pins 8, 9. Distance d1 is the distance between the point of load (the ball coupling 104) and (the axis of) the second load sensor pin 9. Distance d3 is the distance between the point of load and (the axis of) the first load sensor pin 8. An algorithm for solving the above equations may be embedded in/on the memory of one of the aforementioned printed circuit board 304, 604.

Figure 35:
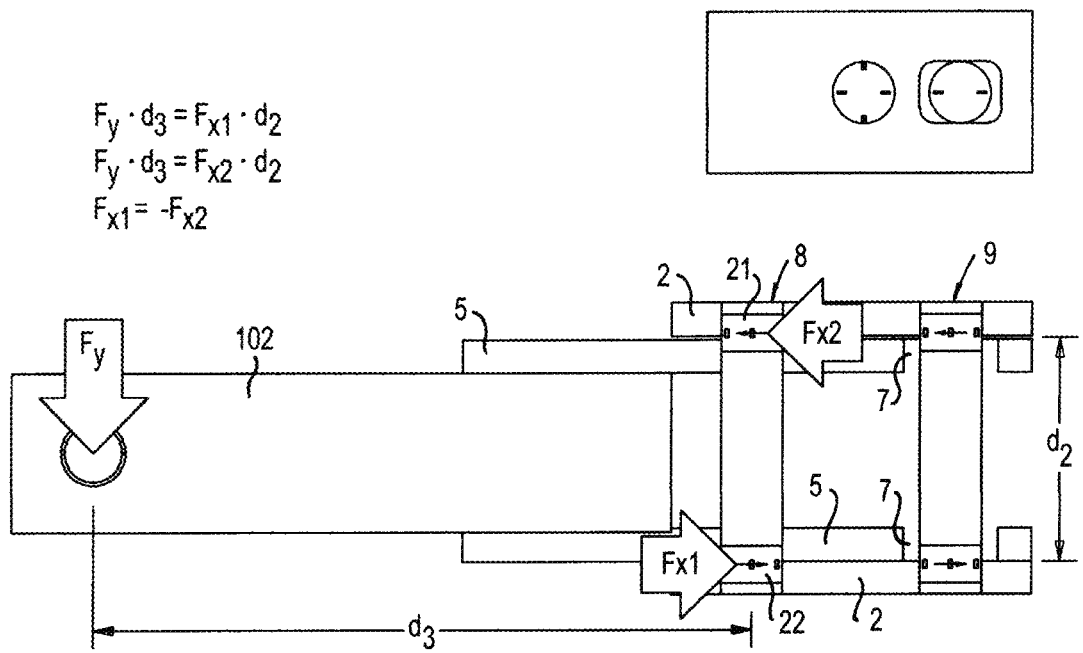

Turning now to FIG. 35, shown therein is a simplified, top view diagram of a portion of a vehicle tow coupling apparatus showing another simplified load case. The force has a transversal force component Fy in the transversal y-axis direction applied to the sensor assembly 1 via the second portion 5, and more precisely via the ball coupling 104 of the drawbar 102. The fourth through-hole 7 provides a degree of freedom in the longitudinal x-axis direction. The transversal force component Fy creates a first reactive force Fx2 acting in the longitudinal x-axis direction on the first magneto-elastically active region 21 of the first load sensor pin 8, and a second reactive force Fx1 acting in the longitudinal x-axis direction on the second magneto-elastically active region 22 of the first load sensor pin 8. For determining the force component Fy, the following set of equations are solved:

$$Fy*d3=Fx1*d2 \quad (15)$$

$$Fy*d3=Fx2*d2 \quad (16)$$

$$Fx1=-Fx2 \quad (17)$$

Figure 36:
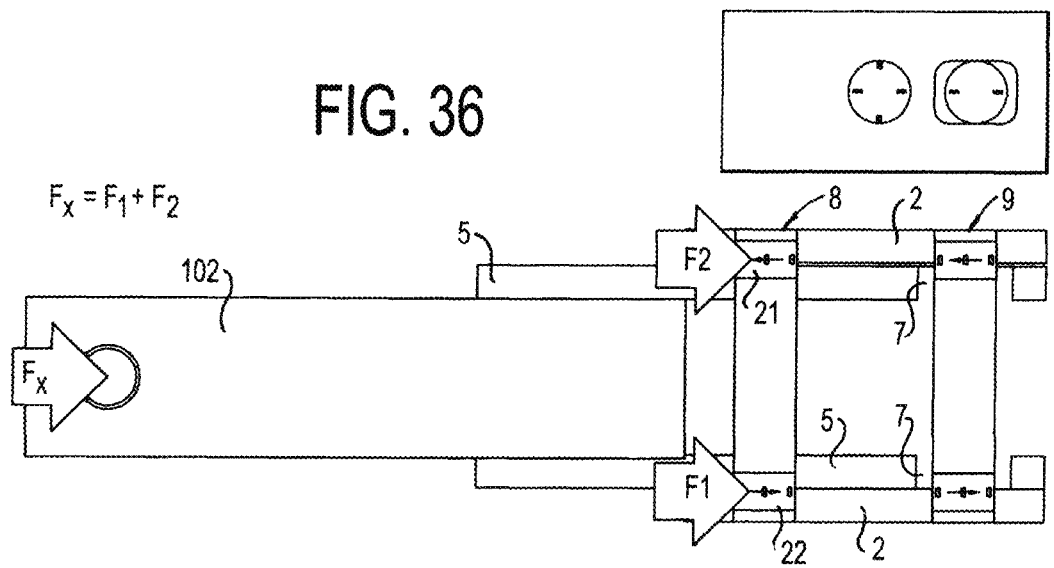

Turning now to FIG. 36, shown therein is a simplified, top view diagram of a portion of a vehicle tow coupling apparatus showing another simplified load case. In this case, the force has a longitudinal force component Fx in the longitudinal x-axis direction applied to the to the sensor assembly 1 via the second portion 5, and more precisely via the ball coupling 104 of the drawbar 102. The fourth through-hole 7 provides a degree of freedom in the longitudinal x-axis direction. The longitudinal force component Fx creates a first reactive force F2 acting in the longitudinal x-axis direction on the first magneto-elastically active region 21 of the first load sensor pin 8, and a second reactive force F1 acting in the longitudinal x-axis direction on the second magneto-elastically active region 22 of the first load sensor pin 8. For determining the force component Fx, the following equation is solved:

$$Fx=Fx1+Fx2 \quad (18)$$

Figure 37:
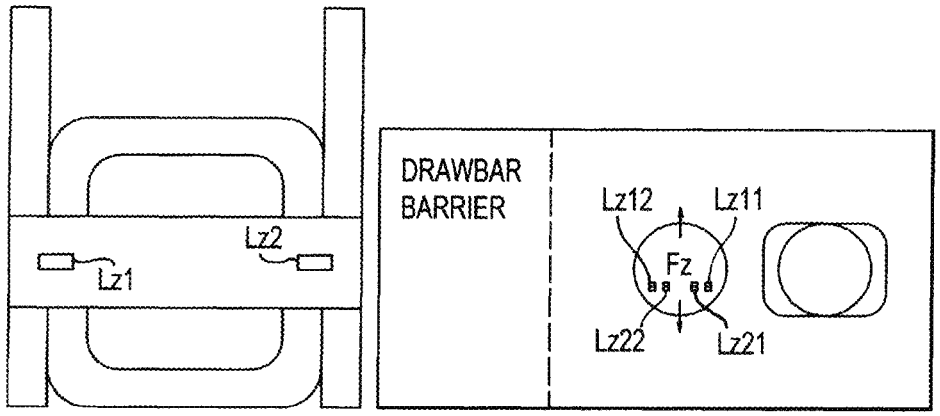

Turning now to FIG. 37, shown therein is a simplified, cross-sectional end view and plan side view diagram of a vehicle tow coupling apparatus subject to a vertical load component, Fz of a load F. The first load sensor pin 8 includes a first magneto-elastically active region 21 and a second magneto-elastically active region 22 (as shown in FIG. 36) that are directly or indirectly attached to or form parts of the first load sensor pin 8 in such a manner that mechanic stress that is applied to the first load sensor pin 8 is transmitted to the magneto-elastically active regions 21, 22. Each magneto-elastically active region 21, 22 includes a magnetically polarized region. The magnetic polarization of the first magneto-elastically active region 21 and the magnetic polarization of the second magneto-elastically active region 22 can be substantially opposite to each other.

A magnetic field sensor means includes at least one first direction sensitive magnetic field sensor Lz11 being arranged approximate the first magneto-elastically active region for outputting a first signal corresponding to a stress-induced magnetic flux emanating from the first magnetically polarized region 21, and at least one second direction sensitive magnetic field sensor Lz21 being arranged approximate the second magneto-elastically active region 22 for outputting a second signal corresponding to a stress-induced magnetic flux emanating from the second magnetically polarized region 22.

The first load sensor pin 8 includes:

a) a first and a third z-axis direction sensitive magnetic field sensor Lz11, Lz12 configured to detect a force component Fz1 in the first magneto-elastically active region 21 in the vertical z-axis direction; and b) a second and a fourth z-axis direction sensitive magnetic field sensor Lz21, Lz22 configured to detect a force component Fz2 in the second magneto-elastically active region in the vertical z-axis direction.

The second load sensor pin 9 is a naked pin, i.e. the pin has no magneto-elastically active region and no direction sensitive magnetic field sensors. Differently stated, the first load sensor pin 8 includes at least one first z-axis direction sensitive magnetic field sensor Lz11 and at least one second z-axis direction sensitive magnetic field sensor Lz21.

The first and second load sensor pins 8, 9 are rigidly fixed within the first and second through-holes 3, 4 of the first portion 2 (as shown in FIG. 36). The third and the fourth through-holes 6, 7 can provide a minimal gap between the abutment surfaces of the second portion 5 and the first and second load sensor pins 8, 9.

Figure 38:
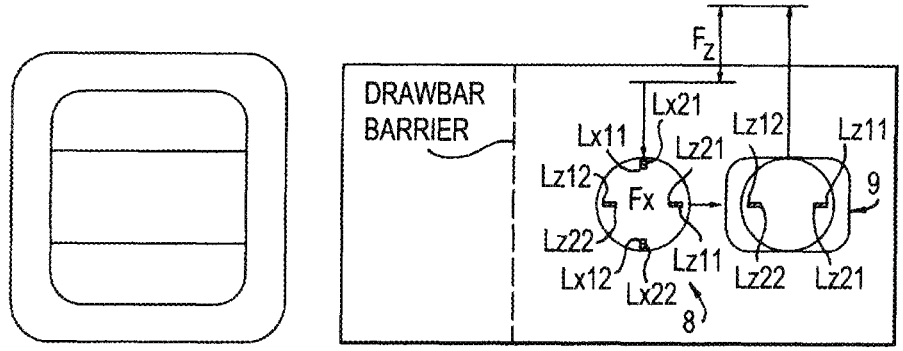
Figure 38:
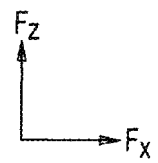

Turning now to FIG. 38, shown therein is a simplified, cross-sectional end view and plan side view diagram of a vehicle tow coupling apparatus subject to a vertical, transversal, and longitudinal load components of a load F. In this view, a first load sensor pin 8 includes a first magneto-elastically active region 21 and a second magneto-elastically active region 22, which are directly or indirectly attached to or form parts of the first load sensor pin 8 in such a manner that mechanic stress that is applied to the first load sensor pin 8 is transmitted to the magneto-elastically active regions 21, 22. Each magneto-elastically active region 21, 22 includes a magnetically polarized region. The magnetic polarization of the first magneto-elastically active region 21 and the magnetic polarization of the second magneto-elastically active region 22 can be substantially opposite to each other.

A magnetic field sensor means includes at least one first and third direction sensitive magnetic field sensor Lx11, Lz11 being arranged approximate the first magneto-elastically active region for outputting a first signal and a third signal corresponding to a stress-induced magnetic flux emanating from the first magnetically polarized region 21. The magnetic sensor means further includes at least one second and fourth direction sensitive magnetic field sensor Lx21, Lz21 being arranged approximate the second magneto-elastically active region 22 for outputting a second signal and a fourth signal corresponding to a stress-induced magnetic flux emanating from the second magnetically polarized region 22.

The first load sensor pin 8 may include:

a) a first and a third z-axis direction sensitive magnetic field sensor Lz11, Lz12 configured to detect a vertical force component Fz11 in the first magneto-elastically active region 21 in the z-axis vertical direction;

b) a second and a fourth z-axis direction sensitive magnetic field sensor Lz21, Lz22 configured to detect a vertical force component Fz12 in the second magneto-elastically active region in the z-axis vertical direction;

c) a first and a third x-axis direction sensitive magnetic field sensor Lx11, Lx12 configured to detect a longitudinal force component Fx2 in the first magneto-elastically active region 21 in the longitudinal x-axis direction; and d) a second and a fourth x-axis direction sensitive magnetic field sensor Lx21, Lx22 configured to detect a longitudinal force component Fx1 in the second magneto-elastically active region in the longitudinal x-axis direction.

The second load sensor pin 9 may include:

a) a first and a third z-axis direction sensitive magnetic field sensor Lz11, Lz12 configured to detect a vertical force component Fz21 in the first magneto-elastically active region 21 in the vertical z-axis direction; and b) a second and a fourth z-axis direction sensitive magnetic field sensor Lz21, Lz22 configured to detect a vertical force component Fz22 in the second magneto-elastically active region in the vertical z-axis direction;

Differently stated, the first load sensor pin 8 includes at least one first x-axis direction sensitive magnetic field sensor Lx11, at least one second x-axis direction sensitive magnetic field sensor Lx21, at least one first z-axis direction sensitive magnetic field sensor Lz11, and the at least one second z-axis direction sensitive magnetic field sensor Lz21. The second load sensor pin 9 includes at least one first z-axis direction sensitive magnetic field sensor Lz11 and at least one second z-axis direction sensitive magnetic field sensor Lz21.

As previously described, the first and second load sensor pins 8, 9 are rigidly fixed within the first and second through-holes 3, 4 of the first portion 2. The third and the fourth through-holes 6, 7 can provide a minimal gap between the abutment surfaces of the second portion 5 and the first and second load sensor pins 8, 9.

Figure 39:
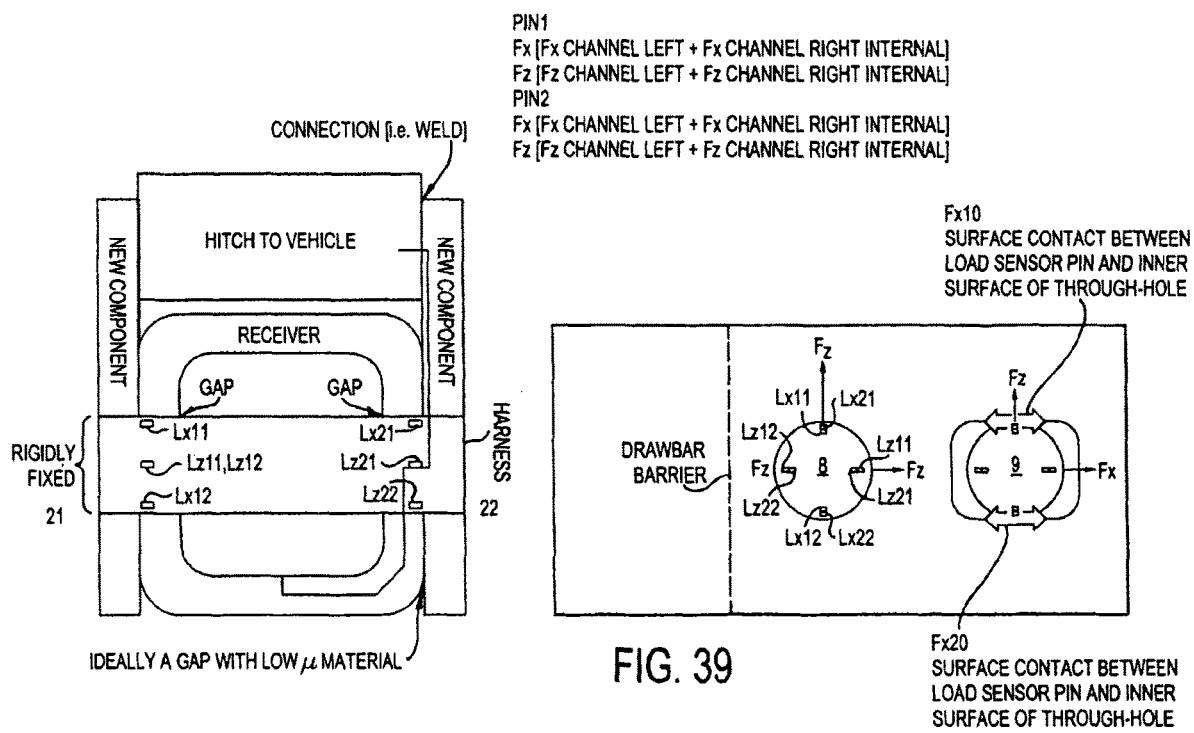

Turning now to FIG. 39, shown therein is another simplified, cross-sectional end view and plan side view diagram of a vehicle tow coupling apparatus subject to a vertical, transversal, and longitudinal load components of a load F. In this view, a first load sensor pin 8 includes a first magneto-elastically active region 21 and a second magneto-elastically active region 22, which are directly or indirectly attached to or form parts of the first load sensor pin 8 in such a manner that mechanic stress that is applied to the first load sensor pin 8 is transmitted to the magneto-elastically active regions 21, 22. Each magneto-elastically active region 21, 22 includes a magnetically polarized region. The magnetic polarization of the first magneto-elastically active region 21 and the magnetic polarization of the second magneto-elastically active region 22 can be substantially opposite to each other.

The magnetic field sensor means of this embodiment includes at least one first and third direction sensitive magnetic field sensor Lx11, Lz11 being arranged approximate the first magneto-elastically active region for outputting a first signal and a third signal corresponding to a stress-induced magnetic flux emanating from the first magnetically polarized region 21. The magnetic sensor means further includes at least one second and fourth direction sensitive magnetic field sensor Lx21, Lz21 being arranged approximate the second magneto-elastically active region 22 for outputting a second signal and a fourth signal corresponding to a stress-induced magnetic flux emanating from the second magnetically polarized region 22.

The first load sensor pin 8 includes:

a) a first and a third z-axis direction sensitive magnetic field sensor Lz11, Lz12 configured to detect a vertical force component Fz11 in the first magneto-elastically active region 21 in the vertical z-axis direction;

b) a second and a fourth z-axis direction sensitive magnetic field sensor Lz21, Lz22 configured to detect a vertical force component Fz12 in the second magneto-elastically active region in the vertical z-axis direction;

c) a first and a third x-axis direction sensitive magnetic field sensor Lx11, L12 configured to detect a longitudinal force component Fx2 in the first magneto-elastically active region 21 in the longitudinal x-axis direction; and d) a second and a fourth x-axis direction sensitive magnetic field sensor Lx21, Lx22 configured to detect a longitudinal force component Fx1 in the second magneto-elastically active region in the longitudinal x-axis direction.

The second load sensor pin 9 includes:

a) a first and a third z-axis direction sensitive magnetic field sensor Lz11, Lz12 configured to detect a vertical force component Fz21 in the first magneto-elastically active region 21 in the vertical z-axis direction;

b) a second and a fourth z-axis direction sensitive magnetic field sensor Lz21, Lz22 configured to detect a vertical force component Fz22 in the second magneto-elastically active region 22 in the vertical z-axis direction;

c) a first and a third x-axis direction sensitive magnetic field sensor Lx11, L12 configured to detect a longitudinal force component Fx10 (force exerted by the load sensor pin 9 in contact with a top surface of the through-hole) in the first magneto-elastically active region 21 in the longitudinal x-axis direction; and d) a second and a fourth x-axis direction sensitive magnetic field sensor Lx21, Lx22 configured to detect a longitudinal force component Fx20 (force exerted by the load sensor pin 9 in contact with a top surface of the through-hole) in the second magneto-elastically active region 22 in the longitudinal x-axis direction.

Therefore, the configuration of the second load sensor pin 9 is substantially similar to the configuration of the first load sensor pin 8. Differently stated, the first load sensor pin 8 includes at least one first x-axis direction sensitive magnetic field sensor Lx11, at least one the second x-axis direction sensitive magnetic field sensor Lx21, at least one first z-axis direction magnetic field sensor Lz11, and at least one second z-axis direction magnetic field sensor Lz21. The second load sensor pin includes at least one first x-axis direction sensitive magnetic field sensor Lx11, at least one second x-axis direction sensitive magnetic field sensor Lx21, at least one first z-axis direction magnetic field sensor Lz11, and at least one second z-axis direction magnetic field sensor Lz21.

The first and the second longitudinal force components Fx10, Fx20 are comparatively small (for example, resulting from friction between the abutment surface of the fourth through-hole 7 and the second load sensor pin 9) or substantially zero. This is a direct result of the additional translational degree of freedom in the longitudinal x-axis direction, which degree of freedom is provided by the fourth through-hole 7 in the second portion 5.

The first and second load sensor pins 8, 9 are rigidly fixed within the first and second through-holes 3, 4 of the first portion 2. The third and the fourth through-holes 6, 7 can provide a minimal gap between the abutment surfaces of the second portion 5 and the first and second load sensor pins 8, 9.

Figure 40:
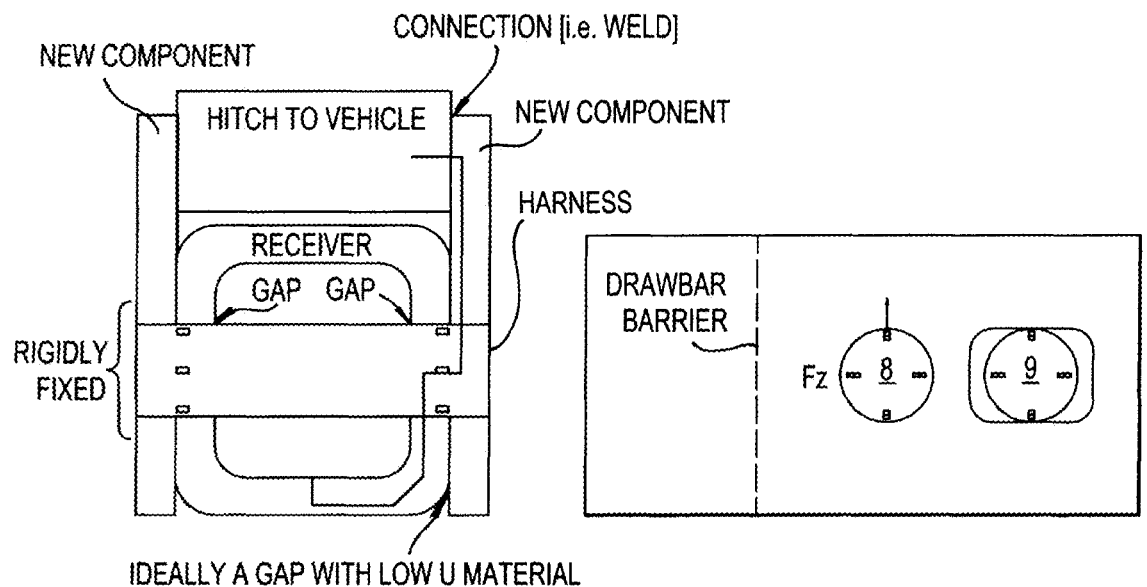

Turning now to FIG. 40, shown therein is a simplified, cross-sectional end view and plan side view diagram of a vehicle tow coupling apparatus subject to a vertical, transversal, and longitudinal load components of a load F. In this view, the first load sensor pin 8 includes a first magneto-elastically active region 21 and a second magneto-elastically active region 22, which are directly or indirectly attached to or form parts of the first load sensor pin 8 in such a manner that mechanic stress that is applied to the first load sensor pin 8 is transmitted to the magneto-elastically active regions 21, 22. Each magneto-elastically active region 21, 22 includes a magnetically polarized region. The magnetic polarization of the first magneto-elastically active region 21 and the magnetic polarization of the second magneto-elastically active region 22 can be substantially opposite to each other.

A magnetic field sensor means includes at least one first- and third-direction sensitive magnetic field sensor Lx11, Lz11 being arranged approximate the first magneto-elastically active region 21 for outputting a first signal and a third signal corresponding to a stress-induced magnetic flux emanating from the first magnetically polarized region 21. The magnetic sensor means further includes at least one second- and fourth-direction sensitive magnetic field sensor Lx21, Lz21 being arranged approximate the second magneto-elastically active region 22 for outputting a second signal and a fourth signal corresponding to a stress-induced magnetic flux emanating from the second magnetically polarized region 22.

The first load sensor pin 8 includes:

a) a first and a third z-axis direction sensitive magnetic field sensor Lz11, Lz12 configured to detect a vertical force component Fz11 in the first magneto-elastically active region 21 in the vertical z-axis direction;

b) a second and a fourth z-axis direction sensitive magnetic field sensor Lz21, Lz22 configured to detect a vertical force component Fz12 in the second magneto-elastically active region in the vertical z-axis direction;

c) a first and a third x-axis direction sensitive magnetic field sensor Lx11, L12 configured to detect a longitudinal force component Fx2 in the first magneto-elastically active region 21 in the longitudinal x-axis direction; and d) a second and a fourth x-axis direction sensitive magnetic field sensor Lx21, Lx22 configured to detect a longitudinal force component Fx1 in the second magneto-elastically active region in the longitudinal x-axis direction.

The second load sensor pin 9 includes:

a) a first and a third z-axis direction sensitive magnetic field sensor Lz11, Lz12 configured to detect a vertical force component Fz21 in the first magneto-elastically active region 21 in the vertical z-axis direction;

b) a second and a fourth z-axis direction sensitive magnetic field sensor Lz21, Lz22 configured to detect a vertical force component Fz22 in the second magneto-elastically active region 22 in the vertical z-axis direction;

c) a first and a third x-axis direction sensitive magnetic field sensor Lx11, L12 configured to detect a longitudinal force component Fx22 in the first magneto-elastically active region 21 in the longitudinal x-axis direction; and d) a second and a fourth x-axis direction sensitive magnetic field sensor Lx21, Lx22 configured to detect a longitudinal force component Fx21 in the second magneto-elastically active region 22 in the longitudinal x-axis direction.

The general configuration of the second load sensor pin 9 is substantially similar to the configuration of the first load sensor pin 8. The first and second load sensor pins 8, 9 are rigidly fixed within the first and second through-holes 3, 4 of the first portion 2. The third and the fourth through-holes 6, 7 can provide a minimal gap between the abutment surfaces of the second portion 5 and the first and second load sensor pins 8, 9. Optionally, the fourth through-hole 7 can provide no minimal gap, such that the second load sensor pin 9 is rigidly fixed within the third and the fourth through-hole 7.

Figure 41:
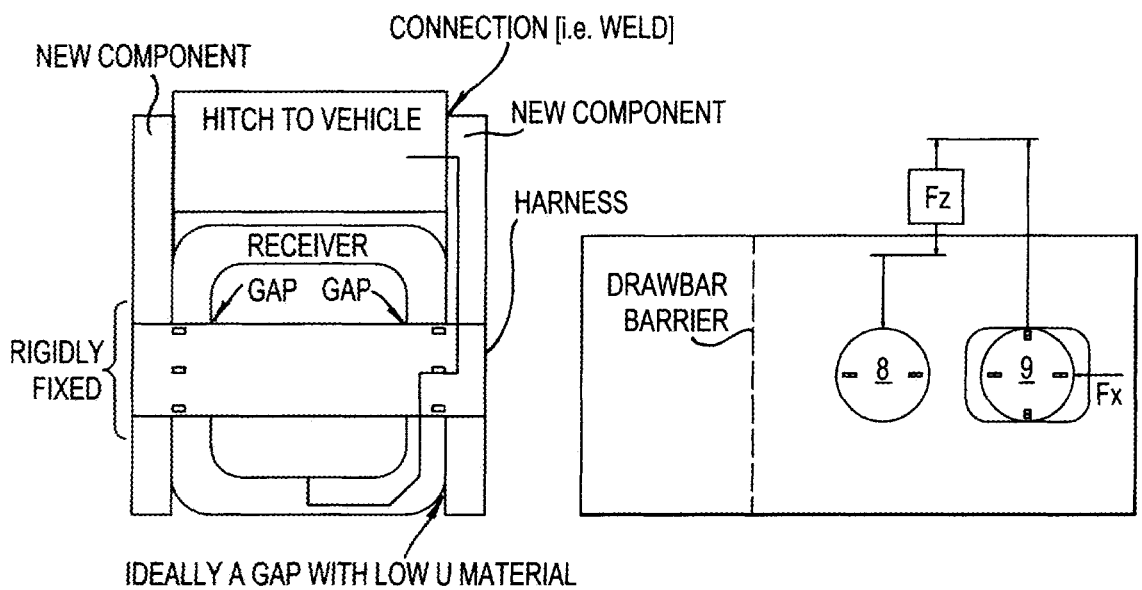

Turning now to FIG. 41, shown therein is another a simplified, cross-sectional end view and plan side view diagram of a vehicle tow coupling apparatus subject to a vertical, transversal, and longitudinal load components of a load F. In this view, the first load sensor pin 8 comprises a first magneto-elastically active region 21 and a second magneto-elastically active region 22, which are directly or indirectly attached to or form parts of the first load sensor pin 8 in such a manner that mechanic stress that is applied to the first load sensor pin 8 is transmitted to the magneto-elastically active regions 21, 22. Each magneto-elastically active region 21, 22 comprises a magnetically polarized region. The magnetic polarization of the first magneto-elastically active region 21 and the magnetic polarization of the second magneto-elastically active region 22 can be substantially opposite to each other.

A magnetic field sensor means includes at least one first direction sensitive magnetic field sensor Lz11 being arranged approximate the first magneto-elastically active region for outputting a first signal corresponding to a stress-induced magnetic flux emanating from the first magnetically polarized region 21. The magnetic sensor means further includes at least one second direction sensitive magnetic field sensor Lz21 being arranged approximate the second magneto-elastically active region 22 for outputting a second signal and a fourth signal corresponding to a stress-induced magnetic flux emanating from the second magnetically polarized region 22.

The first load sensor pin 8 includes:

a) a first and a third z-axis direction sensitive magnetic field sensor Lz11, Lz12 configured to detect a vertical force component Fz11 in the first magneto-elastically active region 21 of the first load sensor pin 8 in the vertical z-axis direction; and b) a second and a fourth z-axis direction sensitive magnetic field sensor Lz21, Lz22 configured to detect a vertical force component Fz12 in the second magneto-elastically active region of the first load sensor pin 8 in the vertical z-axis direction.

The first load sensor pin 8 comprises no x-axis direction sensitive magnetic field sensors.

The second load sensor pin 9 includes:

a) a first and a third z-axis direction sensitive magnetic field sensor Lz11, Lz12 configured to detect a vertical force component Fz21 in the first magneto-elastically active region 21 in the vertical z-axis direction;

b) a second and a fourth z-axis direction sensitive magnetic field sensor Lz21, Lz22 configured to detect a vertical force component Fz22 in the second magneto-elastically active region 22 in the vertical z-axis direction;

c) a first and a third x-axis direction sensitive magnetic field sensor Lx11, Lx12 configured to detect a longitudinal force component Fx22 in the first magneto-elastically active region 21 in the longitudinal x-axis direction; and d) a second and a fourth x-axis direction sensitive magnetic field sensor Lx21, Lx22 configured to detect a longitudinal force component Fx21 in the second magneto-elastically active region 22 in the longitudinal x-axis direction.

The first and second load sensor pins 8, 9 are rigidly fixed within the first and second through-holes 3, 4 of the first portion 2. The third and the fourth through-hole 6, 7 can provide a minimal gap between the abutment surfaces of the second portion 5 and the first and second load sensor pins 8, 9. Optionally, the fourth through-hole 7 can provide no minimal gap, such that the second load sensor pin 9 is rigidly fixed within the third and the fourth through-hole 7.

Figure 42A:
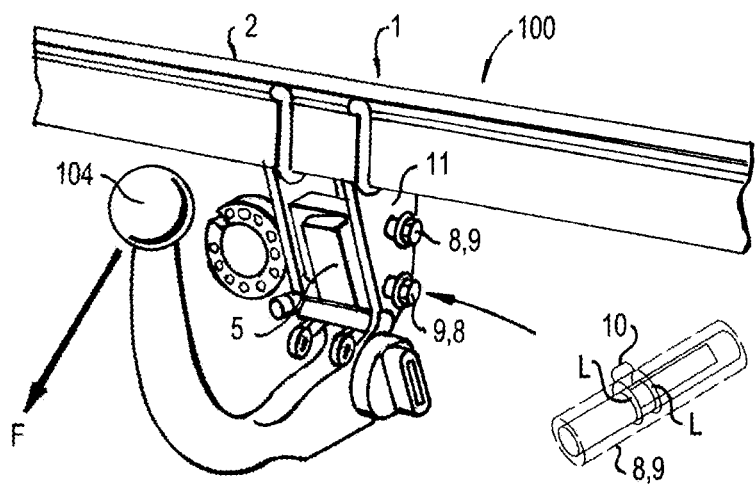
FIGS. 42A through 42AA are perspective view diagrams of tow hitch assemblies, towed or towing vehicles, and weight sensing assemblies using one or more load sensor pins at various force transmitting components.

Turning now to FIG. 42A, shown therein is a simplified, perspective, schematic view diagram of tow coupling apparatus 100 using load sensor pins 8, 9 for sensing (components) of a force F. In the configuration shown, the sensor assembly 1 for sensing a force F includes a first portion 2 (attachment assembly, supporting yoke) having a first and a second through-hole 3, 4, and a second portion 5 (trailer hitch, towing hook) having a third and fourth through-hole 6, 7. The third and fourth through-holes 6, 7 are positioned in correspondence to the first and second through-holes 3, 4.

The sensor assembly 1 further includes a first load sensor pin 8 and a second load sensor pin 9. The first load sensor pin 8 is arranged such that it extends through the first and third through-holes 3, 6. The second load sensor pin 9 is arranged such that it extends through the second and fourth through-holes 4, 7.

The first portion 2 is coupled to the second portion 5 via the first and second load sensor pins 8, 9. At least one out of the first and the second load sensor pin 8, 9 includes at least one magneto-elastically active region 10 that is directly or indirectly attached to or forms a part of the load sensor pin 8, 9 in such a manner that mechanic stress on the load sensor pin is transmitted to the magneto-elastically active region. The magneto-elastically active region 10 comprises at least one magnetically polarized region such that a polarization of the polarized region becomes increasingly helically shaped as the applied stress increases.

The at least one load sensor pin 8, 9 further includes a magnetic field sensor means arranged approximate the at least one magneto-elastically active region 10 for outputting a signal corresponding to a stress-induced magnetic flux emanating from the magnetically polarized region. The magnetic field sensor means includes at least one direction sensitive magnetic field sensor L, which is configured for determination of a shear force in at least one direction. The at least one direction sensitive magnetic field sensor L is arranged to have a predetermined and fixed spatial coordination with the load sensor pin 8, 9.

The load sensor pin 8, 9 comprising the at least one direction sensitive magnetic field sensor L is at least partially hollow. The at least one direction sensitive magnetic field sensor L is arranged inside the interior of the load sensor pin 8, 9.

The first and second load sensor pins 8, 9 are substantially arranged along the vertical z-axis direction. The load sensor pins 8, 9 extend in the transversal y-axis direction. The longitudinal direction is perpendicular to the vertical z-axis direction and the transversal y-axis direction to define the Cartesian coordinate system. The system of equations that has to be solved in order to determine the respective load components of F, has to be altered accordingly.

Further features and aspects of the invention (which have been described with respect to the preceding embodiments) may also apply to this embodiment.

The sensor assembly 1 is part of a tow coupling apparatus 100. The first part 2 is configured to be attached to the chassis of a towing vehicle. The second part 5 provides a ball coupling 104 that is configured to couple to a towed vehicle.

Figure 42B:
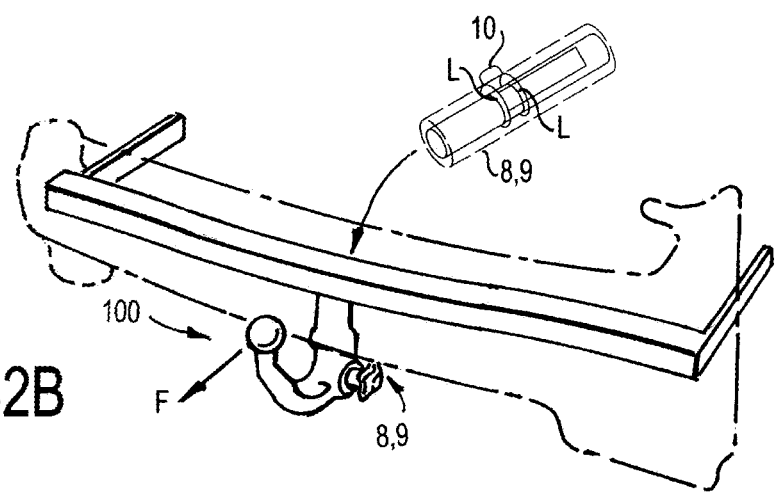
Figure 42C:
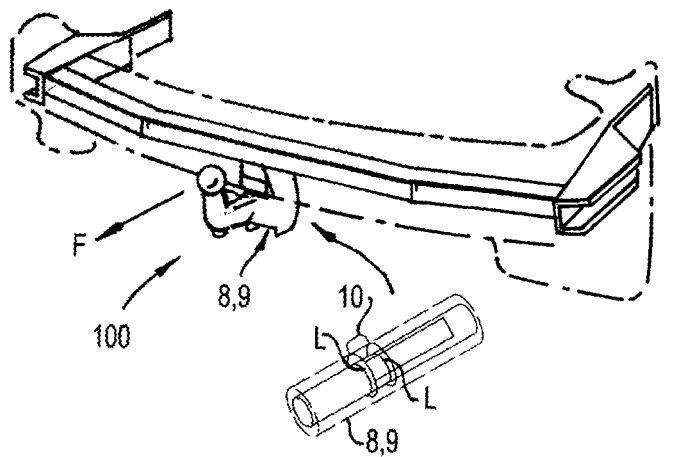
Figure 42D:
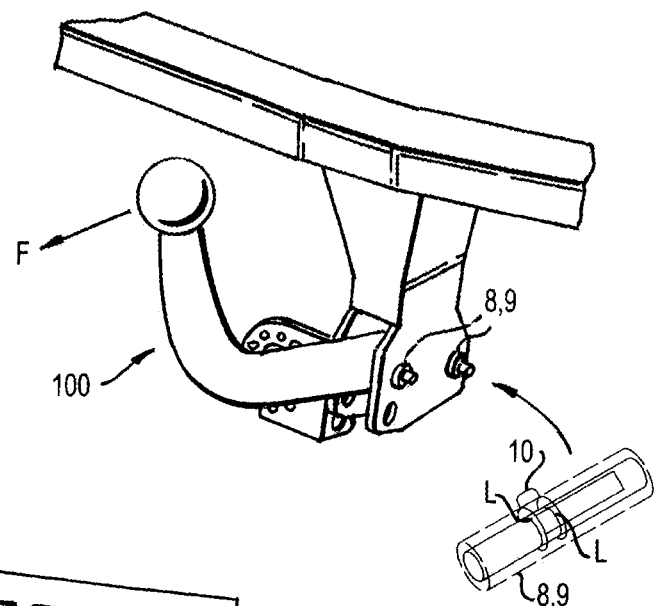
Figure 42E:
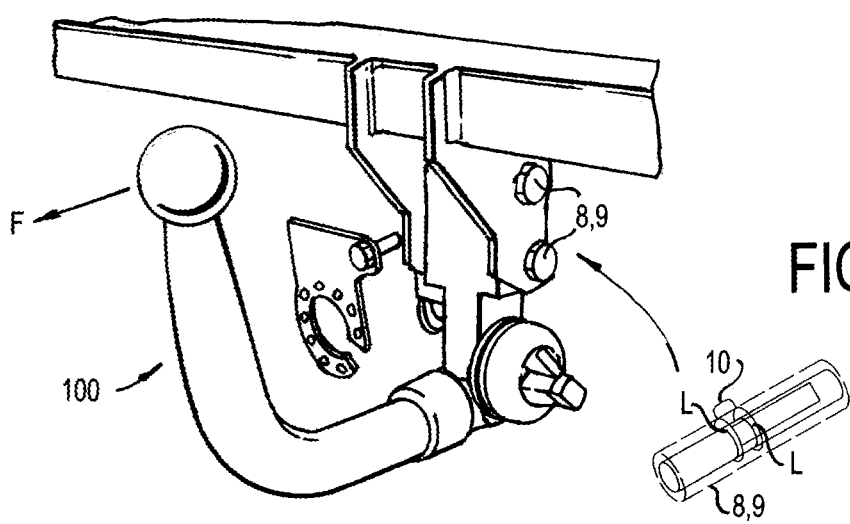
Figure 42F:
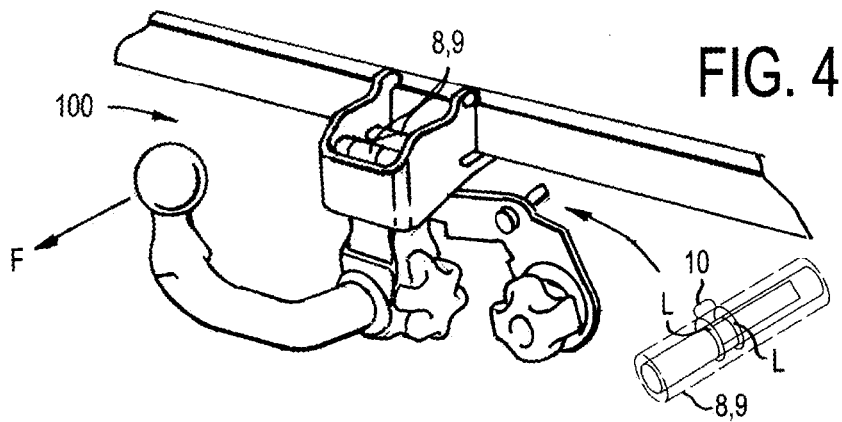
Figure 42G:
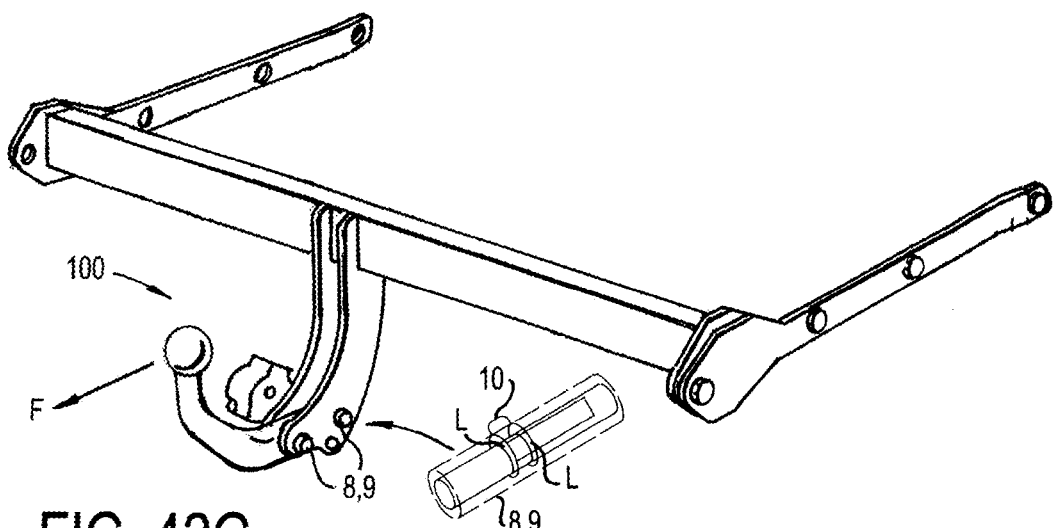
Figure 42H:
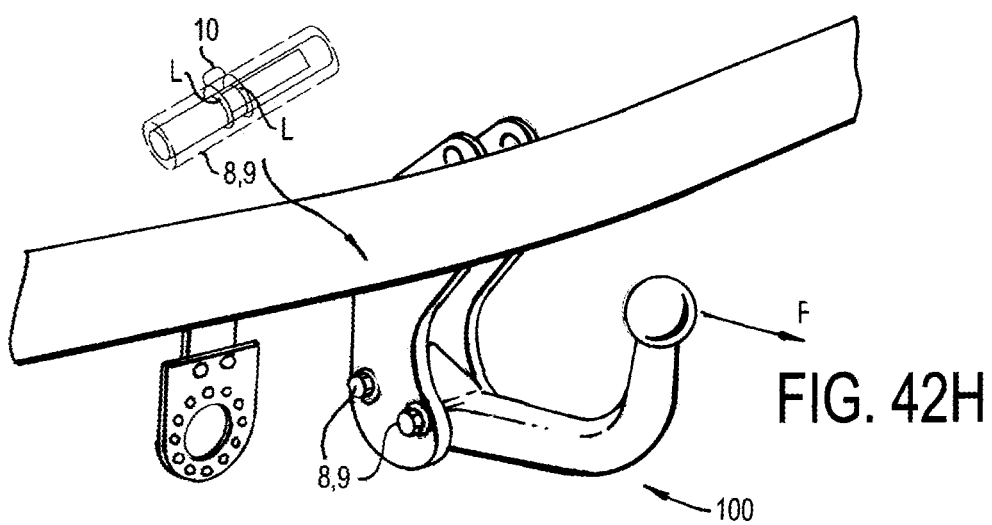
Figure 42I:
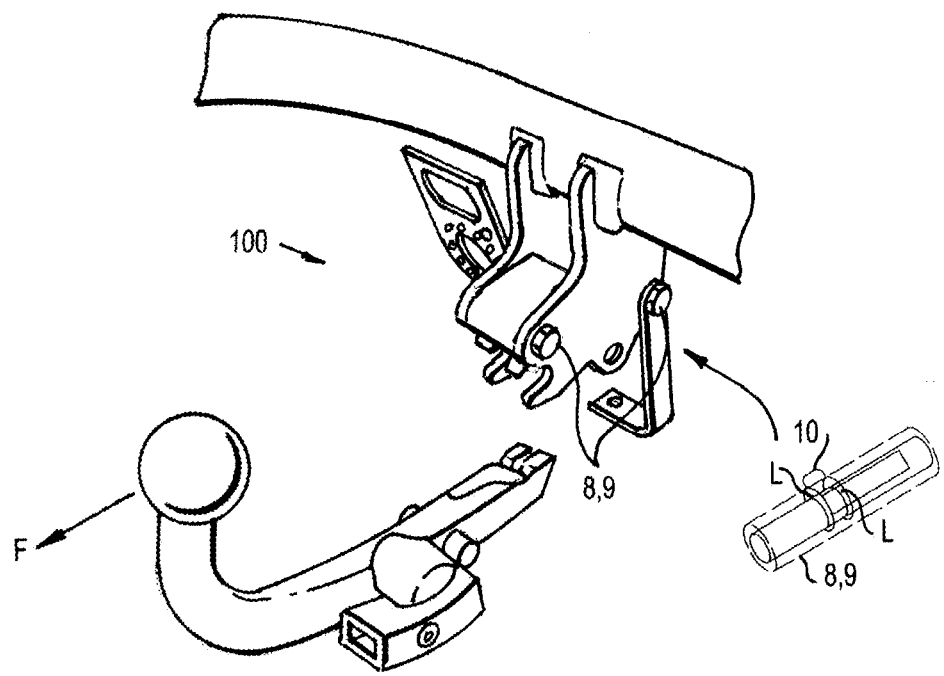
Figure 42J:
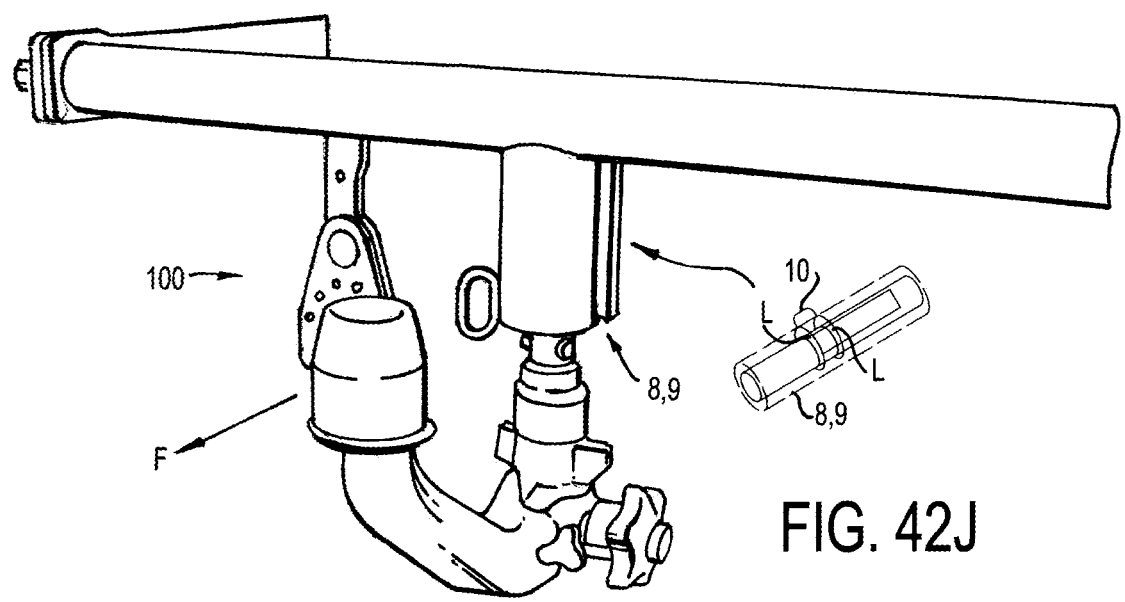
Figure 42K:
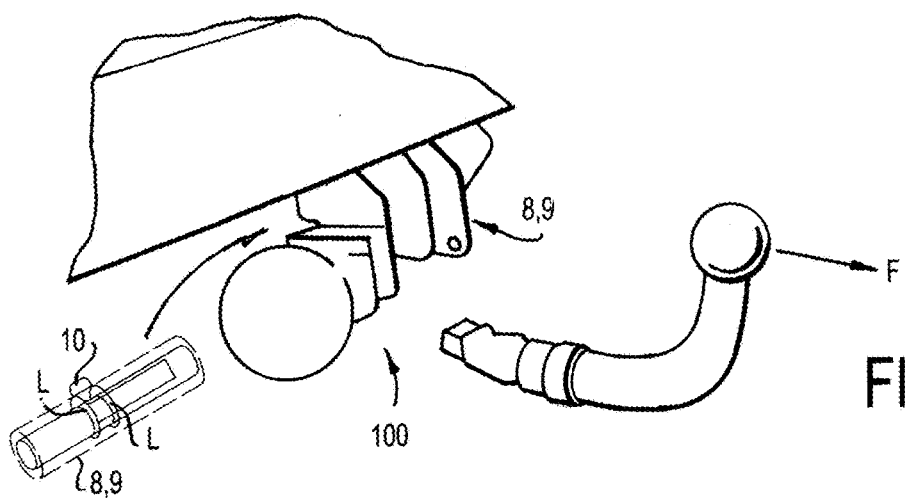

Turning now to FIG. 42B and FIG. 42C, shown therein are simplified, perspective, schematic view diagrams of tow coupling apparatus 100 using load sensor pins 8, 9 for sensing (components) of a force F. In these embodiments, the load sensor pins 8, 9, along with the first part 2 and second part 5 (not shown), are integrated into the existing hitch mechanism with the load sensor pins 8, 9 arrange in the transverse y-axis direction (perpendicular to the force F acting in the x-axis direction).

Turning now to FIG. 42D through FIG. 42K, shown therein are simplified, perspective, schematic view diagrams of tow coupling apparatus 100 using load sensor pins 8, 9 for sensing (components) of a force F. In these embodiments, the load sensor pins 8, 9, along with the first part 2 and second part 5 (not shown), are integrated into the existing hitch mechanism with the load sensor pins 8, 9 arrange in the transverse y-axis direction as shown (perpendicular to the force F acting in the x-axis direction). In some cases, an exterior housing further protects the components of the tow coupling apparatus 100 from rain, snow, ice, and other environment conditions.

Figure 42L:
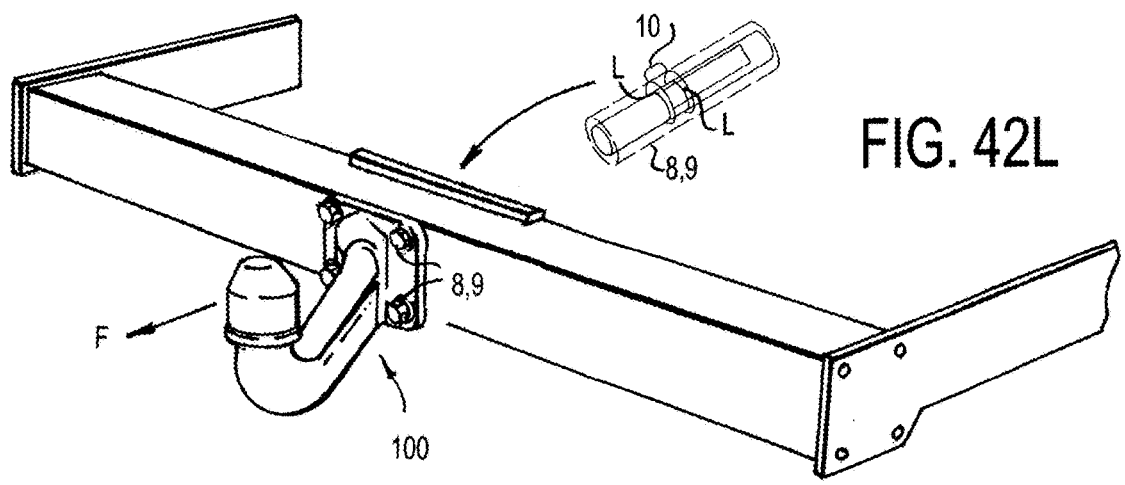
Figure 42M:
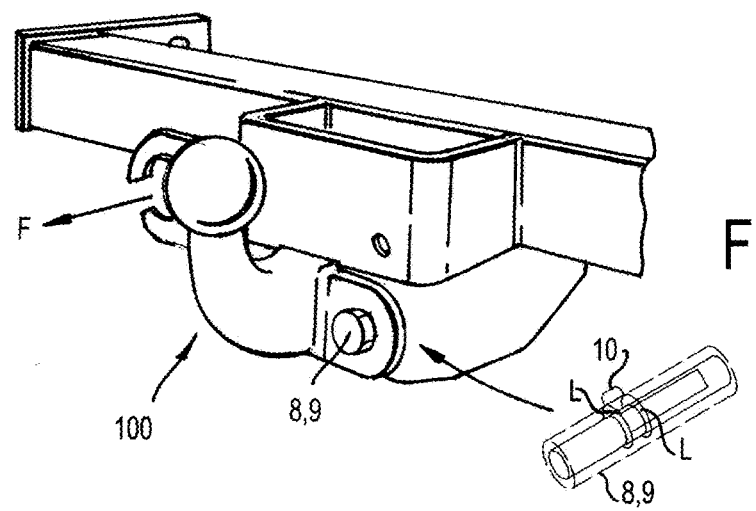
Figure 42N:
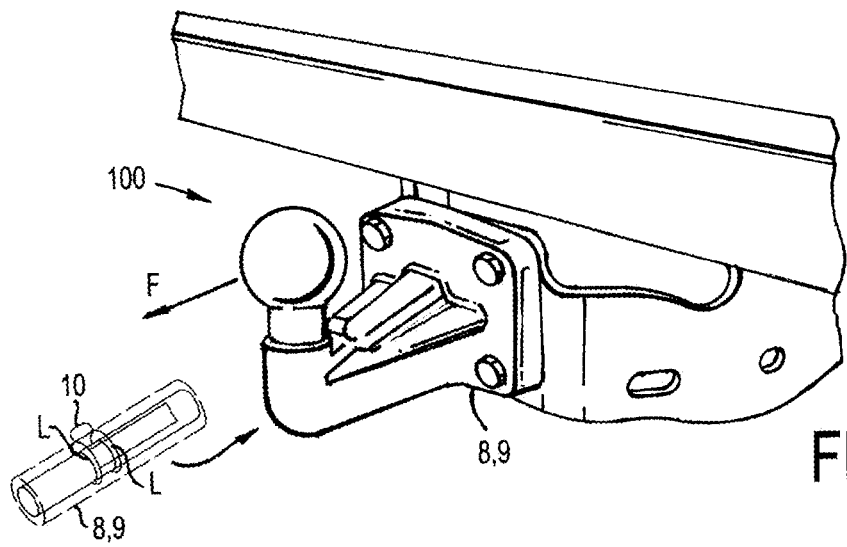
Figure 42O:
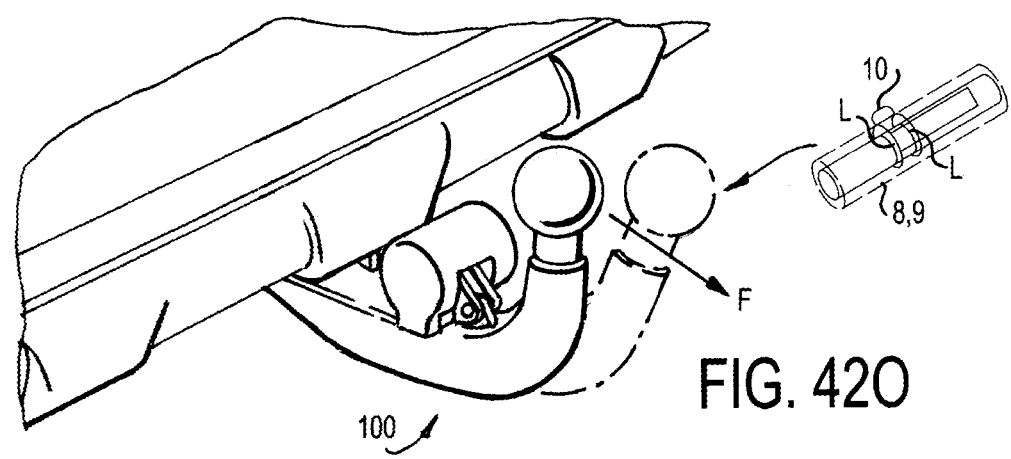

Turning now to FIG. 42L and FIG. 42O, shown therein is a simplified, perspective, schematic view diagram of tow coupling apparatus 100 using load sensor pins 8, 9 for sensing (components) of a force F. In these embodiments, the load sensor pins 8, 9, along with the first part 2 and second part 5 (not shown), are integrated into the existing hitch mechanism with the load sensor pins 8, 9 arrange in the longitudinal x-axis direction as shown (parallel to the force F acting in the x-axis direction). Other load sensing pins 8, 9 could be positioned in the transverse direction to better measure the Fx force in the x-axis direction.

Figure 42P:
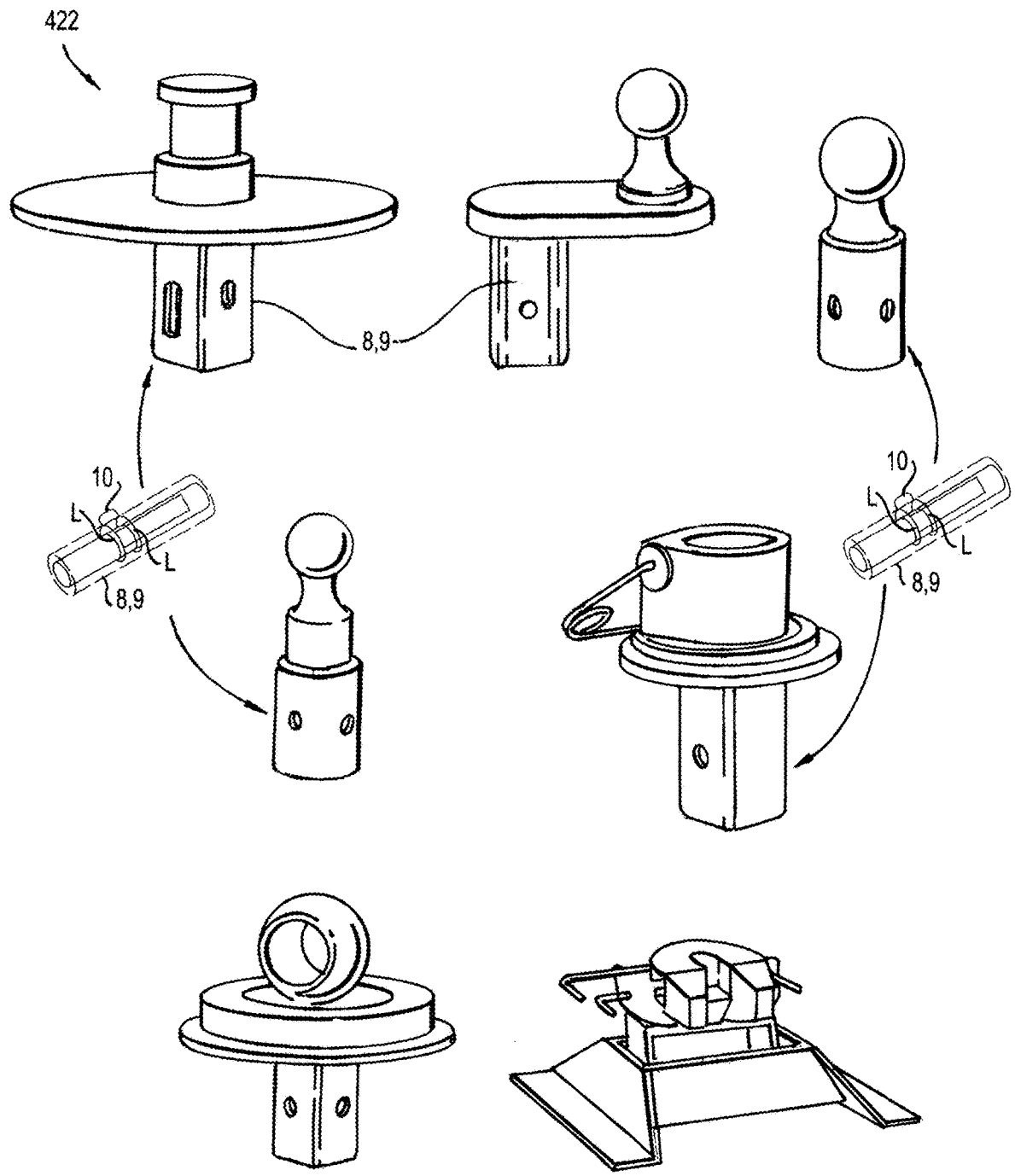
Figure 42Q:
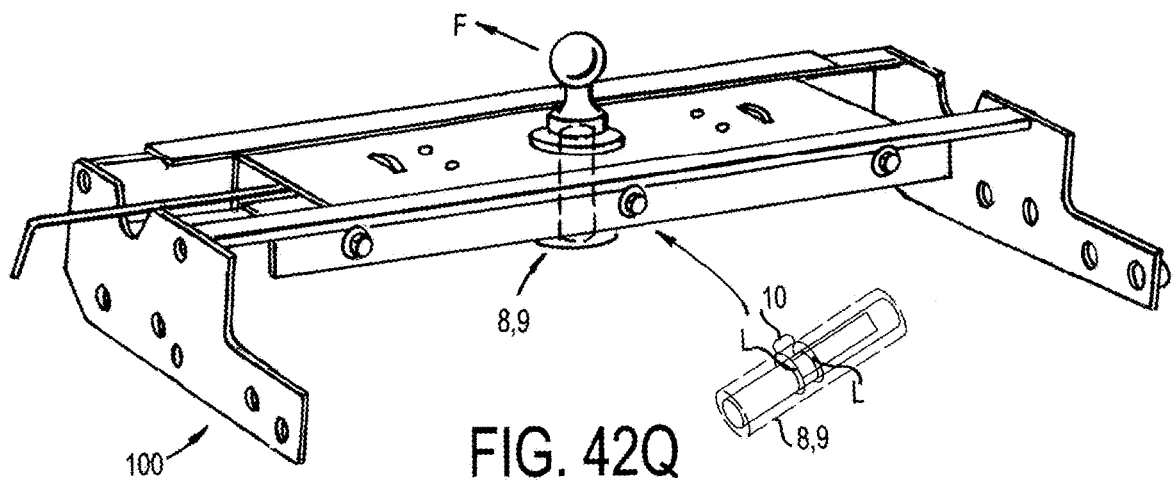
Figure 42R:
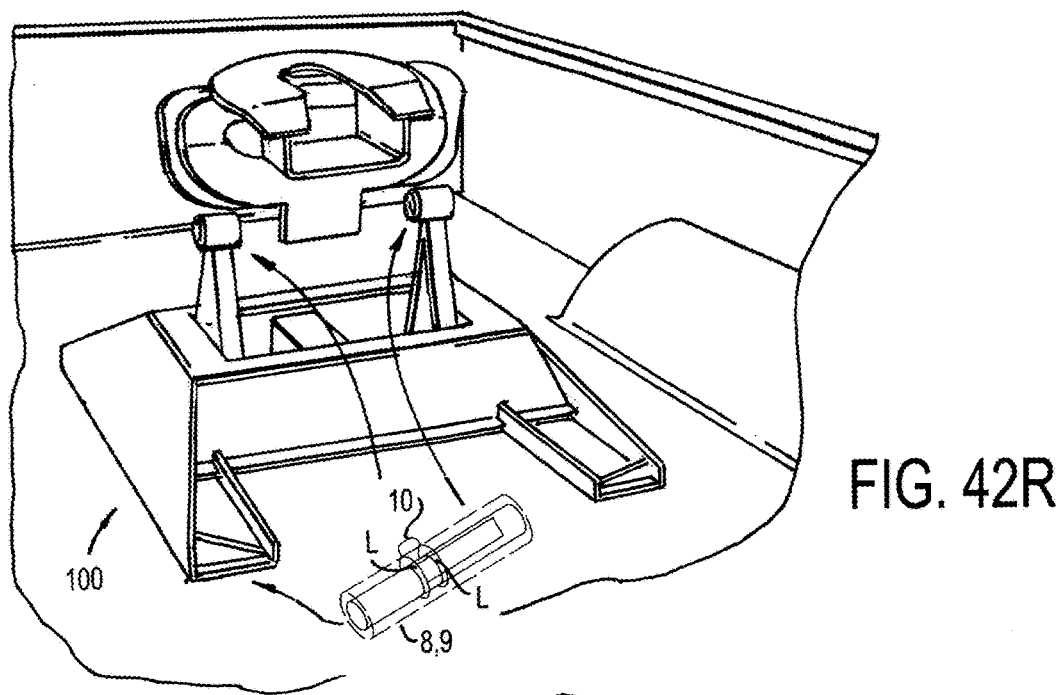
Figure 42S:
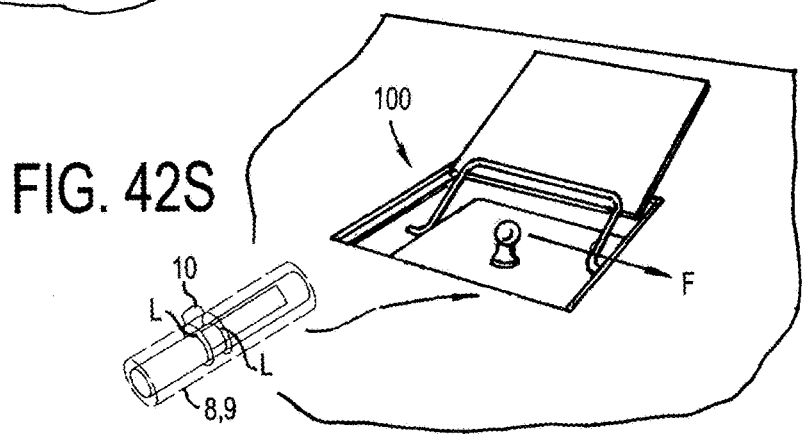
Figure 42T:
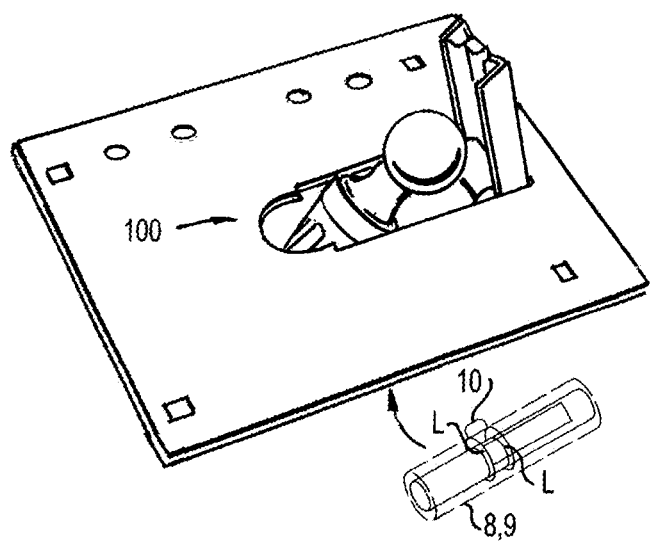
Figure 42U:
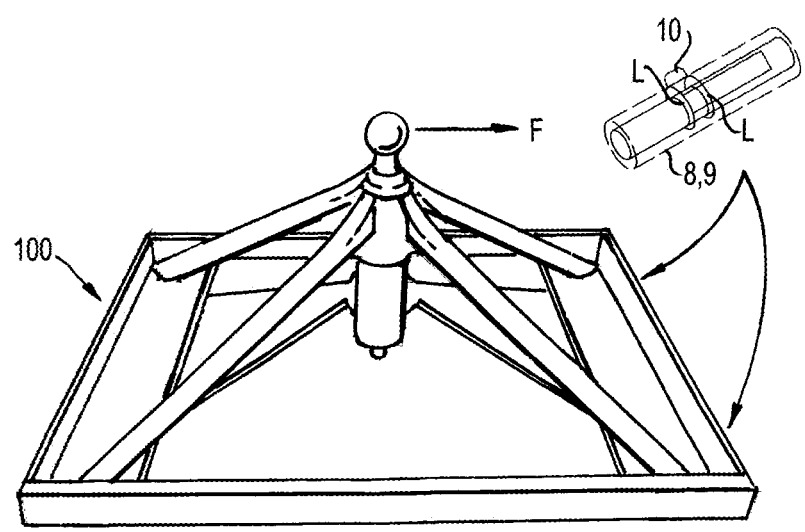

Turning now to FIG. 42P, shown therein is a simplified, perspective, schematic view diagram of coupling devices ("kingpin," extender, 3-inch ball, high-rise ball, inverted ball, and eyelet for use with a gooseneck-style trailer hitch (not shown), and fifth wheel-style hitch) adapted to using one or more load sensor pins 8, 9 for sensing (components) of a force F acting on the coupling devices. FIG. 42Q through FIG. 42U show one of the coupling devices of FIG. 42P and the locations for positioning the load sensor pins 8, 9 (usually in the transverse direction) for sensing (components) of a force F acting on the coupling devices. As shown, the coupling devices may include a hitch tube (which may be a solid bar) attached to a towing vehicle, a receiver tube attached to the hitch tube/bar, a drawbar (which may be straight, curved) inserted in the receiver tube or attached directly to the hitch tube/bar, and a ball hitch.

Figure 42V:
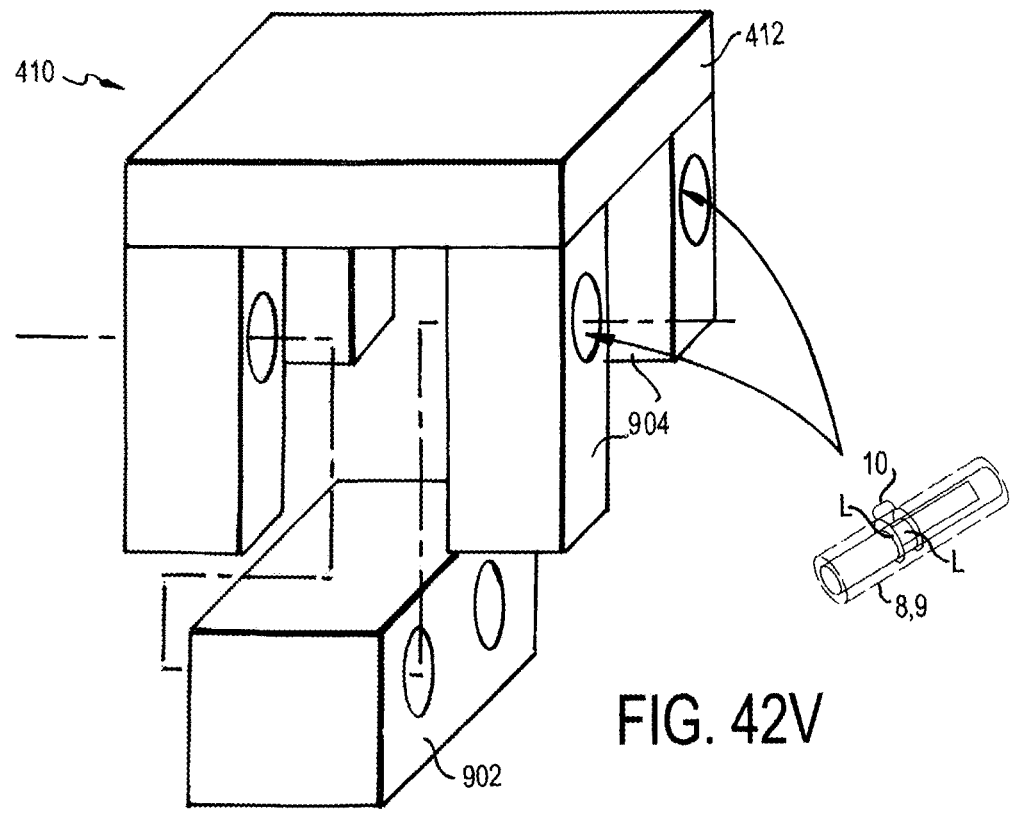

Turning now to FIG. 42V, shown therein is a simplified, exploded, schematic view diagram of a weight sensor assembly 410 using load sensor pins 8, 9 for sensing a weight of a towed and a towing vehicle for comparison to a predetermined value, such as a manufacturer's maximum weight limit or a US governmental gross vehicle weight rating (GVWR). A "sprung weight" is the weight of a mass resting on the suspension of a vehicle or a trailer, not the total weight (the total weight would include the wheels, tires, brakes, and certain suspension components). As shown in the figure, the load sensor pins 8, 9 are positioned such that the sheer force exerted downward by the connection device 412 (which could be a chassis or vehicle body part) and transferred to the vehicle wheels causes a force to be applied to the load pins 8, 9. The bracket 902, which may be connected to the spring or other suspension component on the one end, and adapters 904, which may be attached to the connection device 412 and the towing or the towed vehicle chassis, may be used to output a signal (as described above) that approximates the sprung weight by measuring the force of the mass of the vehicle as its weight force is transferred to the load sensor pins 8, 9. For example, the sensor assembly 410 could be positioned between the top of each of the four suspension springs associated with the wheels where the springs attach to the vehicle chassis.

Figure 42W:
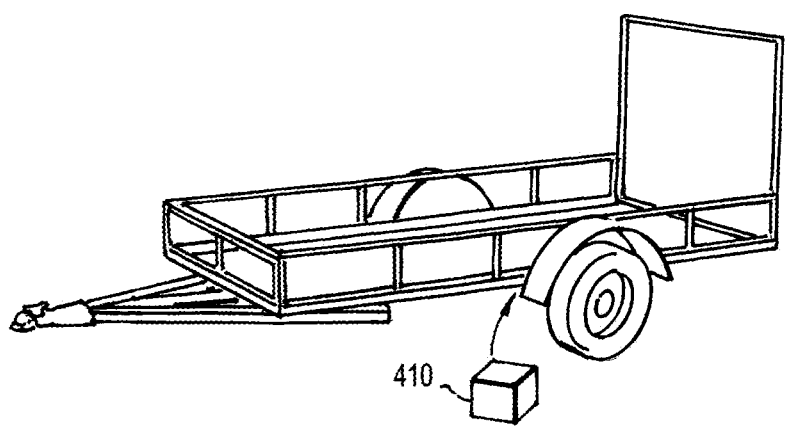

FIGS. 42W through 42AA show various towed vehicles and towing vehicles and related components, including suspension components, equipped with the weight sensor assembly 410 at various measurement points between a vehicle body or vehicle load (e.g., trailer box, boat) and the vehicle's wheels to measure a sprung weight force.

Figure 42X:
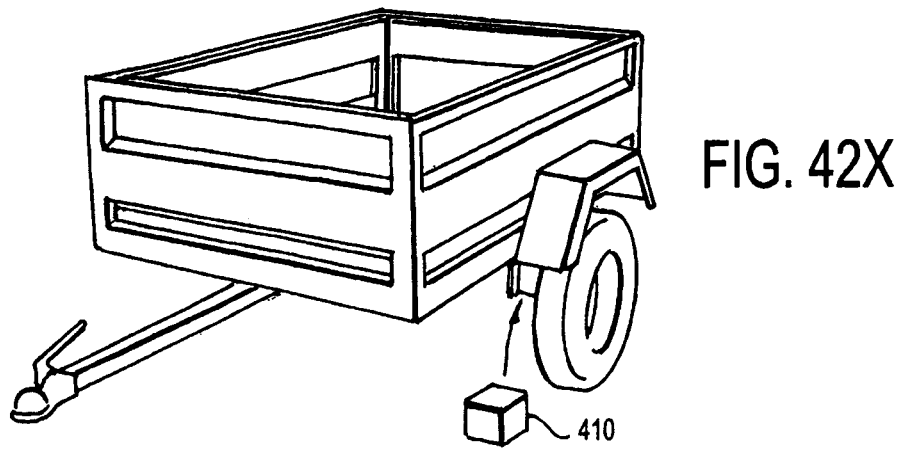

FIG. 42W for example, illustrates use of the weight sensor assembly 410 positioned near a trailer wheel such that the weight sensor assembly 410 is between the trailer box on one end and the wheel axel (or wheel suspension component attached to the wheel), such that the weight of the trailer box may be measured from a force arising from the weight of the trailer box being transferred to the load sensor pins 8, 9. FIG. 42X illustrates a similar use of the weight sensor assembly 410 on a smaller trailer.

Figure 42Y:
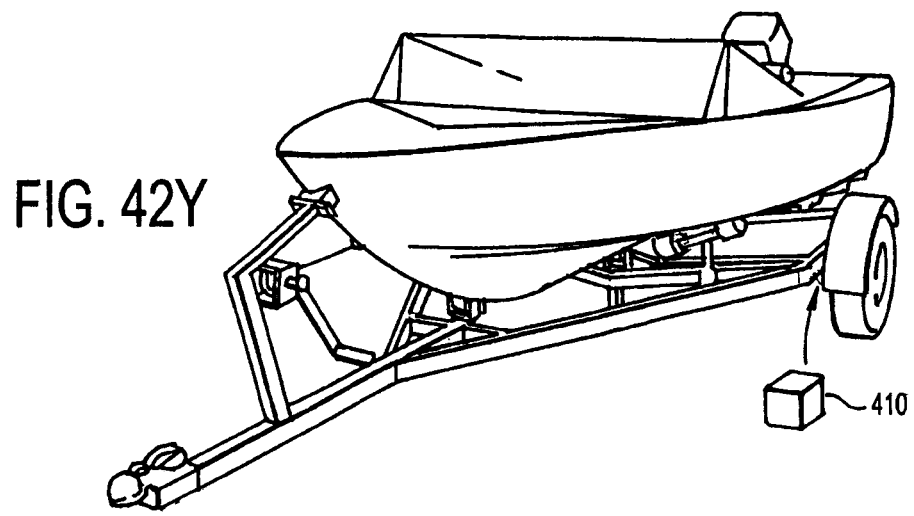

FIG. 42Y illustrates use of the weight sensor assembly 410 positioned near a trailer wheel of a boat trailer such that the weight sensor assembly 410 is between the trailer on one end and the wheel axel (or wheel suspension component attached to the wheel), such that the weight of the boat and boat trailer may be measured from a force arising from the weight of the boat and boat trailer being transferred to the load sensor pins 8, 9.

Figure 42Z:
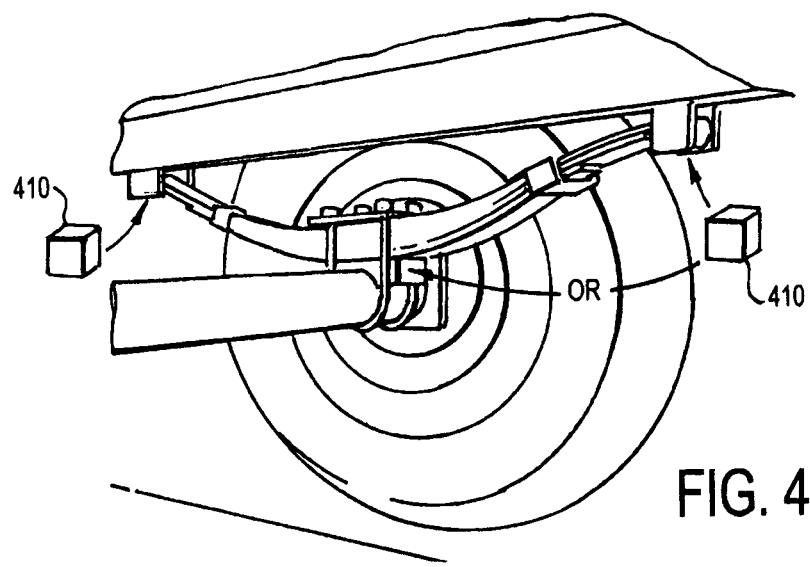
Figure 42A:
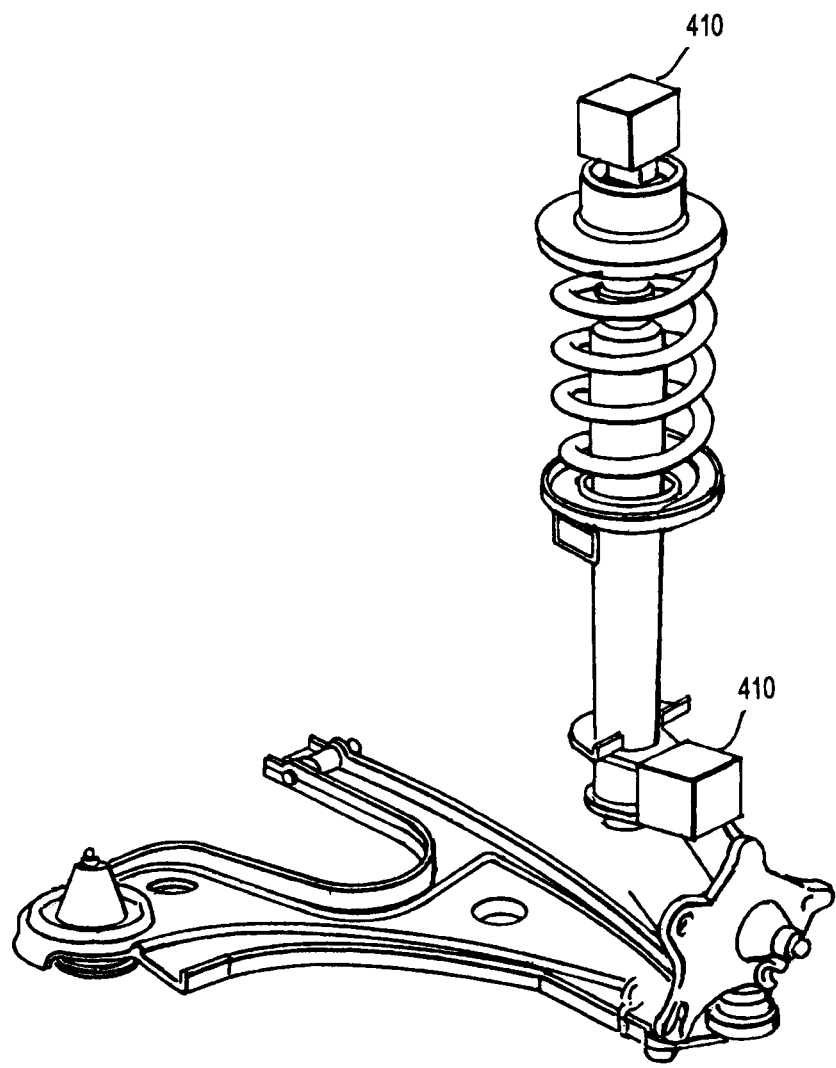

FIG. 42Z illustrates use of the weight sensor assembly 410 positioned near the three connection points of a leaf spring of a vehicle such that a weight sensor assembly 410 is between each of the two ends of the leaf spring and the vehicle body above, and another weight sensor assembly 410 is between the middle of the leaf spring and the wheel axel, such that the weight of the vehicle body may be measured from respective forces arising from the weight of the body being transferred to the load sensor pins 8, 9 associated with the three weight sensor assemblies 410.

FIG. 42AA illustrates use of the weight sensor assembly 410 positioned near two connection points of a vehicle suspension device such that one weight sensor assembly 410 is between the top of a spring and the vehicle body above, and the other weight sensor assembly 410 is between the bottom of the spring and a vehicle wheel, such that the weight of the vehicle body may be measured from respective forces arising from the weight of the body being transferred to the load sensor pins 8, 9 associated with the weight sensor assemblies 410.

A method of using the sensor assembly 410 and the components shown in the various embodiments described above include connecting the electronics of the load sensor pins 8, 9 to an electrical connection point of the towed and/or the towing vehicle such that electrical signals having information useful for calculating the (components) of a force F or having information about a calculated force F may be transferred to the vehicles. The signals may be transferred by wired or wirelessly using a transceiver associated with the towing or towed vehicle. The method further includes continuously comparing the calculated force F (and its components) to one or more ratings or limits and outputting an alert if a calculated values exceeds the ratings or limits. Ratings and limits may be expressed in terms of maximum values, maximum values with a safety margin, or a distribution of values, such as a histogram, that account for inputs from other vehicle sensors and operating conditions that affect the ratings and limits (e.g., external air temperature, vehicle traction setting, engine performance, tire pressure, payload amount (including number of vehicle passengers), and others.

EXAMPLE

A computation for a tow vehicle is shown below:
Gwc (weight-carrying hitch rating)=12,500 lbs
Gvm (Gross Vehicle Mass (GVWR)–Max Payload w/Weight Truck)=7,850 lbs
D=Gwc*(Gvm+5004.5)/(Gvm+Gwc)=1875 lbs
Twc=1875 lbs Longitudinal (Aft/Fore) Loads
Aft (toward rear):
   5922 lbs (0-100 cycles)
   4738 lbs (101-500 cycles)
   3948 lbs (501-5000 cycles)
Fore (toward front):
   −2685 lbs (0-100 cycles)
   −2685 lbs (101-500 cycles)
   −1579 lbs (501-5000 cycles)
Vertical (Up/Down) Loads
Up (toward sky)
   −296 lbs (0-100 cycles)
   −454 lbs (101-500 cycles)
   −612 lbs (501-5000 cycles)
Down (toward Earth)
   −3217 lbs (0-100 cycles)
   −3059 lbs (101-500 cycles)
   −2901 lbs (501-5000 cycles)
Starting at −1875 lbs (cycling between the loads mentioned above)
Lateral (Side to Side) Loads
Side (+/−)=790 lbs (Cycle at 1 Hz for 60,000 cycles in conjunction w/known histogram distribution)

Although certain presently preferred embodiments of the disclosed invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

We claim:

1. A load sensing pin for outputting a signal containing information for determining an amount and direction of force acting on a tow coupling comprising:
    an elongated generally cylindrically hollow and elastically deformable shaft-like member having at least two magneto-elastically active regions directly or indirectly attached to or forming a part of the member at longitudinally spaced apart locations between respective ends of the member, wherein each of the active regions possess a remanent magnetic polarization that becomes increasingly helically shaped when a mechanical stress on the member, transmitted to the magneto-elastically active regions, increases; and
    a printed circuit board processor, the processor being adapted to receiving signals from at least one magnetic field sensor device arranged proximate to each of the magneto-elastically active regions and from at least one secondary magnetic field sensor,
    wherein the at least one magnetic field sensor device includes at least one direction-sensitive magnetic field sensor configured for determination of a shear force in at least one direction,
    wherein the secondary magnetic field sensor is configured for, in the case of one or more external magnetic field sources, outputting a secondary signal containing information about the external magnetic fields from the one or more external magnetic field sources that are measured at a detecting region of the at least one direction-sensitive magnetic field sensor, and
    wherein the printed circuit board processor, the at least one magnetic field sensor device, and the secondary magnetic field sensor are arranged inside the member.

2. The load sensing pin according to claim 1, further comprising a storage or memory device containing software for computing the information for determining the amount and direction of force acting on the tow coupling, wherein the storage or memory device is arranged inside the hollow member or in an external module and is connected to the processor.

3. The load sensing pin according to claim 1, further comprising a shielding device positioned around all or a portion of the load sensing pin, wherein the shielding device is configured for, in the case of one or more external magnetic field sources, reducing the strength of an external magnetic field from the one or more external magnetic field sources at a detecting region of the at least one direction-sensitive magnetic field sensor.

4. A force sensing apparatus for outputting a signal containing information for determining an amount and direction of force acting on a tow coupling comprising:
    a first device adapted to being connected or interconnected to a towing vehicle;
    a second device movable relative to the first device and adapted to being connected or interconnected to a towed vehicle; and
    at least one load sensor pin connected or interconnected between the first and second devices thereby forming a mechanical force transmitting connection between the first and the second devices and the at least one load sensor pin,
    wherein the load sensor pin comprises:
        an elongated generally cylindrically hollow and elastically deformable shaft-like member having at least two magneto-elastically active regions directly or indirectly attached to or forming a part of the member at longitudinally spaced apart locations between respective ends of the member, wherein each of the active regions possess a remanent magnetic polarization that becomes increasingly helically shaped when a mechanical stress on the member, transmitted to the magneto-elastically active regions, increases; and
        a printed circuit board processor, the processor being adapted to receiving signals from at least one magnetic field sensor device arranged proximate to each of the magneto-elastically active regions, wherein the at least one magnetic field sensor device includes at least one direction-sensitive magnetic field sensor configured for determination of a shear force in at least one direction, and wherein the printed circuit board processor and the at least magnetic field sensor device are arranged inside the hollow member,
    wherein the first device includes first and second axially-aligned and spaced apart through-holes for rigidly fixing opposite ends of the at least one load sensor pin in the through-holes,
    wherein the second device includes at least one through-hole surrounding a portion of the load sensor pin between the end portions of the at least one load sensor pin, and
    wherein, in the absence of the shear force acting on the at least one load sensor pin, the third through-hole is axially-aligned with the axially-aligned first and second through-holes.

5. The force sensing apparatus according to claim 4, further comprising a storage or memory device containing software for computing the information for determining the amount and direction of force acting on the tow coupling, wherein the storage or memory device is arranged inside the hollow member or in an external module and is connected to the processor.

6. The force sensing apparatus according to claim 4, wherein the force sensing apparatus is part of a tow coupling device.

7. The force sensing apparatus according to claim 4, wherein the tow coupling device is one of a ball hitch, a fifth wheel hitch, or a gooseneck hitch.

8. The force sensing apparatus according to claim 4, wherein the first device is connected to a member attached to the towing vehicle.

9. The force sensing apparatus according to claim 4, wherein the second device is connected to a receiver member adapted to receiving a removable drawbar having a ball hitch.

10. A tow coupling assembly for attaching to a towing vehicle comprising:
   a first device adapted to being connected or interconnected to a hitch tube of the towing vehicle;
   a second device movable relative to the first device and adapted to being connected or interconnected to a hitch device; and
   at least one load sensor pin interconnecting the first and second devices thereby forming a mechanical force transmitting connection between the first device, the second devices, and the at least one load sensor pin,
   wherein the load sensor pin comprises:
      an elongated generally cylindrically hollow and elastically deformable shaft-like member having at least two magneto-elastically active regions directly or indirectly attached to or forming a part of the member at longitudinally spaced apart locations between respective ends of the member, wherein each of the active regions possess a remanent magnetic polarization that becomes increasingly helically shaped when a mechanical stress on the member, transmitted to the magneto-elastically active regions, increases; and
      a printed circuit board processor, the processor being adapted to receiving signals from at least one magnetic field sensor device arranged proximate to each of the magneto-elastically active regions, wherein the at least one magnetic field sensor device includes at least one direction-sensitive magnetic field sensor configured for determination of a shear force in at least one direction, and wherein the printed circuit board processor and the at least magnetic field sensor device are arranged inside the hollow member,
   wherein the first device includes first and second axially-aligned and spaced apart through-holes for rigidly fixing opposite ends of the at least one load sensor pin in the through-holes,
   wherein the second device includes at least one through-hole surrounding a portion of the at least one load sensor pin between the end portions of the at least one load sensor pin, and
   wherein, in the absence of the shear force acting on the at least one load sensor pin, the third through-hole is axially-aligned with the axially-aligned first and second through-holes.

11. The tow coupling assembly according to claim 10, further comprising a storage or memory device containing software for computing an information useful for determining the amount and direction of force acting on the tow coupling, wherein the storage or memory device is arranged inside the hollow member or in an external module and is connected to the processor.

12. The tow coupling assembly according to claim 10, wherein the hitch device comprises a receiver for receiving a removable drawbar having a ball hitch.

13. A computer-implemented tow load measuring method comprising:
   providing a tow coupling assembly for attaching to a towing vehicle, the tow coupling assembly comprising a load sensor pin and an electrical connector for wired or wirelessly connecting the load sensor pin to an electronic connection of the towing vehicle, wherein the load sensor pin comprises,
      an elongated generally cylindrically hollow and elastically deformable shaft-like member having at least two magneto-elastically active regions directly or indirectly attached to or forming a part of the member located between respective ends of the member, wherein each of the at least two active regions possesses a remanent magnetic polarization that becomes increasingly helically shaped when a mechanical stress on the member, transmitted to the at least one magneto-elastically active regions, increases; and
      at least one magnetic field sensor device arranged proximate to each of the magneto-elastically active regions, wherein the at least one magnetic field sensor device includes at least one direction-sensitive magnetic field sensor configured for determination of a shear force in at least one direction, and wherein the at least one magnetic field sensor device is arranged inside the hollow member; and
   providing a software adapted to being stored in a storage device and further adapted to, receiving one or more signals from the at least one magnetic field sensor device having information about a magnetic field when the magnetic field is generated by either of the at least two magneto-elastically active regions, computing a total tongue weight value using the information, and outputting the computed value as a signal to the towing vehicle via the electrical connector.

14. The method according to claim 13, wherein the software is further adapted to computing a longitudinal load, a vertical load, and a transverse load.

15. The method according to claim 13, further comprising providing a maximum payload rating of the towing vehicle and a total weight-carrying rating of the tow coupling assembly for use in computing the total tongue weight value.

16. The method according to claim 13, wherein the step of computing the total tongue weight value comprises receiving information from one or more towing vehicle sensors.

17. The method according to claim 13, further comprising outputting an alert.

18. A sensor system for a vehicle tow coupling comprising:
   at least one load sensor pin for use in interconnecting a first and a second device thereby forming a mechanical force transmitting connection between the first device, the second device, and the at least one load sensor pin, wherein the load sensor pin comprises an elongated generally cylindrically hollow and elastically deformable shaft-like member having at least two magneto-elastically active regions directly or indirectly attached to or forming a part of the member at longitudinally spaced apart locations between respective ends of the member, and at least one magnetic field sensor device arranged proximate to each of the magneto-elastically active regions, wherein the at least one magnetic field sensor device includes at least one direction-sensitive magnetic field sensor configured to output a signal representing a shear force in at least one direction, and wherein the at least one magnetic field sensor device is arranged inside the hollow member;

a module external to the at least one load sensor pin comprising software and a processor adapted for determining, using at least the signal, an amount and a direction of a mechanical force when the mechanical force is acting on the at least one load sensor pin; and a harness comprising one or more cables for transmitting the signal from the at least one magnetic field sensor device to the external module.

19. The sensor system according to claim 18, wherein the first device includes first and second axially-aligned and spaced apart through-holes for rigidly fixing opposite ends of the at least one load sensor pin in the through-holes, wherein the second device includes at least one through-hole surrounding a portion of the at least one load sensor pin between the end portions of the at least one load sensor pin, and wherein, in the absence of the mechanical force acting on the at least one load sensor pin, the third through-hole is axially-aligned with the axially-aligned first and second through-holes.

20. The sensor system according to claim 19, wherein the first device is adapted to being connected or interconnected to a towing vehicle, and wherein the second device is movable relative to the first device and is adapted to being connected or interconnected to a hitch device.

21. The sensor system according to claim 18, wherein the software and the processor are further adapted for determining the amount and the direction of the mechanical force using one or more values selected from the group consisting of an outer diameter of the at least one load sensor pin, an inner diameter of the at least one load sensor pin, a width of the at least one load sensor pin, a height of the at least one load sensor pin, a drop distance of a drawbar relative to a receiver for the drawbar, and a distance between a first one of the at least one load sensor pin and a second one of the at least one load sensor pin.

22. The sensor system according to claim 18, wherein the mechanical force is one of or a sum of more than one of a tongue force in a vertical direction, a tow force in a longitudinal direction, and a sway force in a transverse direction.

23. The sensor system according to claim 19, further comprising:

a magnetic field sensor device separate from the at least one magnetic field sensor device, arranged inside the hollow member of the at least one load sensor pin and adapted for detecting the presence of an external magnetic field and for outputting a second signal containing information representative of the external magnetic field, wherein the software and the processor are further adapted for using the second signal to compensate for the effects of the external magnetic field on the signal from the at least one magnetic field sensor device.

* * * * *

UNITED STATES PATENT AND TRADEMARK OFFICE
CERTIFICATE OF CORRECTION

PATENT NO.         : 10,670,479 B2
APPLICATION NO.    : 16/136837
DATED              : June 2, 2020
INVENTOR(S)        : Chad Reed et al.

Page 1 of 1

It is certified that error appears in the above-identified patent and that said Letters Patent is hereby corrected as shown below:

In the Claims

Claim 4, Column 38, Line 58:
Change "third" to --at least one--

Signed and Sealed this
Third Day of November, 2020

Andrei Iancu
*Director of the United States Patent and Trademark Office*